(12) United States Patent
Sreenivasan et al.

(10) Patent No.: US 7,077,992 B2
(45) Date of Patent: Jul. 18, 2006

(54) STEP AND REPEAT IMPRINT LITHOGRAPHY PROCESSES

(75) Inventors: Sidlgata V. Sreenivasan, Austin, TX (US); Byung J. Choi, Austin, TX (US); Norman E. Schumaker, Austin, TX (US); Ronald D. Voisin, Austin, TX (US); Michael P. C. Watts, Austin, TX (US); Mario J. Meissl, Austin, TX (US)

(73) Assignee: Molecular Imprints, Inc., Austin, TX (US)

( * ) Notice: Subject to any disclaimer, the term of this patent is extended or adjusted under 35 U.S.C. 154(b) by 503 days.

(21) Appl. No.: 10/194,991

(22) Filed: Jul. 11, 2002

(65) Prior Publication Data

US 2004/0124566 A1 Jul. 1, 2004

(51) Int. Cl.
*B29C 33/40* (2006.01)
*B29C 35/08* (2006.01)
*B29C 41/02* (2006.01)
*B29C 41/22* (2006.01)
*B29C 59/02* (2006.01)

(52) U.S. Cl. .................. 264/496; 264/40.1; 264/259; 264/293; 264/338

(58) Field of Classification Search ............. 264/40.1, 264/259, 293, 338, 494, 496
See application file for complete search history.

(56) References Cited

U.S. PATENT DOCUMENTS

| | | | |
|---|---|---|---|
| 3,783,520 A | 1/1974 | King | |
| 3,807,027 A | 4/1974 | Heisler | |
| 3,807,029 A | 4/1974 | Troeger | |
| 3,811,665 A | 5/1974 | Seelig | |
| 4,062,600 A | 12/1977 | Wyse | |
| 4,070,116 A | 1/1978 | Frosch et al. | |
| 4,098,001 A | 7/1978 | Watson | |
| 4,119,688 A | 10/1978 | Hiraoka | |
| 4,155,169 A | 5/1979 | Drake et al. | |
| 4,201,800 A | 5/1980 | Alcorn et al. | |
| 4,202,107 A | 5/1980 | Watson | |
| 4,267,212 A | 5/1981 | Sakawaki | |
| 4,326,805 A | 4/1982 | Feldman et al. | |
| 4,337,579 A | 7/1982 | De Fazio | |
| 4,355,469 A | 10/1982 | Nevins et al. | |
| 4,414,750 A | 11/1983 | De Fazio | |
| 4,426,247 A | 1/1984 | Tamamura et al. | |
| 4,440,804 A | 4/1984 | Milgram | |

(Continued)

FOREIGN PATENT DOCUMENTS

| | | |
|---|---|---|
| DE | 2800476 A1 | 7/1978 |
| DE | 19648844 C1 | 9/1997 |
| EP | 244884 A1 | 3/1987 |

(Continued)

OTHER PUBLICATIONS

U.S. Appl. No. 09/698,317, filed Oct. 27, 2000, Choi et al.
U.S. Appl. No. 09/907,512, filed Jul. 16, 2001, Sreenivasan et al.
U.S. Appl. No. 09/908,455, filed Jul. 17, 2001, Choi et al.
U.S. Appl. No. 09/920,341, filed Aug. 1, 2001, Choi et al.

(Continued)

*Primary Examiner*—Leo B. Tentoni
(74) *Attorney, Agent, or Firm*—Kenneth C. Brooks

(57) ABSTRACT

The present invention is directed to methods for patterning a substrate by imprint lithography. Imprint lithography is a process in which a liquid is dispensed onto a substrate. A template is brought into contact with the liquid and the liquid is cured. The cured liquid includes an imprint of any patterns formed in the template. In one embodiment, the imprint process is designed to imprint only a portion of the substrate. The remainder of the substrate is imprinted by moving the template to a different portion of the template and repeating the imprint lithography process.

71 Claims, 37 Drawing Sheets

U.S. PATENT DOCUMENTS

| | | |
|---|---|---|
| 4,451,507 A | 5/1984 | Beltz et al. |
| 4,507,331 A | 3/1985 | Hiraoka |
| 4,544,572 A | 10/1985 | Sandvig et al. |
| 4,552,832 A | 11/1985 | Blume et al. |
| 4,552,833 A | 11/1985 | Ito et al. |
| 4,600,309 A | 7/1986 | Fay |
| 4,610,442 A | 9/1986 | Oku et al. |
| 4,657,845 A | 4/1987 | Frechet et al. |
| 4,692,205 A | 9/1987 | Sachdev et al. |
| 4,694,703 A | 9/1987 | Routson |
| 4,707,218 A | 11/1987 | Giammarco et al. |
| 4,724,222 A | 2/1988 | Feldman |
| 4,731,155 A | 3/1988 | Napoli et al. |
| 4,737,425 A | 4/1988 | Lin et al. |
| 4,763,886 A | 8/1988 | Takei |
| 4,772,878 A | 9/1988 | Kane |
| 4,808,511 A | 2/1989 | Holmes |
| 4,826,943 A | 5/1989 | Ito et al. |
| 4,846,931 A | 7/1989 | Gmitter et al. |
| 4,848,179 A | 7/1989 | Ubhayakar |
| 4,848,911 A | 7/1989 | Uchida et al. |
| 4,857,477 A | 8/1989 | Kanamori |
| 4,883,561 A | 11/1989 | Gmitter et al. |
| 4,891,303 A | 1/1990 | Garza et al. |
| 4,908,298 A | 3/1990 | Hefferon et al. |
| 4,909,151 A | 3/1990 | Fukui et al. |
| 4,919,748 A | 4/1990 | Bredbenner et al. |
| 4,921,778 A | 5/1990 | Thackeray et al. |
| 4,929,083 A | 5/1990 | Brunner |
| 4,931,351 A | 6/1990 | McColgin et al. |
| 4,959,252 A | 9/1990 | Bonnebat et al. |
| 4,964,945 A | 10/1990 | Calhoun |
| 4,976,818 A | 12/1990 | Hashimoto et al. |
| 4,980,316 A | 12/1990 | Huebner |
| 4,999,280 A | 3/1991 | Hiraoka |
| 5,053,318 A | 10/1991 | Gulla et al. |
| 5,071,694 A | 12/1991 | Uekita et al. |
| 5,072,126 A | 12/1991 | Progler |
| 5,073,230 A | 12/1991 | Maracas et al. |
| 5,074,667 A | 12/1991 | Miyatake |
| 5,108,875 A | 4/1992 | Thackeray et al. |
| 5,110,514 A | 5/1992 | Soane |
| 5,126,006 A | 6/1992 | Cronin et al. |
| 5,148,036 A | 9/1992 | Matsugu et al. |
| 5,148,037 A | 9/1992 | Suda et al. |
| 5,151,754 A | 9/1992 | Ishibashi et al. |
| 5,169,494 A | 12/1992 | Hashimoto et al. |
| 5,173,393 A | 12/1992 | Sezi et al. |
| 5,179,863 A | 1/1993 | Uchida et al. |
| 5,198,326 A | 3/1993 | Hashimoto et al. |
| 5,204,739 A | 4/1993 | Domenicali |
| 5,206,983 A | 5/1993 | Guckel et al. |
| 5,212,147 A | 5/1993 | Sheats |
| 5,218,193 A | 6/1993 | Miyatake |
| 5,234,793 A | 8/1993 | Sebald et al. |
| 5,240,550 A | 8/1993 | Boehnke et al. |
| 5,240,878 A | 8/1993 | Fizsimmons et al. |
| 5,242,711 A | 9/1993 | DeNatale et al. |
| 5,244,818 A | 9/1993 | Jokerst et al. |
| 5,259,926 A | 11/1993 | Kuwabara et al. |
| 5,277,749 A | 1/1994 | Griffith et al. |
| 5,314,772 A | 5/1994 | Kozicki et al. |
| 5,318,870 A | 6/1994 | Hartney |
| 5,324,683 A | 6/1994 | Fitch et al. |
| 5,328,810 A | 7/1994 | Lowrey et al. |
| 5,330,881 A | 7/1994 | Sidman et al. |
| 5,348,616 A | 9/1994 | Hartman et al. |
| 5,355,219 A | 10/1994 | Araki et al. |
| 5,357,122 A | 10/1994 | Okubora et al. |
| 5,362,606 A | 11/1994 | Hartney et al. |
| 5,366,851 A | 11/1994 | Novembre |
| 5,374,454 A | 12/1994 | Bickford et al. |
| 5,376,810 A | 12/1994 | Hoenk et al. |
| 5,380,474 A | 1/1995 | Rye et al. |
| 5,392,123 A | 2/1995 | Marcus et al. |
| 5,415,514 A | 5/1995 | Butterfield |
| 5,417,802 A | 5/1995 | Obeng |
| 5,421,981 A | 6/1995 | Leader et al. |
| 5,422,295 A | 6/1995 | Choi et al. |
| 5,424,549 A | 6/1995 | Feldman |
| 5,425,848 A | 6/1995 | Haisma et al. |
| 5,425,964 A | 6/1995 | Southwell et al. |
| 5,431,777 A | 7/1995 | Austin et al. |
| 5,439,766 A | 8/1995 | Day et al. |
| 5,452,090 A | 9/1995 | Progler et al. |
| 5,453,157 A | 9/1995 | Jeng |
| 5,458,520 A | 10/1995 | DeMercurio et al. |
| 5,468,542 A | 11/1995 | Crouch |
| 5,480,047 A | 1/1996 | Tanigawa et al. |
| 5,507,411 A | 4/1996 | Peckels |
| 5,512,131 A | 4/1996 | Kumar et al. |
| 5,515,167 A | 5/1996 | Ledger et al. |
| 5,523,878 A | 6/1996 | Wallace et al. |
| 5,527,662 A | 6/1996 | Hashimoto et al. |
| 5,545,367 A | 8/1996 | Bae et al. |
| 5,563,702 A | 10/1996 | Emery et al. |
| 5,566,584 A | 10/1996 | Briganti |
| 5,633,505 A | 5/1997 | Chung et al. |
| 5,654,238 A | 8/1997 | Cronin et al. |
| 5,669,303 A | 9/1997 | Maracas et al. |
| 5,670,415 A | 9/1997 | Rust |
| 5,700,626 A | 12/1997 | Lee et al. |
| 5,723,176 A | 3/1998 | Keyworth et al. |
| 5,724,145 A | 3/1998 | Kondo et al. |
| 5,725,788 A | 3/1998 | Maracas et al. |
| 5,731,981 A | 3/1998 | Simard |
| 5,736,424 A | 4/1998 | Prybyla et al. |
| 5,743,998 A | 4/1998 | Park |
| 5,747,102 A | 5/1998 | Smith et al. |
| 5,753,014 A | 5/1998 | Van Rijn |
| 5,760,500 A | 6/1998 | Kondo et al. |
| 5,772,905 A | 6/1998 | Chou |
| 5,776,748 A | 7/1998 | Singhvi et al. |
| 5,779,799 A | 7/1998 | Davis |
| 5,802,914 A | 9/1998 | Fassler et al. |
| 5,804,474 A | 9/1998 | Sakaki et al. |
| 5,808,742 A | 9/1998 | Everett et al. |
| 5,855,686 A | 1/1999 | Rust |
| 5,877,036 A | 3/1999 | Kawai |
| 5,877,861 A | 3/1999 | Ausschnitt et al. |
| 5,884,292 A | 3/1999 | Baker et al. |
| 5,888,650 A | 3/1999 | Calhoun et al. |
| 5,895,263 A | 4/1999 | Carter et al. |
| 5,900,160 A | 5/1999 | Whitesides et al. |
| 5,907,782 A | 5/1999 | Wu |
| 5,912,049 A | 6/1999 | Shirley |
| 5,926,690 A | 7/1999 | Toprac et al. |
| 5,937,758 A | 8/1999 | Maracas et al. |
| 5,942,871 A | 8/1999 | Lee |
| 5,948,219 A | 9/1999 | Rohner |
| 5,948,470 A | 9/1999 | Harrison et al. |
| 5,948,570 A | 9/1999 | Kornblit et al. |
| 5,952,127 A | 9/1999 | Yamanaka |
| 5,988,859 A | 11/1999 | Kirk |
| 6,033,977 A | 3/2000 | Gutsche et al. |
| 6,035,805 A | 3/2000 | Rust |
| 6,036,055 A | 3/2000 | Mogadam et al. |
| 6,038,280 A | 3/2000 | Rossiger et al. |
| 6,039,987 A | 3/2000 | Strahl |
| 6,046,056 A | 4/2000 | Parce et al. |
| 6,051,345 A | 4/2000 | Huang |

| | | |
|---|---|---|
| 6,074,827 A | 6/2000 | Nelson et al. |
| 6,081,334 A | 6/2000 | Brimbergen et al. |
| 6,088,103 A | 7/2000 | Everett et al. |
| 6,091,485 A | 7/2000 | Li et al. |
| 6,096,655 A | 8/2000 | Lee et al. |
| 6,117,708 A | 9/2000 | Wensel |
| 6,125,183 A | 9/2000 | Jiawook et al. |
| 6,128,085 A | 10/2000 | Buermann et al. |
| 6,133,576 A | 10/2000 | Shafer et al. |
| 6,137,562 A | 10/2000 | Masuyuki et al. |
| 6,143,412 A | 11/2000 | Schueller et al. |
| 6,150,231 A | 11/2000 | Muller et al. |
| 6,150,680 A | 11/2000 | Eastman et al. |
| 6,168,845 B1 | 1/2001 | Fontana, Jr. et al. |
| 6,180,239 B1 | 1/2001 | Whitesides et al. |
| 6,204,922 B1 | 3/2001 | Chalmers |
| 6,218,316 B1 | 4/2001 | Marsh |
| 6,234,379 B1 | 5/2001 | Donges |
| 6,245,213 B1 | 6/2001 | Olsson et al. |
| 6,245,581 B1 | 6/2001 | Bonser et al. |
| 6,274,294 B1 | 8/2001 | Hines |
| 6,309,580 B1 | 10/2001 | Chou |
| 6,316,290 B1 | 11/2001 | Wensel |
| 6,326,627 B1 | 12/2001 | Putvinski et al. |
| 6,329,256 B1 | 12/2001 | Ibok |
| 6,334,960 B1 | 1/2002 | Willson et al. |
| 6,337,262 B1 | 1/2002 | Pradeep et al. |
| 6,355,198 B1 | 3/2002 | Kim et al. |
| 6,361,831 B1 | 3/2002 | Sato et al. |
| 6,383,928 B1 | 5/2002 | Eissa |
| 6,387,783 B1 | 5/2002 | Furukawa et al. |
| 6,387,787 B1 | 5/2002 | Mancini et al. |
| 6,388,253 B1 | 5/2002 | Su |
| 6,391,217 B1 | 5/2002 | Schaffer et al. |
| 6,391,798 B1 | 5/2002 | DeFelice et al. |
| 6,407,340 B1 | 6/2002 | Wikstrom et al. |
| 6,420,892 B1 | 7/2002 | Krivy et al. |
| 6,423,207 B1 | 7/2002 | Heidari et al. |
| 6,437,891 B1 | 8/2002 | Chandrasekhar et al. |
| 6,447,919 B1 | 9/2002 | Brown et al. |
| 6,455,411 B1 | 9/2002 | Jiang et al. |
| 6,482,742 B1 | 11/2002 | Chou |
| 6,489,068 B1 | 12/2002 | Kye |
| 6,495,624 B1 | 12/2002 | Brown |
| 6,514,672 B1 | 2/2003 | Young et al. |
| 6,517,977 B1 * | 2/2003 | Resnick et al. ............ 430/5 |
| 6,518,168 B1 | 2/2003 | Clem et al. |
| 6,521,324 B1 | 2/2003 | Debe et al. |
| 6,522,411 B1 | 2/2003 | Moon et al. |
| 6,534,418 B1 | 3/2003 | Plat et al. |
| 6,539,286 B1 | 3/2003 | Jiang |
| 6,541,356 B1 | 4/2003 | Fogel et al. |
| 6,541,360 B1 | 4/2003 | Plat et al. |
| 6,561,706 B1 | 5/2003 | Singh et al. |
| 6,565,928 B1 | 5/2003 | Sakamoto et al. |
| 6,588,632 B1 | 7/2003 | Nicol |
| 6,600,969 B1 | 7/2003 | Sudolcan et al. |
| 6,632,742 B1 | 10/2003 | Yang et al. |
| 6,633,391 B1 | 10/2003 | Oluseyi et al. |
| 6,635,581 B1 | 10/2003 | Wong |
| 6,646,662 B1 | 11/2003 | Nebashi et al. |
| 6,677,252 B1 | 1/2004 | Marsh |
| 6,696,220 B1 | 2/2004 | Bailey et al. |
| 6,703,190 B1 | 3/2004 | Elian |
| 6,703,256 B1 | 3/2004 | Nagata et al. |
| 6,716,767 B1 | 4/2004 | Shih et al. |
| 6,719,915 B1 | 4/2004 | Willson et al. |
| 6,735,972 B1 | 5/2004 | McKeown |
| 6,737,202 B1 | 5/2004 | Gehoski et al. |
| 6,743,713 B1 | 6/2004 | Mukherjee-Roy et al. |
| 6,753,972 B1 | 6/2004 | Hirose et al. |
| 6,767,983 B1 | 7/2004 | Fujiyama et al. |
| 6,770,852 B1 | 8/2004 | Steger |
| 6,776,094 B1 | 8/2004 | Whitesides et al. |
| 6,777,170 B1 | 8/2004 | Bloomstein et al. |
| 2001/0023829 A1 | 9/2001 | Olsson et al. |
| 2002/0093122 A1 | 7/2002 | Choi et al. |
| 2002/0094496 A1 | 7/2002 | Choi et al. |
| 2002/0098426 A1 | 7/2002 | Sreenivasan et al. |
| 2002/0132482 A1 | 9/2002 | Chou |
| 2002/0150398 A1 | 10/2002 | Choi et al. |
| 2002/0167117 A1 | 11/2002 | Chou |
| 2003/0080471 A1 | 5/2003 | Chou |
| 2003/0081193 A1 | 5/2003 | White et al. |
| 2003/0092261 A1 | 5/2003 | Kondo et al. |
| 2003/0113638 A1 | 6/2003 | Mancini et al. |
| 2003/0129542 A1 | 7/2003 | Shih et al. |
| 2003/0133126 A1 | 7/2003 | Sarfaty et al. |
| 2003/0179354 A1 | 9/2003 | Araki et al. |
| 2003/0205657 A1 | 11/2003 | Voisin |
| 2003/0205658 A1 | 11/2003 | Voisin |
| 2003/0215577 A1 | 11/2003 | Willson et al. |
| 2003/0235787 A1 | 12/2003 | Watts et al. |
| 2004/0007799 A1 | 1/2004 | Choi et al. |
| 2004/0008334 A1 | 1/2004 | Sreenivasan et al. |
| 2004/0009673 A1 | 1/2004 | Sreenivasan et al. |
| 2004/0010341 A1 | 1/2004 | Watts et al. |
| 2004/0021254 A1 | 2/2004 | Sreenivasan et al. |
| 2004/0021866 A1 | 2/2004 | Watts et al. |
| 2004/0022888 A1 | 2/2004 | Sreenivasan et al. |
| 2004/0029041 A1 | 2/2004 | Shih et al. |
| 2004/0036201 A1 | 2/2004 | Chou et al. |
| 2004/0038552 A1 | 2/2004 | Watts et al. |
| 2004/0046271 A1 | 3/2004 | Watts |
| 2004/0053146 A1 | 3/2004 | Sreenivasan et al. |
| 2004/0065252 A1 | 4/2004 | Sreenivasan et al. |
| 2004/0065976 A1 | 4/2004 | Sreenivasan et al. |
| 2004/0086793 A1 | 5/2004 | Sreenivasan et al. |
| 2004/0089979 A1 | 5/2004 | Rubin |
| 2004/0090611 A1 | 5/2004 | Choi et al. |
| 2004/0112153 A1 | 6/2004 | Choi et al. |
| 2004/0112861 A1 | 6/2004 | Choi et al. |
| 2004/0112862 A1 | 6/2004 | Willson et al. |
| 2004/0116548 A1 | 6/2004 | Willson et al. |
| 2004/0124566 A1 | 7/2004 | Sreenivasan et al. |
| 2004/0141163 A1 | 7/2004 | Bailey et al. |
| 2004/0141168 A1 | 7/2004 | Sreenivasan et al. |
| 2004/0146792 A1 | 7/2004 | Nimmakayata et al. |
| 2004/0149687 A1 | 8/2004 | Choi et al. |
| 2004/0150129 A1 | 8/2004 | Hougham et al. |
| 2004/0163563 A1 | 8/2004 | Sreenivasan et al. |
| 2004/0192041 A1 | 9/2004 | Jeong et al. |
| 2004/0202865 A1 | 10/2004 | Homola et al. |

FOREIGN PATENT DOCUMENTS

| | | | |
|---|---|---|---|
| EP | 733455 A2 | | 9/1996 |
| EP | 0867775 A2 | | 9/1998 |
| JP | 55-88332 A | | 7/1980 |
| JP | 87-7931 A | | 1/1982 |
| JP | 58-129074 A | | 8/1983 |
| JP | 63-138730 A | | 6/1988 |
| JP | 1-196749 A | | 8/1989 |
| JP | 02024848 A | * | 1/1990 |
| JP | 02092603 A | * | 4/1990 |
| JP | 02192045 A | | 7/1990 |
| JP | 4-70379 A | | 5/1992 |
| WO | WO 87/02935 A1 | | 5/1987 |
| WO | WO 92/17883 A1 | | 10/1992 |
| WO | WO 98/10121 A | | 3/1998 |
| WO | WO 99/45753 A1 | | 9/1999 |
| WO | WO 99/63535 A1 | | 12/1999 |
| WO | WO 00/21689 A1 | | 4/2000 |

| | | |
|---|---|---|
| WO | WO 01/33232 A3 | 5/2001 |
| WO | WO 01/33300 A2 | 5/2001 |
| WO | WO 01/47003 A2 | 6/2001 |
| WO | WO 01/53889 A1 | 7/2001 |
| WO | WO 01/63361 A1 | 8/2001 |
| WO | WO 01/69317 A1 | 9/2001 |
| WO | WO 01/79589 A1 | 10/2001 |
| WO | WO 01/79591 A1 | 10/2001 |
| WO | WO 01/79933 A1 | 10/2001 |
| WO | WO 01/90816 A1 | 11/2001 |
| WO | WO 02/006902 A2 | 1/2002 |
| WO | WO 02/008835 A2 | 1/2002 |
| WO | WO 02/17383 A2 | 2/2002 |
| WO | WO 02/22916 A1 | 3/2002 |
| WO | WO 02/24977 A1 | 3/2002 |
| WO | WO 02/067055 A2 | 8/2002 |
| WO | WO 2004/006120 A1 | 1/2004 |
| WO | WO 2004/016406 A1 | 2/2004 |
| WO | WO 2004/034424 A2 | 4/2004 |
| WO | WO 2004/044651 A1 | 5/2004 |
| WO | WO 2004/054784 A1 | 7/2004 |
| WO | WO 2004/055594 A2 | 7/2004 |
| WO | WO 2004/063815 A2 | 7/2004 |
| WO | WO 00/54107 A1 | 9/2004 |

OTHER PUBLICATIONS

U.S. Appl. No. 09/934,248, filed Aug. 21, 2001, Choi et al.
U.S. Appl. No. 09/976,681, filed Oct. 12, 2001, Bailey et al.
U.S. Appl. No. 10/136,188, filed May 1, 2002, Voisin.
U.S. Appl. No. 09/905,718, filed May 16, 2002, Willson et al.
U.S. Appl. No. 10/178,947, filed Jun. 24, 2002, Watts et al.
U.S. Appl. No. 10/614,716, filed Jul. 8, 2002, Screenivasan et al.
U.S. Appl. No. 10/191,749, filed Jul. 9, 2002, Watts et al.
U.S. Appl. No. 10/194,991, filed Jul. 11, 2002, Sreenivasan et al.
U.S. Appl. No. 10/194,414, filed Jul. 11, 2002, Sreenivasan et al.
U.S. Appl. No. 10/194,410, filed Jul. 11, 2002, Sreenivasan et al.
Krauss et al., "Fabrication of Nanodevices Using Sub–25nm Imprint Lithography", Appl. Phy. Lett. 67 (21), 3114–3116, 1995.
Chou et al., "Imprint of Sub–25 nm Vias and Trenches in Polymers", Applied Physics Letters, Nov. 20, 1995, pp. 3114–3116, vol. 67(21).
Chou et al., "Imprint Lithography with 25–Nanometer Resolution", Science, Apr. 5, 1996, pp. 85–87, vol. 272.
Chou et al., "Imprint Lithography with Sub–10nm Feature Size and High Throughput", Microelectronic Engineering, 1997, pp. 237–240, vol. 35.
Wu et al., "Large area High Density Magnetic Disks Fabricated Using Nanoimprint Lithography", Journal of Vacuum Science and Technology, Nov./Dec. 1998, pp. 3825–3829, vol. B 16(6).
Colburn. et al., "Step and Flash Imprint Lithography: A New Approach to High–Resolution Patterning", Proc. of SPIE, 1999, pp. 379–389, vol. 3676.
Chou, "Nanoimprint Lithography and Lithographically Induced Self–Assembly", MRS Bulletin, Jul. 2001, pp. 512–517.
U.S. Appl. No. 09/908,765, Filed Jul. 19, 2001, Willson et al., "Step and Flash Imprint Lithography.".
U.S. Appl. No. 10/318,273, Filed Dec. 12, 2002, Willson et al., "Compositions for Dark–Field Polymerization and Method of Using the Same for Imprint Lithography Processes.".
U.S. Appl. No. 10/375,817, Filed Feb. 27, 2003, Nguyen et al., "Method to Reduce Adhesion between a Polymerizable Layer and a Substrate Employing a Flourine–Containing Layer.".
U.S. Appl. No. 10/375,832, Filed Feb. 27, 2003, Nguyen et al., "Composition and Method to Form a Release Layer.".
U.S. Appl. No. 10/396,615, Filed Mar. 25, 2003, Sreenivasan, "Low Surface Energy Templates.".
U.S. Appl. No. 10/423,642, Filed Apr. 25, 2003, Sreenivasan, "A Method of Forming Stepped Structures Employing Imprint Lithography.".
U.S. Appl. No. 10/437,476, Filed May 14, 2003, Meissl et al., "An Assembly and Method for Transferring Imprint Lithography Templates.".
U.S. Appl. No. 10/438,224, Filed May 14, 2003, Meissl et al., "Method, System and Holder for Transferring Templates During Imprint Lithography Processes.".
U.S. Appl. No. 10/463,396, Filed Jun. 17, 2003, Choi et al., "Method to Reduce Adhesion Between a Conformable Region and a Pattern of a Mold.".
U.S. Appl. No. 10/616,294, Filed Jul. 9, 2003, Choi et al., "Systems for Magnification and Distortion Correction for Imprint Lithography Processes.".
U.S. Appl. No. 10/687,519, Filed Oct. 16, 2003, Nguyen et al., "Low Surfaced Energy Template.".
U.S. Appl. No. 10/735,110, Filed Dec. 12, 2003, Nimmakayala et al., "Magnification Correction Employing Out–of–Plane Distortion of a Substrate.".
U.S. Appl. No. 10/747,795, Filed Dec. 29, 2003, Sreenivasan et al., "Imprint Lithography Template Comprising Alignment Marks.".
U.S. Appl. No. 10/775,707, Filed Feb. 10, 2004, Choi et al., "An Apparatus to Orientate a Body with Respect to a Surface.".
U.S. Appl. No. 10/760,821, Filed Jan. 20, 2004, Sreenivasan et al., "Method for Concurrently Employing Differing Materials to Form a Substrate.".
U.S. Appl. No. 10/785,248, Filed Feb. 24, 2004, Choi et al., "A Method to Control the Relative Position Between a Body and a Surface.".
U.S. Appl. No. 10/788,685, Filed Feb. 27, 2004, Choi et al., "A Method of Orientating a Template with Respect to a Substrate in Response to a Force Exerted on the Template.".
U.S. Appl. No. 10/788,700, Filed Feb. 27, 2004, Sreenivasan et al., "Full–Wafer or Large Area Imprinting with Multiple Separated Sub–Field for High Throughput Lithography.".
U.S. Appl. No. 10/805,916, Fild Mar. 22, 2004, Sreenivasan et al., "A Method of Determining Alignment of a Template and a Substrate having a Liquid Disposed Therebetween.".
U.S. Appl. No. 10/806,956, Filed Mar. 23, 2003, Choi et al., "An Apparatus to Control Displacement of a Body Spaced–Apart from a Surface.".
U.S. Appl. No. 60/394,458, Filed Jul. 8, 2002, Sreenivasan et al., "Method and Apparatus for Whole Wafer Planarization using Optical Flats and Light Curable liquids.".
Tomita et al., "A 6–axes Motion Control Method for Parallel–Linkage–Type Fine Motion Stage.", JSPE–58–04, pp. 118–124, Undated.

Howell et al., "A Loop–Closure Theory for the Analysis and Synthesis of Compliant Mechanisms.", Journal of Mechanical Design, Mar. 1, 1996, vol. 188, pp. 121–125.

Uchida et al., "A Mask–to–Wafer Alignment and Gap Setting Method for X–ray Lithography Using Graftings.", Journal Vacuum Science Technology, Nov. 1, 1991, B 9 (6), pp. 3202–3206.

Stewart, "A Platform With Six Degrees of Freedom.", Proc Instn Mech Engrs, May 28, 1965, vol. 180, Pt1, No. 15, pp. 371–378.

Hollis et al., "A Six–Degree–of–Freedom Magnetically Levitated Variable Compliance Fine–Motion Wrist: Design, Modeling, and Control.", IEEE Transactions on Robotics and Automation, Jun. 1, 1991, vol. 7., No. 3, pp. 320–332.

Goldfarb et al., "A Well–Behaved Revolute Flexure Joint for Compliant Mechanism Design.", ASME Journal of Mechanical Design, Sep. 1, 1999, vol. 121, No. 3, pp. 424–429.

Abstract of Japanese Patent 55–88332, Apr. 14, 2004.

Abstract of Japanese Patent 02–24848, Jan. 26, 1990.

Abstract of Japanese Patent 02–92603, Aug. 12, 2004.

Abstract of Japanese Patent 57–7931, Apr. 14, 2004.

Abstract of Japanese Patent 58–129074, Aug. 1, 1983.

Abstract of Japanese Patent 63–138730, Apr. 14, 2004.

Sung et al., "Abstract of Micro/nano–tribological Characteristics of Self–Assembled Monolayer and its Application in Nano–Structure Fabrication", Elsevier Science B.V., Jul. 1, 2003, vol. 255, No. 7.

Hirai et al., "Abstract of Mold Surface Treatment for Imprint Lithography", Journal of Photopolymer Science and Technology, Aug. 28, 2001, pp 457–462, vol. 14, No. 3.

Roos et al., "Abstract of Nanoimprint Lithography with a Commercial 4 inch Bond System for Hot Embossing", Proceedings of SPIE, Oct. 1, 2001, vol. 4343, pp. 427–435.

Papierer et al., "Abstract of the Grating of Perfluorinated Silanes onto the Surface of Silica: Characterization by inverse Gas Chromatography.", Journal of Colloid and Interface Science 159. Aug. 1, 1993, pp. 238–242.

Eldada et al., "Advanced Polymer Systems for Optoelectronic Integrated Circuit Applications.", SPIE, Jan. 1, 1997, vol. 3006, pp. 344–361.

Johnson et al., "Advances in Step and Flash Imprint Lithography.", SPIE Microlithography Conference, Feb. 23, 2003.

Eldada et al., "Affordable WDM Components: The Polymer Solution.", SPIE, Jan. 1, 1998, vol. 3234, pp. 161–174.

Srinivasan et al., "Alkyltrichlorosilane–Based Self–Assembled Monolayer Films for Stiction Reduction in Silicon Micromachines.", Journal of Microelctromechanical Systems, Jun. 1, 1998, vol. 7, No. 2, p. 252–260.

Goldfarb et al., "An Improved Flexure Device.", Vanderbilt University, Jan. 1, 2003.

Parikh et al., "An Intrinsic Relationship between Molecular Structure in Self–Assembled n–Alkylsiloxane Monolayers and Deposition Temperature.", Journal of Phys. Chem., Jul. 1, 1994, pp. 7577–7590.

Lee et al., "An Ultraprecision Stage for Alignment of Wafers in Advanced Microlithography.", Precision Engineering, Sep. 1, 1997, pp. 113–122.

Mitsui et al., "Application of Two–Wavelength Optical Heterodyne Alignment System in XS–1.", Part of the SPIE Conference on Emerging Lithographic Technologies III, Mar. 1, 1999, SPIE vol. 3676, pp. 455–464.

Nguyen, "Asymmetric Fluid–Structure Dynamics In Nanoscale Imprint Lithography." The Univeristy of Texas at Austin, Aug. 1, 2001, pp. 1–111.

Nakamatsu et al., "Bilayer Resist Method for Room–Temperature Nanoimprint Lithography.", Japanese Journal of Applied Physics, Jun. 29, 2004, vol. 43, No. 6B, pp. 4050–4053.

Arai et al., "Calibration and Basic Motion of Micro Hand Module.", IEEE, Jan. 1, 1993, pp. 1660–1665.

Otto et al., "Characterization and Application of a UV–based Imprint Technique.", Microelectronic Engineering 57–58, Jan. 1, 2001, pp. 361–366.

International Appl. No. PCT/US2002/015551, Communication Relating to the Results of the Partial International Search, mailed Aug. 10, 2004.

Goldfarb et al., "compliant Micromanipulator Design for Scaled Bilateral Telemanipulation of Small–Scale Environments.", ASME International Mechanical Engineering Conference and Exposition, Nov. 1, 1998, DSC—vol. 64, pp. 213–218.

Peng et al., "Compliant Motion Control of Kinematically Redundant Manipulators.", IEEE Transactions on Robotics and Automation, Dec. 1, 1993, vol. 9, No. 6, pp. 831–837.

Koseki, "Design and Accuracy Evaluation of High–Speed and high Precision Parallel Mechanism.", Proc. Of IEEE, Jan. 1, 1998, Intl. Conf. on Robotics & Automation, pp. 1340–1345.

Rong et al., "Design and Analysis of Flexure–Hinge Mechanism Used in Micro–Positioning Stages.", ASME, Jan. 1, 1994, vol. 2, pp. 979–985.

Hashimoto et al., "Design and Characteristics of a Parallel Link Complaint Wrist." IEEE, May 1, 1994, Department of Mechanical Engineering, Kagoshiam University, pp. 2457–2462.

Choi et al., "Design of Orientation Stages for Step and Flash Imprint Lithography.", Precision Engineering, Jan. 1, 2001, pp. 192–199.

Pernette et al., "Design of Parallel Robots in Microbotics.", Robotica, Jan. 1, 1997, vol. 15, pp 417–420.

Ohya et al., "Development of 3–DOF Finger Module for Micro Manipulation.", Proc. of IEEE, Mar. 1, 1999, Intl. Conf. on Intelligent Robots and Systems, pp. 894–899.

Arai et al., "Development of a New Parallel Manipulator with Fixed Linear Actuator.", In Proceedings of Japan/USA Symposium on Flexible Automation, Jan. 1, 1996, vol. 1, ASME, New York, pp. 145–149.

Tanikawa et al., "Development of Small–sized 3 DOF Finger Module in Micro Hand for Micro Manipulation.", Proc. of IEEE, Mar. 1, 1999, Intl. conf. on Intelligent Robots and Systems, pp. 876–881.

Gokan et al., "Dry Etch Resistance of Organic Materials.", J. Electrochem. Soc.: Solid–State Science and Technology, Jan.1, 1983, pp. 143–146.

Rong et al., "Dynamics of Parallel Mechanism with Direct Compliance Control,", IEEE, Jan. 1, 1997, pp. 1753–1758.

Mirkin et al., "Emerging Methods for Micro–and–Nanofabrication.", MRS Bulletin, Jul. 1, 2001, pp. 506–509.

Bender et al., "Fabrication of Nanostructures using a UV–based Imprint Technique.", Microelectronic Engineering 53, Jan. 1, 2000, pp. 233–236.

Kumar et al., "Features of Gold Having Micrometer to Centimeter Dimensions can be Formed Through a Combination of Stamping with an Elastomeric Stamp and an Alkanethiol "ink" followed by Chemical Etching.", Applied Physics Letters, Oct. 4, 1993, vol. 63, Issue 14, pp. 2002–2004.

Krug et al., "Fine Patterning of Thin Sol–gel Films.", Journal of Non–Crystalline Solids, Jan. 1, 1992, 147 & 148, pp. 447–450.

Hu et al., "Fluorescence Probe Techniques (FPT) for Measuring the Relative Efficiencies of Free–Radical Photoinitiators.", Macromolecules, May 29, 1998, 31, pp. 4107–4113.

Blomquist et al., "Fluorinated Acrylates in making Low–Loss, Low Birefringence, and Single–Mode Optical Waveguides with Exceptional Thermo–Optic Properties.", SPIE Conference on Linear Optical Properties of Waveguides and Fibers, Jul. 1, 1999, vol. 3799, pp. 266–279.

Lucas Aerospace, Free–Flex ® Pivot Catalog, Jan. 1, 1999.

Hexapods, "G1000–PS Power Series", www.hexapods.com., undated.

STIX, "Getting More from Moores", Scientific American, undated.

Physik Instrument, "Hexapod Six–Axis Parallel Kinematics Robot", Nano Positioning, Jan. 1, 1998, pp. 8.4–8.5.

Kim et al., "High–precision Magnetic Levitation Stage for Photolithography.", Precision Engineering, Apr. 1, 1998, vol. 22., No. 2, pp. 66–77.

Paros et al., "How to design Flexure Hinges.", Machine Design, Nov. 25, 1965, pp. 151–156.

Raibert et al., "Hybrid Position/Force Control of Manipulators.", Journal of Dynamic Systems, Measurement, and Control, Jun. 1, 1981, vol. 102, pp. 126–133.

Hogan et al., "Impedance Control: An Approach to Manipulation: Part 1– Theory.", Journal of Dynamic Systems, Measurement, and Control, Mar. 1, 1985, vol. 107, pp. 1–7.

Nerac.com Retro Search, "Imprint Lithography." Oct. 16, 2004.

Kawata et al., "Imprint/Photo Hybrid Lithography Using Conventional Contact Aligner.", Japanese Journal of Applied Physics, Jun. 29, 2004, vol. 43, No. 6B, pp. 4027–4030.

International Search Report for PCT/US 00/30041, Oct. 18, 2001.

International Search Report for PCT/US 01/26049, Feb. 19, 2002.

Wu, "Large Area High Density Quantized Magnetic Disks Fabricated Using Nanoimprint Lithography.", J. Vac. Sci. Technol., Nov. 1, 1998, B 16(6), pp. 3825–3829.

Mansky et al., "Large–Area Domain Alignment in Block Copolymer Thin Films Using Electric Fields.", Macromolecules, Jun. 9, 1998, vol. 31, No. 13, pp. 4399–4401.

Trilogy Systems, "Linear Motors 310.", www.trilogysystems.com, Jan. 1, 2001.

Chou et al., "Lithographically Induced Self–assembly of Periodic Polymer Micropillar Arrays.", J. Vac. Sci. Technol., Nov. 1, 1999, B 17(6), pp. 3197–3202.

Sung et al., "Micro/nano–tribological Characteristics of Self–Assembled Monolayer and Its Application in Nano–Structure Fabrication.", Elsevier Science B.V., Jul. 1, 2003, vol. 255, No. 7, pp. 808–818.

Hirai et al., "Mold Surface Treatment for Imprint Lithography.", Journal of Photopolymer Science and Technology, Aug. 1, 2001, vol. 14, No. 3, pp. 457–462.

Haisma et al., "Mold–assisted Nanolithography: A Process for Reliable Pattern Replication.", J. Vac. Sci. Technol. B, Nov. 1, 1996, pp. 4124–4128.

Lin, "Multi–Layer Resist Systems.", Introduction to Microlithography, Feb. 14, 1983, pp. 287–349.

Nerac.com Retro Search, "Multi–Layer Resists.", Sep. 2, 2004.

Bender et al., "Multiple Imprinting in UV–Based Nanoimprint Lithography: Related Material Issues.", Microelectronic Engineering 61–62, Jan. 1, 2002, pp. 407–413.

Heidari, "Nanoimprint Lithography at the 6 in. Water Scale.", J. Vac. Sci. Technol. B 18 (6), Nov. 1, 2000, pp. 3557–3560.

Roos et al., "Nanoimprint Lithography with a Commercial 4 Inch Bond System for Hot Embossing.", Proceedings of SPIE, Oct. 1, 2001, vol. 4343, pp. 427–435.

Physik Instruments, "NanoPositioning, Micorpositioning, Piezo Technology.", PI Online Catalog, Jan. 1, 1999, www.physikinstruments.com.

White et al., "Novel Alignment System for Imprint Lithography.", J. Vac. Sci. Technol. B 18(6), Nov. 1, 2000, pp. 3552–3556.

Office Action from U.S. App. :No. 10/053,357, Dec. 16, 2003.

Sagiv, "Organized Monolayers by Absorption. 1. Formation and Structure of Oleophobic Mixed Monolayers on Solid Surfaces.", Journal of American Chemical Society/102:1, Jan. 2, 1980.

Merlet, "Parallel Manipulators: State of the Art and Perspectives.", Advanced Robotics, Jan. 1, 1994, vol. 8, pp. 589–596.

Wang et al., "Passive Compliance versus Active Compliance in Robot–Based Automated Assembly Systems.", Industrial Robot, Jan. 1, 1998, vol. 25, No. 1, pp. 48–57.

Ruchhoeft et al., "Patterning Curved Surfaces: Template Generation by Ion Beam Proximity Lithography and Relief Transfer by Step and Flash Imprint Lithography.", Journal of Vacuum Science and Technology, pp. 1–17.

"Photoresist Coating Methods.", E–mail from Susan Bagen (Bagen@aol.com) to Dhaval Shah, Sep. 18, 1997.

Cowie, "Polymers: Chemistry and Physics of Modern Materials.", $2^{nd}$ Ed., Jan. 1, 1991, pp. 408–409.

Braeuer et al., "Precise Polymer Micro–Optical Systems.", MRS Bulleting, Jul. 1, 2001, pp. 519–522.

Slocum, "Precision Machine Design: Macromachine Design Philosophy and Its Applicability to the Design of Micromachines.", Micro Electro Mechanical Systems, Feb. 4, 1992.

Mittal, "Precision Motion Control of a Magnetic Suspension Actuator Using a Robust Nonlinear Compensation Scheme.", IEE/ASME Transactions on Mechatronics., Dec. 1, 1997, vol. 2., No. 4, pp. 268–280.

Scheer et al., "Problems of the Nanoimprinting Technique for Nanometer Scale Pattern Definition.", J. Vac. Sci. Techno. B., Nov. 1, 1998, pp. 3917–3921.

Kim et al., "Reducing Photocurable Polymer Pattern Shrinkage and Roughness during Dry Etching in Photo–Nanoimprint Lithography.", Japanese Journal of Applied Physics, Jun. 29, 2004, vol. 43, No. 6B, pp. 4022–4026.

Nerac.com Retro Search, "Reduction of Dimension of Contact Holes.", Aug. 31, 2004.

Otto et al., "Reproducibility and Homogeneity in Step and Repeat UV–Nanoimprint Lithography.", Micoelectronic Engineering 73–74, Jan. 1, 2004, pp. 152–156.

Kanetomo et al., "Robot for Use in Ultrahigh Vacuum.", Solid State Technology, Aug. 1, 1997, pp. 63–72.

Eldada et al., "Robust Photopolymers for MCM, Board, and Backplane Optical Interconnects.", SPIE, Jan. 1, 1998, vol. 3288, pp. 175–191.

Kotachi et al., "Si–Containing Positive Resist for ArF Excimer Laser Lithography.", Photopolymer Science and Technology, Nov. 4, 1995, pp. 615–622.

Williams et al., "Six Degree of Freedom Mag–Lev Stage Development.", SPIE, Jan. 1, 1997, vol. 3051, pp. 856–867.

Xia et al., "Soft Lithography.", Angew. Chem. Int. Ed., Jan. 1, 1998, pp. 551–575.

Luurtsema, "Spin Coating for Rectangular Substrates.", Retrieved May 23, 2002 from URL: http://buffy.eecs.berkelye.edu/IRO/Summary/97abstracts/gluurts.2.html, May 23, 1992.

Xia et al., "Soft Lithography.", Annu Rev. Mater Sci. 1998 28: 153–184.

Colburn et al., "Step and Flash Imprint Lithography: A new Approach to High–Resolution Patterning.", Proc of SPIE, vol. 3676, Undated.

Otto et al., "Step and Repeat UV–Nanoimprint Lithography: Material Issues.", NNT02 San Francisco, Dec. 11, 2002.

Hiroshima et al., "Step–and–Repeat Photo–Nanoimprint System Using Active Orientation Head.", Japanese Journal of Applied Physics, Jun. 29, 2004, vol. 43, NO. 6B, pp. 4012–4016.

Ananthasuresh et al., "Strategies for Systematic Synthesis of Compliant Mems.", DSC–vol. 55–2, Dynamic Systems and Control: vol. 2, pp. 677–686, Nov. 1, 1994.

Papirer et al., "The Grafting of Perfluorinated Silanes onto the Surface of Silica: Characterization by Inverse Gas Chromatography.", Journal of Colloid and Interface Science 159, Aug. 1, 1993, pp. 238–242.

Feynman, "There's Plenty of Room at the Bottom.", Caltech Engineering and Science, (Feb. 1960).

Tajbakhsh et al., "Three–Degree–of–Freedom Optic Mount for Extreme Ultraviolet.", American Society for Precision Engineering, Jan. 1, 1998, pp. 359–362.

Hexel Corporation, "Tornado 2000 System Specifications.", www.hexel.com, Nov. 12, 1999.

Translation of Japanese Patent 02–24848, Jan. 26, 1990.

Translation of Japanese Patent 02–92603, Apr. 3, 1990.

Nerac.com Retro Search, "Trim Etching of Features Formed on an Organic Layer.", Sep. 2, 2004.

Lee et al., "Ultra Precision Positioning System for Servo Motor–piezo Actuator Using the Dual Servo Loop and Digital filter Implementation.", American Society for Precision Engineering, Jan. 1, 1998, pp. 287–290.

Feldman et al., "Wafer Chuck Magnification Correction in X–Ray Lithography.", J. Vac. Sci. Technol. B 16(6), Nov. 1, 1998, pp. 3476–3479.

Ciba Specialty Chemicals, "What is UV Curing?", www.cibasc.com/image.asp?id=4040.

* cited by examiner

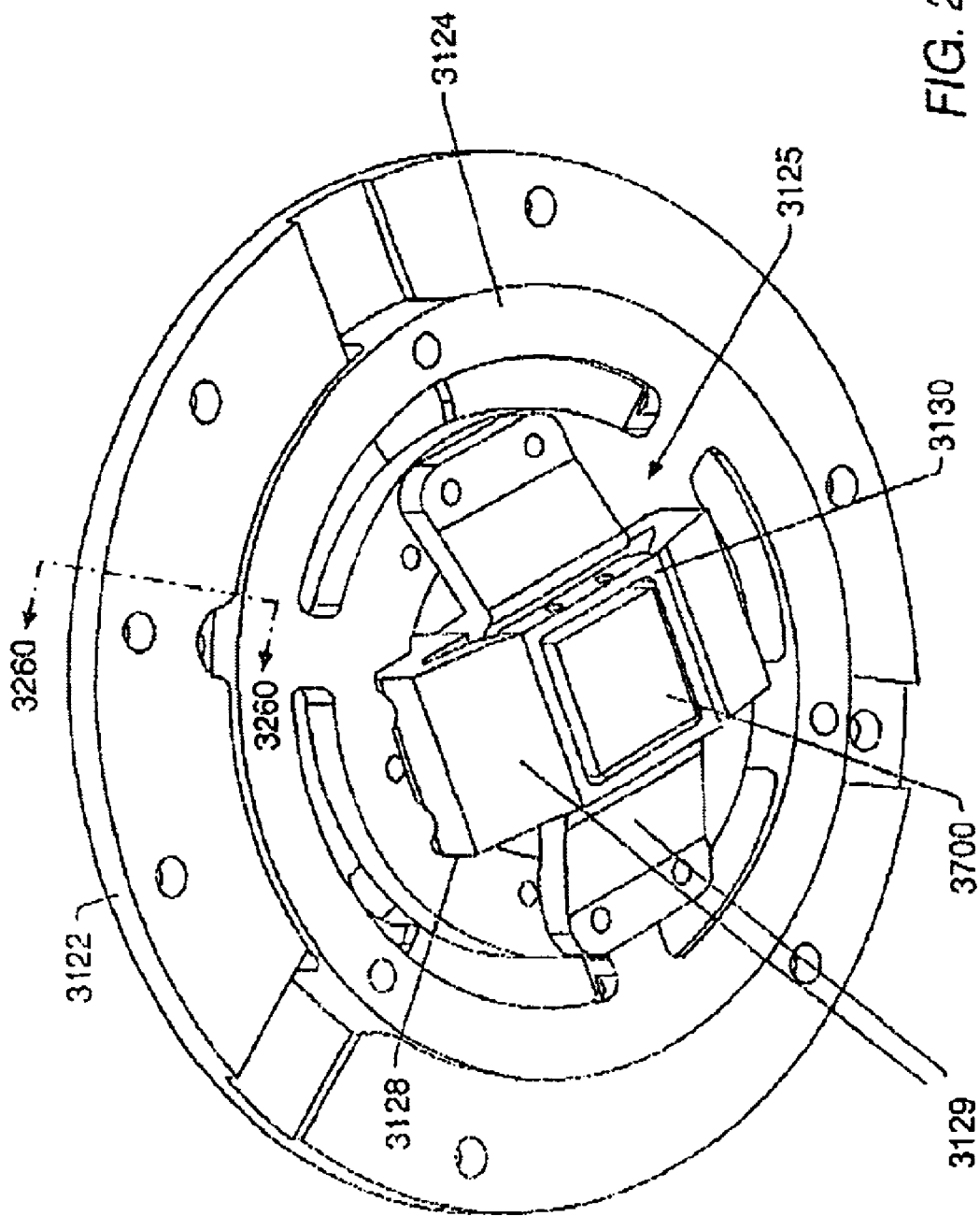

STEP AND REPEAT IMPRINT LITHOGRAPHY PROCESSES

BACKGROUND OF THE INVENTION

1. Field of the Invention

Embodiments presented herein relate to methods and systems for imprint lithography. More particularly, embodiments relate to methods and systems for micro- and nano-imprint lithography processes.

2. Description of the Relevant Art

Optical lithography techniques are currently used to make most microelectronic devices. However, it is believed that these methods are reaching their limits in resolution. Sub-micron scale lithography has been a critical process in the microelectronics industry. The use of sub-micron scale lithography allows manufacturers to meet the increased demand for smaller and more densely packed electronic circuits on chips. It is expected that the microelectronics industry will pursue structures that are as small or smaller than about 50 nm. Further, there are emerging applications of nanometer scale lithography in the areas of opto-electronics and magnetic storage. For example, photonic crystals and high-density patterned magnetic memory of the order of terabytes per square inch may require sub-100 nm scale lithography.

For making sub-50 nm structures, optical lithography techniques may require the use of very short wavelengths of light (e.g., about 13.2 nm). At these short wavelengths, many common materials are not optically transparent and therefore imaging systems typically have to be constructed using complicated reflective optics. Furthermore, obtaining a light source that has sufficient output intensity at these wavelengths is difficult. Such systems lead to extremely complicated equipment and processes that may be prohibitively expensive. It is also believed that high-resolution e-beam lithography techniques, though very precise, are too slow for high-volume commercial applications.

Several imprint lithography techniques have been investigated as low cost, high volume manufacturing alternatives to conventional photolithography for high-resolution patterning. Imprint lithography techniques are similar in that they use a template containing topography to replicate a surface relief in a film on the substrate. One form of imprint lithography is known as hot embossing.

Hot embossing techniques face several challenges: i) pressures greater than 10 MPa are typically required to imprint relief structures, ii) temperatures must be greater than the $T_g$ of the polymer film, iii) patterns (in the substrate film) have been limited to isolation trenches or dense features similar to repeated lines and spaces. Hot embossing is unsuited for printing isolated raised structures, such as lines and dots. This is because the highly viscous liquids resulting from increasing the temperature of the substrate films require extremely high pressures and long time durations to move the large volume of liquids needed to create isolated structures. This pattern dependency makes hot embossing unattractive. Also, high pressures and temperatures, thermal expansion, and material deformation generate severe technical challenges in the development of layer-to-layer alignment at the accuracies needed for device fabrication. Such pattern placement distortions lead to problems in applications, such as patterned magnetic media for storage applications. The addressing of the patterned medium bit by the read-write head becomes very challenging unless the pattern placement distortions can be kept to a minimum.

SUMMARY OF THE INVENTION

In one embodiment, a patterned layer is formed by curing a curable liquid disposed on a substrate in the presence of a patterned template. In an embodiment, a predetermined amount of an activating light curable liquid is applied to a first portion of a substrate. The liquid is applied in a predetermined pattern to the first portion of the substrate. A patterned template is positioned in a spaced relationship to the portion of the substrate upon which the liquid is disposed such that a gap is created between the template and the substrate. The distance between the template and the substrate is such that the applied liquid contacts substantially the entire patterning area of the template, but does not extend past a perimeter of the template. Activating light is applied to the activating light curable liquid. The activating light substantially cures the activating light curable liquid, forming a patterned cured layer on the first portion of the substrate. The process is then repeated on a second portion of the substrate. In this manner the substrate is imprinted in multiple "steps" rather than in a single step.

Imprint lithography process are enhanced by the use of low viscosity liquids. In one embodiment, the viscosity of the activating light curable liquid is less than about 30 centipoise. Control of the liquid within the perimeter of the template may be accomplished by a number of methods. In one embodiment, the distance between the template and the substrate is set such that the force applied by the template on the liquid does not force it beyond the border of the template. A template includes a plurality of recesses that define a plurality of features on the template. Liquid confinement is also controlled by forming one or more borders etched into the perimeter of the template. These borders have a depth that is substantially greater than the depth of the recessed portions of the template.

Imprint lithography processes for forming features having a feature size below 100 nm are typically sensitive to changes in temperature. As the temperature of an imprint lithography system increases, the supports (i.e., components that support the template, substrate and other components of the imprint lithography system) may expand. Expansion of the supports may contribute to errors due to misalignment of the template with the substrate. In one embodiment, supports are formed from a material that has a low coefficient of thermal expansion (e.g., less than about 20 ppm/° C.). In addition, the imprint lithography system may be placed in an enclosure. The enclosure is configured to inhibit temperature variations of greater than about 1° C. within the enclosure.

In an alternate embodiment, a patterned layer is formed by curing a curable liquid disposed on a patterned template in the presence of a substrate. In an embodiment, a predetermined amount of an activating light curable liquid is applied to a patterned template. The liquid is applied in a predetermined pattern to the patterned template. The patterned template is positioned in a spaced relationship to a first portion of the substrate upon which the patterned layer is to be produced. The distance between the template and the substrate is such that the applied liquid contacts substantially the entire patterning area of the template, but does not extend past a perimeter of the template. Activating light is applied to the activating light curable liquid. The activating light substantially cures the activating light curable liquid, forming a patterned cured layer on the first portion of the substrate. The process is then repeated by applying more liquid to the template and positioning the template proximate to a second portion of the substrate. In this manner the substrate is imprinted in multiple "steps" rather than in a single step.

In one embodiment, a patterned layer is formed by curing a curable liquid disposed on a substrate in the presence of a patterned template. In an embodiment, a predetermined amount of an activating light curable liquid is applied to a first portion of a substrate. The liquid is applied in a predetermined pattern to the first portion of the substrate. A patterned template is positioned in a spaced relationship to the portion of the substrate upon which the liquid is disposed such that a gap is created between the template and the substrate. The distance between the template and the substrate is such that the applied liquid contacts substantially the entire patterning area of the template, but does not extend past a perimeter of the template. Activating light is applied to the activating light curable liquid. The activating light substantially cures the activating light curable liquid, forming a patterned cured layer on the first portion of the substrate. The process is then repeated on a second portion of the substrate. In this manner the substrate is imprinted in multiple "steps" rather than in a single step.

In another embodiment, a planarization layer is formed by curing a curable liquid disposed on a substrate in the presence of a template that includes a planarization area. In an embodiment, a predetermined amount of an activating light curable liquid is applied to a first portion of a substrate. The liquid is applied in a predetermined pattern to the first portion of the substrate. A planarization template is positioned in a spaced relationship to the portion of the substrate upon which the liquid is disposed such that a gap is created between the template and the substrate. The distance between the template and the substrate is such that the applied liquid contacts substantially the entire patterning area of the template, but does not extend past a perimeter of the template. Activating light is applied to the activating light curable liquid. The activating light substantially cures the activating light curable liquid, forming a substantially planar cured layer on the first portion of the substrate. The process is then repeated on a second portion of the substrate. In this manner the substrate is planarized in multiple "steps" rather than in a single step.

BRIEF DESCRIPTION OF THE DRAWINGS

Other objects and advantages of the invention will become apparent upon reading the following detailed description and upon reference to the accompanying drawings in which:

FIG. 21 depicts a projection view of a rigid template support system coupled to a pre-calibration system of an imprint head;

Figure 1:
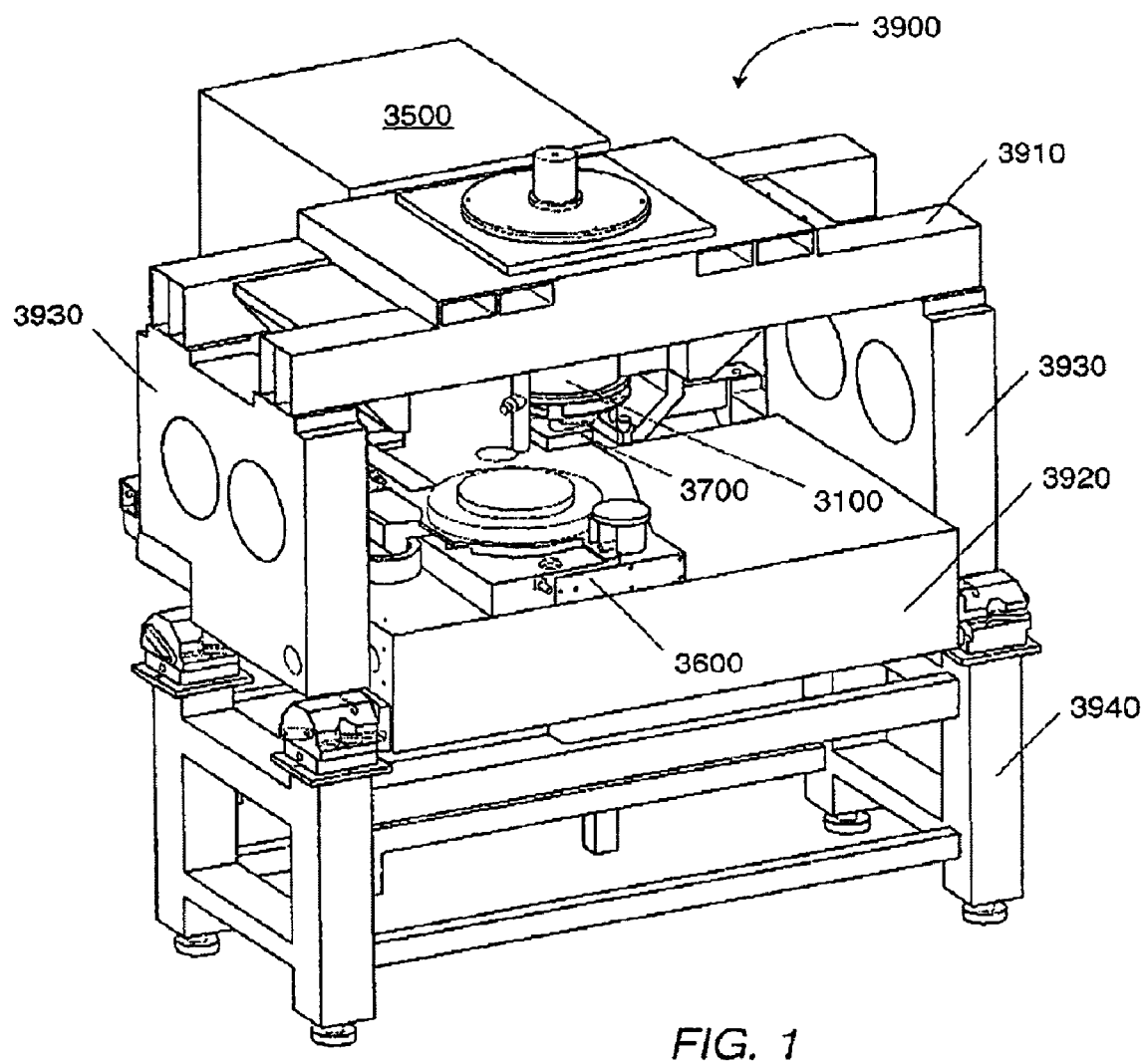
FIG. 1 depicts an embodiment of a system for imprint lithography.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims.

DETAILED DESCRIPTION OF THE INVENTION

Embodiments presented herein generally relate to systems, devices, and related processes of manufacturing small devices. More specifically, embodiments presented herein relate to systems, devices, and related processes of imprint lithography. For example, these embodiments may be used for imprinting sub-100 nm features on a substrate, such as a semiconductor wafer. It should be understood that these embodiments may also be used to manufacture other kinds of devices including, but not limited to: patterned magnetic media for data storage, micro-optical devices, micro-electro-mechanical system, biological testing devices, chemical testing and reaction devices, and X-ray optical devices.

Imprint lithography processes have demonstrated the ability to replicate high-resolution (e.g., sub-50 nm) images on substrates using templates that contain images as topography on their surfaces. Imprint lithography may be used in patterning substrates in the manufacture of microelectronic devices, optical devices, MEMS, opto-electronics, patterned magnetic media for storage applications, etc. Imprint lithography techniques may be superior to optical lithography for making three-dimensional structures, as micro lenses and T-gate structures. Components of an imprint lithography system including the template, substrate, liquid and any other materials that may affect the physical properties of the system including, but not limited to, surface energy, interfacial energies, Hamacker constants, Van der Waals' forces, viscosity, density, opacity, etc., are engineered to properly accommodate a repeatable process.

Methods and systems for imprint lithography are discussed in U.S. Pat. No. 6,334,960 to Willson et al. entitled "Step and Flash Imprint Lithography" which is incorporated herein by reference. Additional methods and systems for imprint lithography are further discussed in U.S. patent applications: U.S. Ser. No. 09/908,455 filed Jul. 17, 2001 entitled "Method and System of Automatic Fluid Dispensing for Imprint Lithography Processes"; U.S. Ser. No. 09/907,512 filed Jul. 16, 2001 entitled "High-Resolution Overlay Alignment Methods and Systems for Imprint Lithography"; U.S. Ser. No. 09/920,341 filed Aug. 1, 2001 entitled "Methods for High-Precision Gap Orientation Sensing Between a Transparent Template and Substrate for Imprint Lithography"; U.S. Ser. No. 09/934,248 filed Aug. 21, 2001 entitled "Flexure Based Macro Motion Translation Stage"; U.S. Ser. No. 09/698,317 filed Oct. 27, 2000 entitled "High-Precision Orientation Alignment and Gap Control Stages for Imprint Lithography Processes"; U.S. Ser. No. 09/976,681 filed Oct. 12, 2001 entitled "Template Design for Room Temperature, Low Pressure Micro- and Nano-Imprint Lithography"; U.S. Ser. No. 10/136,188 filed May 1, 2002 entitled "Methods of Manufacturing a Lithography Template" to Voison; and U.S. patent application entitled "Method and System for Fabricating Nanoscale Patterns in Light Curable Compositions Using an Electric Field" to Willson, et al. filed May 16, 2001, all of which are incorporated herein by reference. Further methods and systems are discussed in the following publications, all of which are incorporated herein by reference: "Design of Orientation Stages for Step and Flash Imprint Lithography," B. J. Choi, S. Johnson, M. Colburn, S. V. Sreenivasan, C. G. Willson, to appear in J. of Precision Engineering; "Large Area High Density Quantized Magnetic Disks Fabricated Using Nanoimprint Lithography," W. Wu, B. Cui, X. Y. Sun, W. Zhang, L. Zhunag, and S. Y. Chou, J. Vac Sci Technol B 16 (6), 3825–2829, November–December 1998; "Lithographically-Induced Self-Assembly of Periodic Polymer Micropillar Arrays," S. Y. Chou, L. Zhuang, J. Vac Sci Technol B 17 (6), 3197–3202, 1999; and "Large Area Domain Alignment in Block Copolymer Thin Films Using Electric Fields," P. Mansky, J. DeRouchey, J. Mays, M. Pitsikalis, T. Morkved, H. Jaeger and T. Russell, Macromolecules 13, 4399 (1998).

SYSTEM FOR IMPRINT LITHOGRAPHY

Overall System Description

FIG. 1 depicts an embodiment of a system for imprint lithography 3900. Imprint lithography system 3900 includes an imprint head 3100. Imprint head 3100 is mounted to an imprint head support 3910. Imprint head 3100 is configured to hold a patterned template 3700. Patterned template 3700 includes a plurality of recesses that define a pattern of features to be imprinted into a substrate. Imprint head 3100 or motion stage 3600 is further configured to move patterned template 3700 toward and away from a substrate to be imprinted during use. Imprint lithography system 3900 also includes a motion stage 3600. Motion stage 3600 is mounted to motion stage support 3920. Motion stage 3600 is configured to hold a substrate and move the substrate in a generally planar motion about motion stage support 3920. Imprint lithography system 3900 further includes an activating light source 3500 coupled to imprint head 3100. Activating light source 3500 is configured to produce a curing light and direct the produced curing light through patterned template 3700 coupled to imprint head 3100. Curing light includes light at an appropriate wavelength to cure a polymerizable liquid. Curing light includes ultraviolet light, visible light, infrared light, x-ray radiation and electron beam radiation.

Imprint head support 3910 is coupled to motion stage support 3920 by bridging supports 3930. In this manner imprint head 3100 is positioned above motion stage 3600. Imprint head support 3910, motion stage support 3920 and bridging supports 3930 are herein collectively referred to as the system "body." The components of the system body may be formed from thermally stable materials. Thermally stable materials have a thermal expansion coefficient of less than about 10 ppm/° C. at about room temperature (e.g., 25° C.). In some embodiments, the material of construction may have a thermal expansion coefficient of less than about 10 ppm/° C., or less than 1 ppm/° C. Examples of such materials include silicon carbide, certain alloys of iron including, but not limited to certain alloys of steel and nickel (e.g., alloys commercially available under the name INVAR®), and certain alloys of steel, nickel and cobalt (e.g., alloys commercially available under the name SUPER INVAR™). Additional examples of such materials include certain ceramics including, but not limited to ZERODUR® ceramic. Motion stage support 3920 and bridging supports 3930 are coupled to support table 3940. Support table 3940 provides a substantially vibration free support for the components of imprint lithography system 3900. Support table 3940 isolates imprint lithography system 3900 from ambient vibrations (e.g., due to works, other machinery, etc.). Motion stages and vibration isolation support tables are commercially available from Newport Corporation of Irvine, Calif.

As used herein, the "X-axis" refers to the axis that runs between bridging supports 3930. As used herein the "Y-axis" refers to the axis that is orthogonal to the X-axis. As used herein the "X-Y plane" is a plane defined by the X-axis and the Y-axis. As used herein the "Z-axis" refers to an axis running from motion stage support 3920 to imprint head support 3910, orthogonal to the X-Y plane. Generally an imprint process involves moving the substrate, or the imprint head, along an X-Y plane until the proper position of the substrate with respect to patterned template 3700 is achieved. Movement of template 3700, or motion stage 3600, along the Z-axis, will bring patterned template 3700 to a position that allows contact between patterned template 3700 and a liquid disposed on a surface of the substrate.

Figure 2:
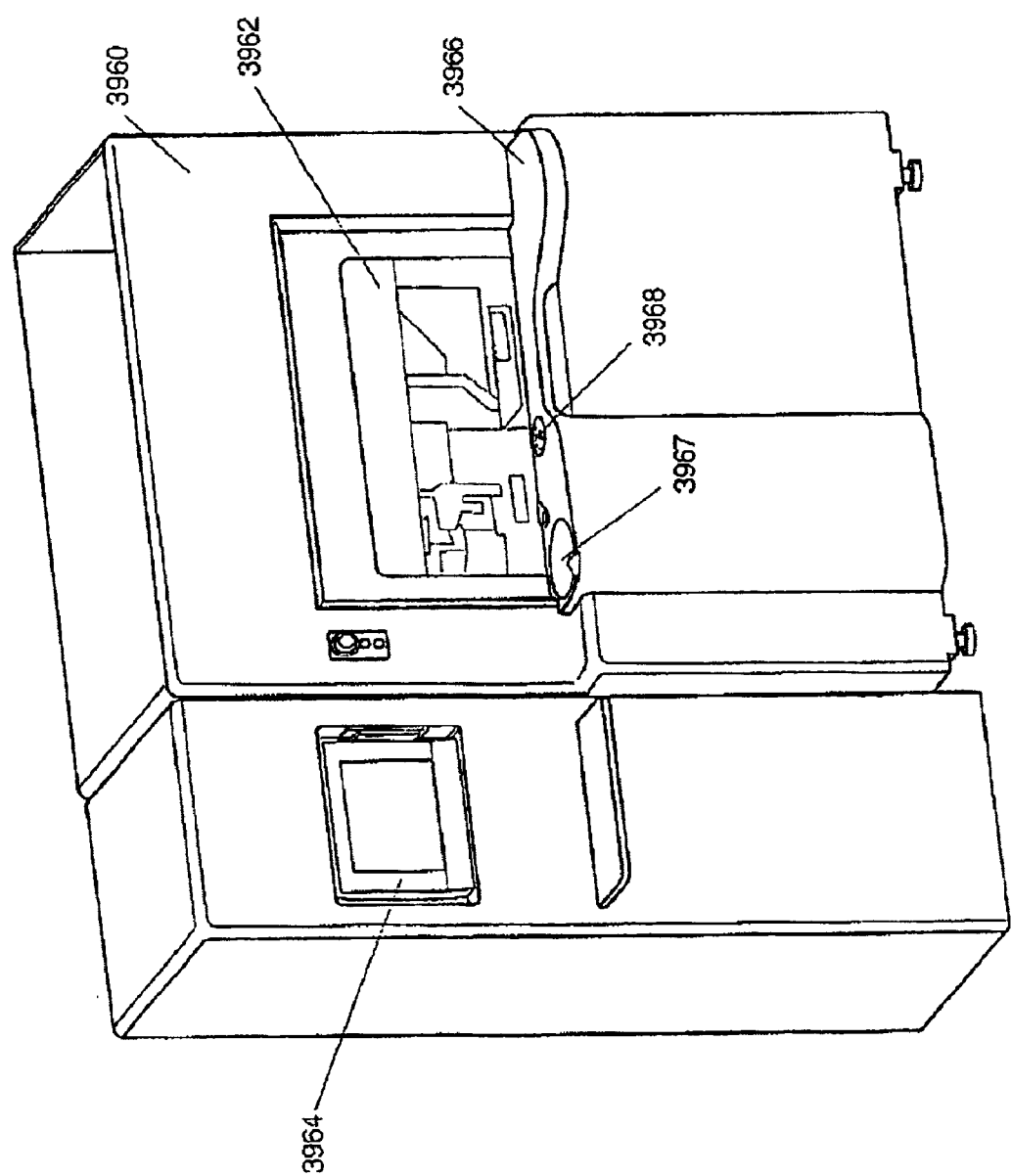
FIG. 2 depicts an imprint lithography system enclosure.

Imprint lithography system 3900 may be placed in an enclosure 3960, as depicted in FIG. 2. Enclosure 3960 encompasses imprint lithography system 3900 and provides a thermal and air barrier to the lithography components. Enclosure 3960 includes a movable access panel 3962 that allows access to the imprint head 3100 and motion stage 3600 when moved to an "open" position, as depicted in FIG. 2. When in a "closed" position, the components of imprint lithography system 3900 are at least partially isolated from the room atmosphere. Access panel 3962 also serves as a thermal barrier to reduce the effects of temperature changes within the room on the temperature of the components within enclosure 3960. Enclosure 3960 includes a temperature control system. A temperature control system is used to control the temperature of components within enclosure 3960. In one embodiment, a temperature control system is configured to inhibit temperature variations of greater than about 1° C. within enclosure 3960. In some embodiments, a temperature control system inhibits variations of greater than about 0.1° C. In one embodiment, thermostats or other temperature measuring devices in combination with one or more fans may be used to maintain a substantially constant temperature within enclosure 3960.

Various user interfaces may also be present on enclosure 3960. A computer controlled user interface 3964 may be coupled to enclosure 3960. User interface 3964 may depict the operating parameters, diagnostic information, job progress and other information related to the functioning of the enclosed imprint system 3900. User interface 3964 may also be configured to receive operator commands to alter the operating parameters of imprint lithography system 3900. A staging support 3966 may also be coupled to enclosure 3960. Staging support 3966 is used by an operator to support substrates, templates and other equipment during an imprint lithography process. In some embodiments, staging support 3966 may include one or more indentations 3967 configured to hold a substrate (e.g., a circular indentation for a semiconductor wafer). Staging support 3966 may also include one or more indentations 3968 for holding a patterned template 3700.

Additional components may be present depending on the processes that the imprint lithography system 3900 is designed to implement. For example, for semiconductor processing equipment including, but not limited to, an automatic wafer loader, an automatic template loader and an interface to a cassette loader (all not shown) may be coupled to imprint lithography system 3900.

Imprint Head

Figure 3:
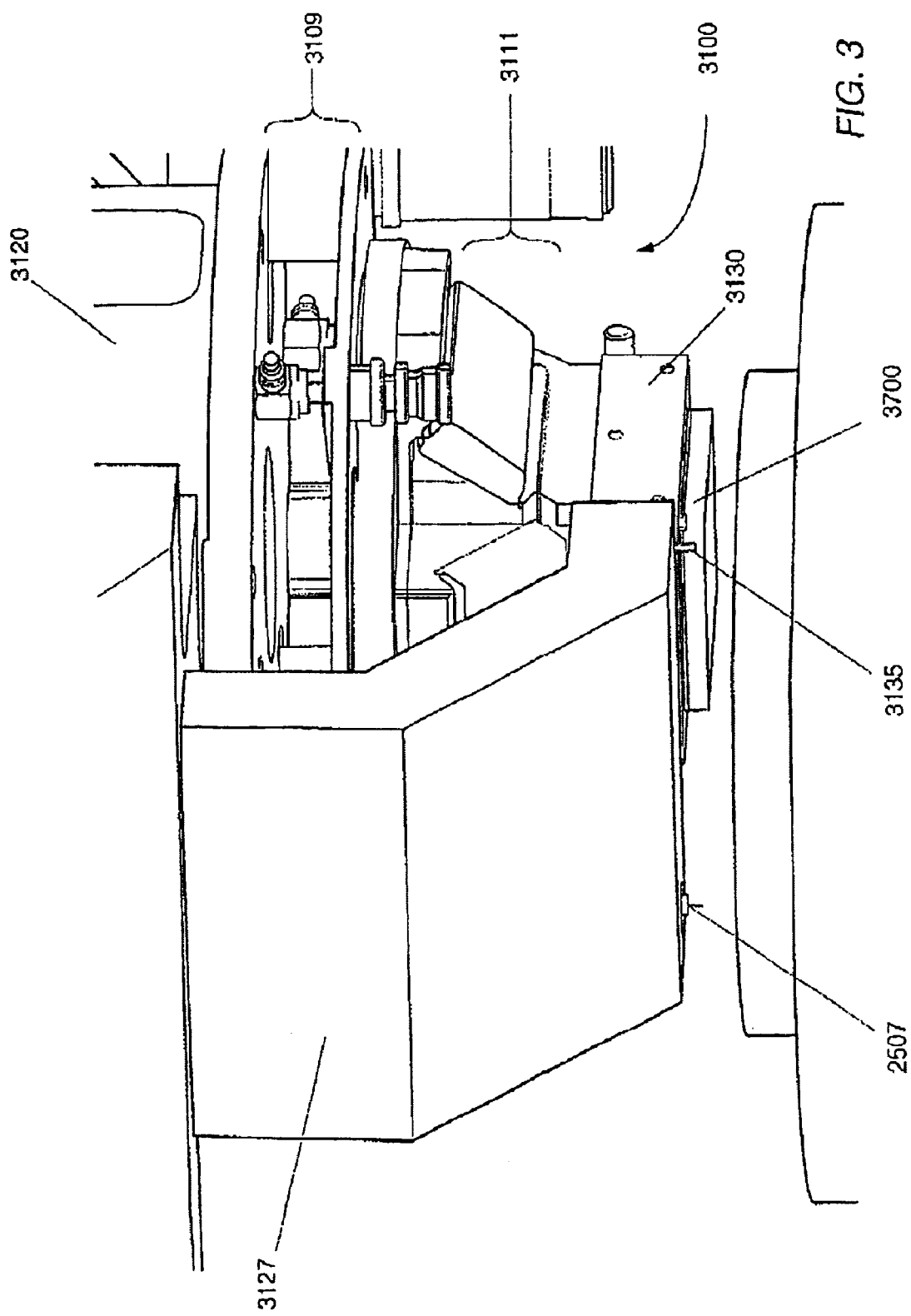
FIG. 3 depicts an embodiment of an imprint lithography head coupled to an imprint lithography system.

FIG. 3 depicts an embodiment of a portion of an imprint head 3100. Imprint head 3100 includes a pre-calibration system 3109 and a fine orientation system 3111 coupled to pre-calibration system 3109. Template support 3130 is coupled to fine orientation system 3111. Template support 3130 is designed to support and couple a patterned template 3700 to fine orientation system 3111.

Figure 4:
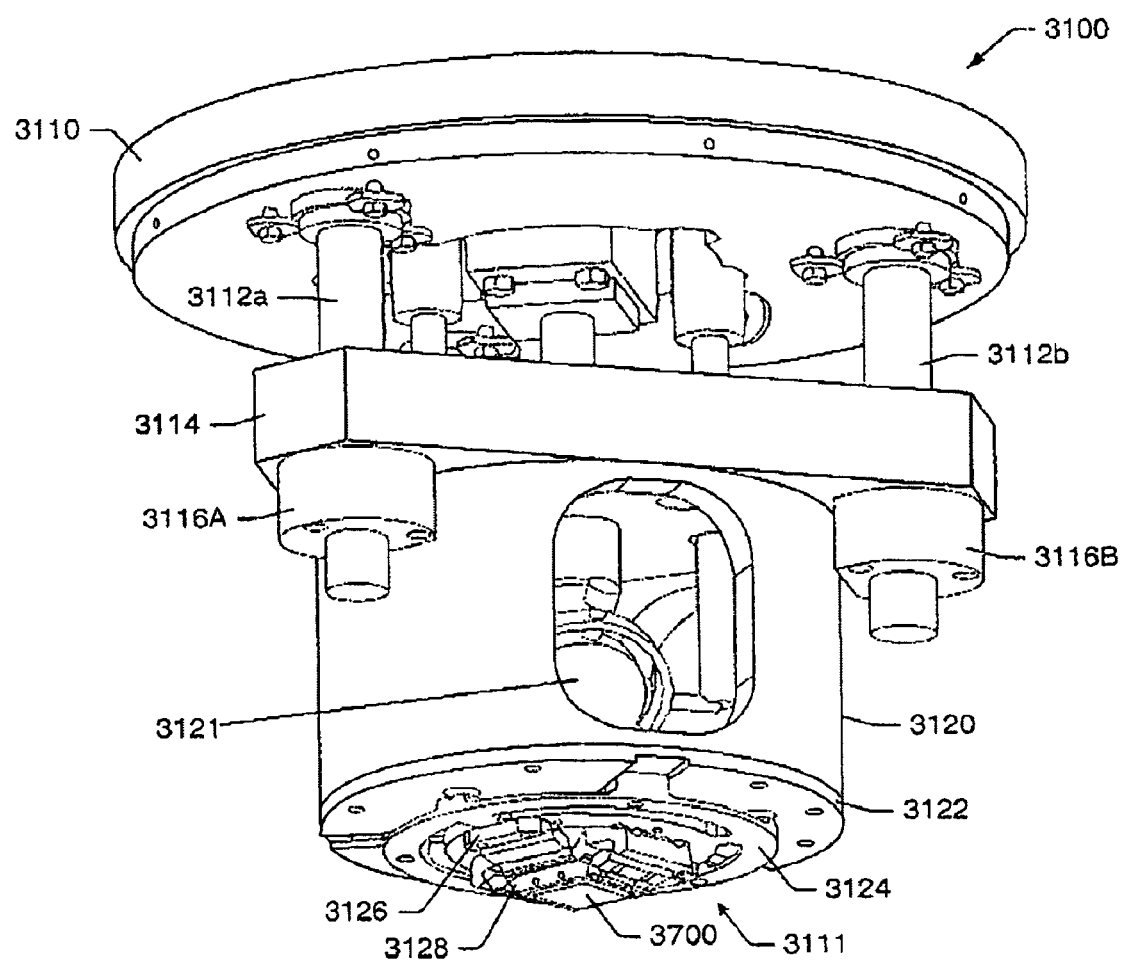
FIG. 4 depicts a projection view of an imprint head.

Referring to FIG. 4, a disk-shaped flexure ring 3124, which makes up a portion of pre-calibration system 3109 is coupled to imprint head housing 3120. Imprint head housing 3120 is coupled to a middle frame 3114 with guide shafts 3112a and 3112b. In one embodiment, three (3) guide shafts may be used (the back guide shaft is not visible in FIG. 4) to provide a support for housing 3120. Sliders 3116A and 3116B coupled to corresponding guide shafts 3112a and 3112b about middle frame 3114 are used to facilitate the up and down motion of housing 3120. A disk-shaped base plate 3122 is coupled to the bottom portion of housing 3120. Base plate 3122 may be coupled to flexure ring 3124. Flexure ring 3124 supports fine orientation system 3111 components that include first flexure member 3126 and second flexure member 3128. The operation and configuration of the flexure members 3126 and 3128 are discussed in detail below.

Figure 5:
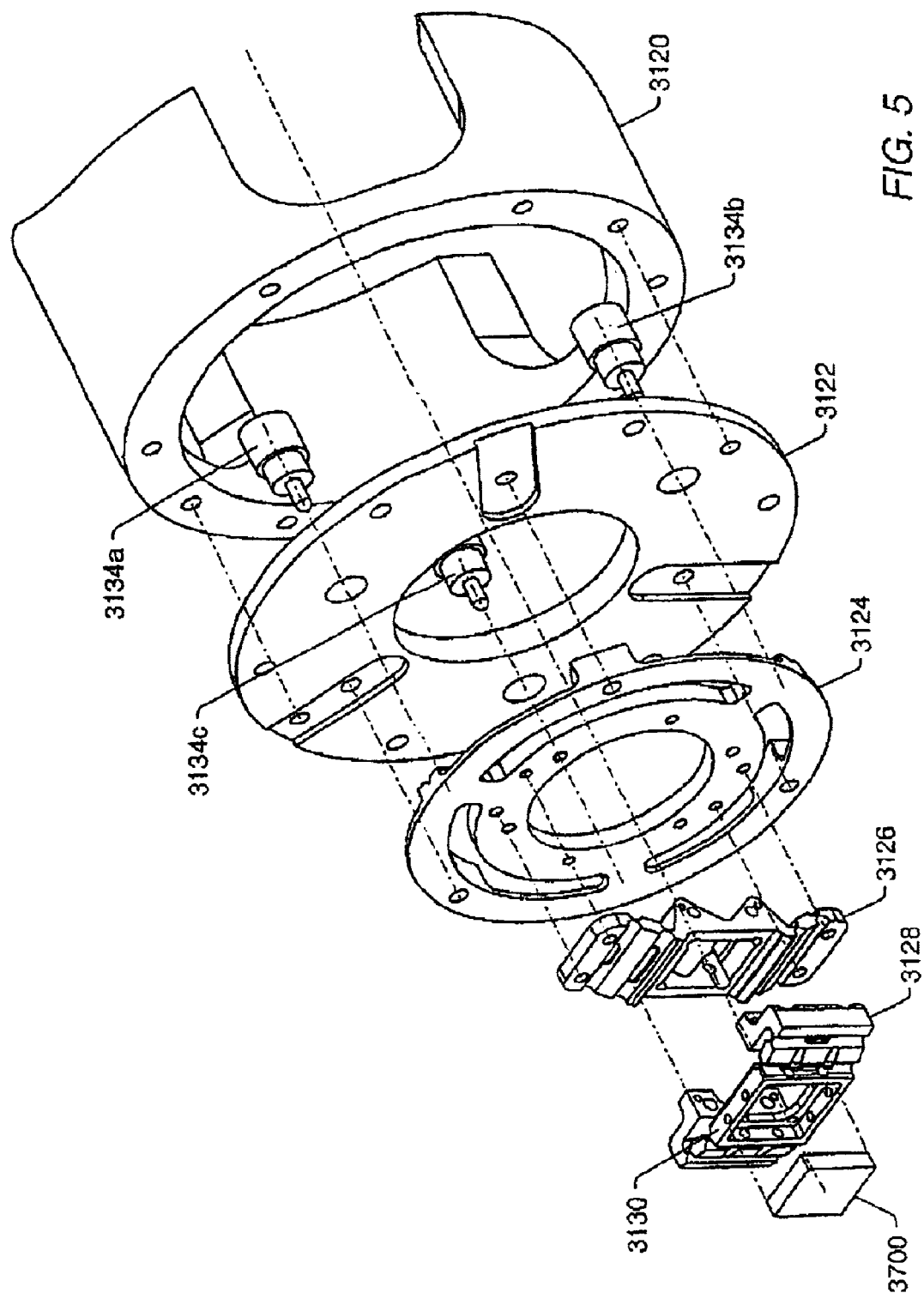
FIG. 5 depicts an exploded view of an imprint head.

FIG. 5 depicts an exploded view of imprint head 3100. As shown in FIG. 5, actuators 3134a, 3134b, and 3134c are fixed within housing 3120 and coupled to base plate 3122 and flexure ring 3124. In operation, motion of actuators 3134a, 3134b, and 3134c controls the movement of flexure ring 3124. Motion of actuators 3134a, 3134b, and 3134c may allow for a coarse pre-calibration. In some embodiments, actuators 3134a, 3134b, and 3134c may be equally spaced around housing 3120. Actuators 3134a, 3134b, 3134c and flexure ring 3124 together form the pre-calibration system 3109. Actuators 3134a, 3134b, and 3134c allow translation of flexure ring 3124 along the Z-axis to control the gap accurately.

Imprint head 3100 also includes a mechanism that enables fine orientation control of patterned template 3700 so that proper orientation alignment may be achieved and a uniform gap may be maintained by the template with respect to a substrate surface. Alignment and gap control is achieved, in one embodiment, by the use of first and second flexure members, 3126 and 3128, respectively.

Figure 6:
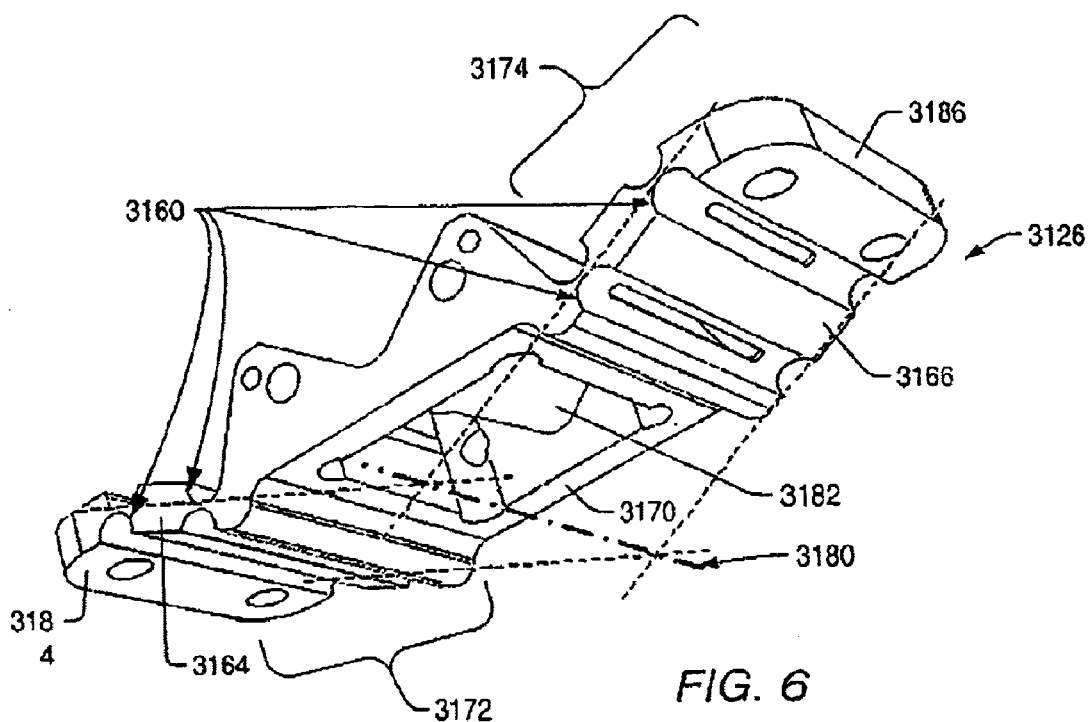
FIG. 6 depicts a projection view of a first flexure member.
Figure 7:
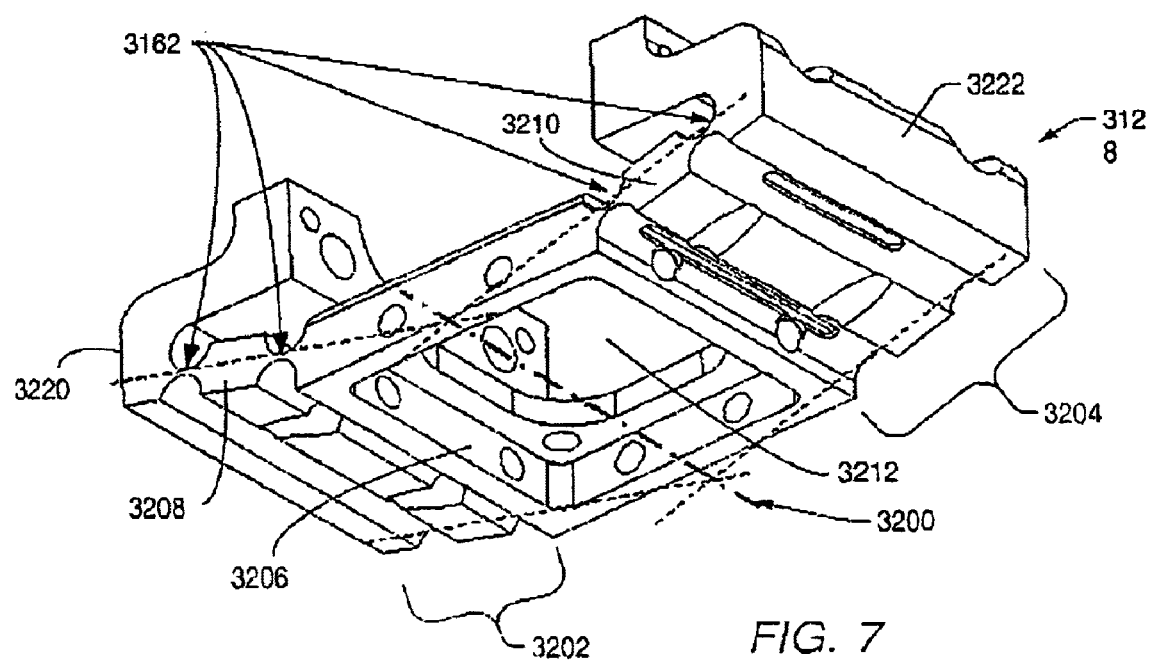
FIG. 7 depicts a projection view of a second flexure member.

FIGS. 6 and 7 depict embodiments of first and second flexure members, 3126 and 3128, respectively, in more detail. As depicted in FIG. 6, first flexure member 3126 includes a plurality of flexure joints 3160 coupled to corresponding rigid bodies 3164 and 3166. Flexure joints 3160 may be notch shaped to provide motion of rigid bodies 3164 and 3166 about pivot axes that are located along the thinnest cross section of the flexure joints. Flexure joints 3160 and rigid body 3164 together form arm 3172, while additional flexure joints 3160 and rigid body 3166 together form arm 3174. Arms 3172 and 3174 are coupled to and extend from first flexure frame 3170. First flexure frame 3170 has an opening 3182, which allows curing light (e.g., ultraviolet light) to pass through first flexure member 3126. In the depicted embodiment, four flexure joints 3160 allow motion of first flexure frame 3170 about a first orientation axis 3180. It should be understood, however, that more or less flexure joints might be used to achieve the desired control. First flexure member 3126 is coupled to second flexure member 3128 through first flexure frame 3170, as depicted in FIG. 8.

First flexure member 3126 also includes two coupling members 3184 and 3186. Coupling members 3184 and 3186 include openings that allow attachment of the coupling members to flexure ring 3124 using any suitable fastening means. Coupling members 3184 and 3186 are coupled to first flexure frame 3170 via arms 3172 and 3174 as depicted in FIG; 6.

Second flexure member 3128 includes a pair of arms 3202 and 3204 extending from second flexure frame 3206, as depicted in FIG. 7. Flexure joints 3162 and rigid body 3208 together form arm 3202, while additional flexure joints 3162 and rigid body 3210 together form arm 3204. Flexure joints 3162 may be notch shaped to provide motion of rigid body 3210 and arm 3204 about pivot axes that are located along the thinnest cross-section of the flexure joints 3162. Arms 3202 and 3204 are coupled to and extend from template support 3130. Template support 3130 is configured to hold and retain at least a portion of a patterned template 3700. Template support 3130 also has an opening 3212, which allows curing light (e.g., ultraviolet light) to pass through second flexure member 3128. In the depicted embodiment, four flexure joints 3162 allow motion of template support 3130 about a second orientation axis 3200. It should be understood, however, that more or less flexure joints might be used to achieve the desired control. Second flexure member 3128 also includes braces 3220 and 3222. Braces 3220 and 3222 include openings that allow attachment of the braces to portions of first flexure member 3126.

Figure 8:
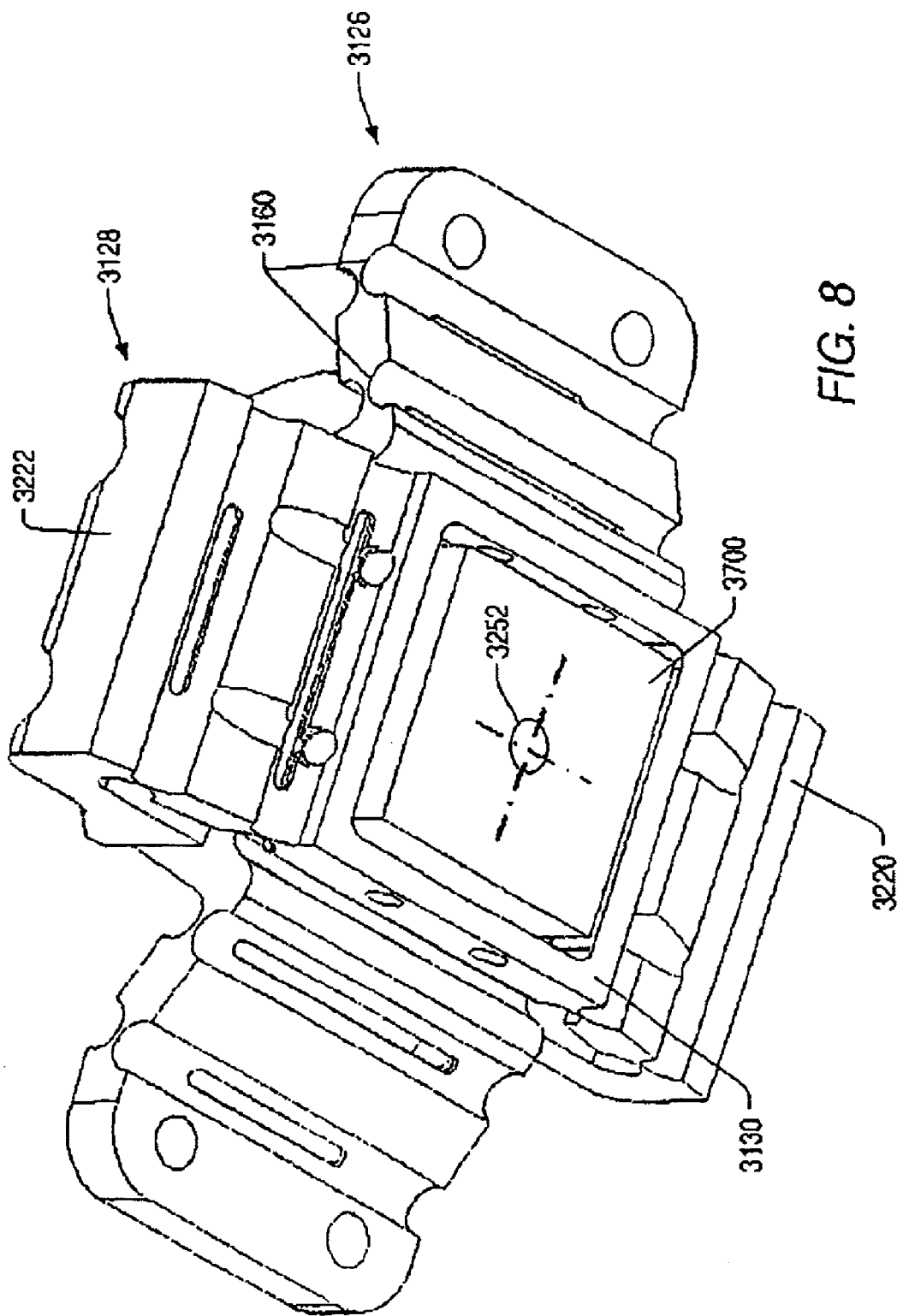
FIG. 8 depicts a projection view of first and second flexure members coupled together.

In one embodiment, first flexure member 3126 and second flexure member 3128 are joined as shown in FIG. 8 to form fine orientation system 3111. Braces 3220 and 3222 are coupled to first flexure frame 3170 such that the first orientation axis 3180 of first flexure member 3126 and second orientation axis 3200 of second flexure member 3128 are substantially orthogonal to each other. In such a configuration, first orientation axis 3180 and second orientation axis 3200 intersect at a pivot point 3252 at approximately the center region of a patterned template 3700 disposed in template support 3130. This coupling of the first and second flexure members, 3126 and 3128, respectively, allows fine alignment and gap control of patterned template 3700 during use. While the first and second flexure members, 3126 and 3128, are depicted as discrete elements, it should be understood that the first and second flexure members, 3126 and 3128, respectively, may be formed from a single machined part where the flexure members 3126 and 3128 are integrated together. Flexure members 3126 and 3128 are coupled by mating of surfaces such that motion of patterned template 3700 occurs about pivot point 3252, substantially reducing "swinging" and other motions that may shear imprinted features following imprint lithography. Fine orientation system 3111 imparts negligible lateral motion at the template surface and negligible twisting motion about the normal to the template surface due to selectively constrained high structural stiffness of the flexure joints 3162. Another advantage of using the herein described flexure members is that they do not generate substantial amounts of particles, especially when compared with frictional joints. This is offers an advantage for imprint lithography processes, as particles may disrupt such processes.

Figure 9:
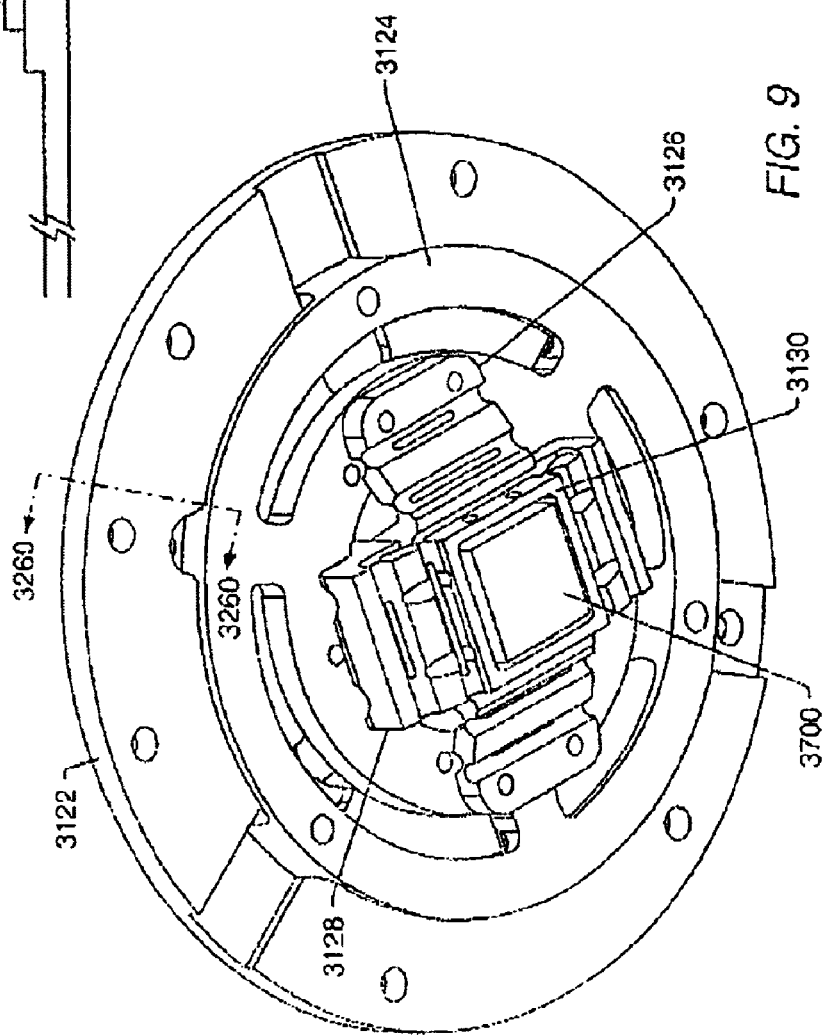
FIG. 9 depicts a projection view of a fine orientation system coupled to a pre-calibration system of an imprint head.

FIG. 9 depicts the assembled fine orientation system 3111 coupled to pre-calibration system 3109. Patterned template 3700 is positioned within template support 3130 that is part of second flexure member 3128. Second flexure member 3128 is coupled to first flexure member 3126 in a substantially orthogonal orientation. First flexure member 3126 is coupled to flexure ring 3124 via coupling members 3186 and 3184. Flexure ring 3124 is coupled to base plate 3122, as has been described above.

Figure 10:
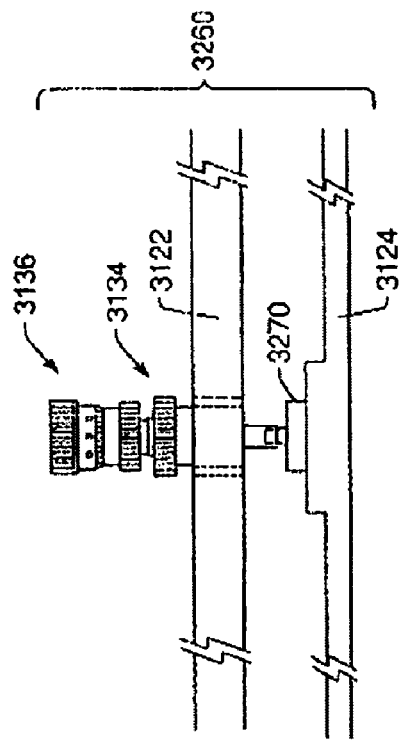
FIG. 10 depicts a cross-sectional view of a pre-calibration system.

FIG. 10 represents a cross-section of the pre-calibration system 3109 looking through cross-section 3260. As shown in FIG. 10, flexure ring 3124 is coupled to base plate 3122 with actuator 3134. Actuator 3134 includes an end 3270 coupled to a force detector 3135 that contacts flexure ring 3124. During use activation of actuator 3134 causes movement of end 3270 toward or away from flexure ring 3124. The movement of end 3270 toward flexure ring 3124 induces a deformation of flexure ring 3124 and causes translation of fine orientation system 3111 along the Z-axis toward the substrate. Movement of end 3270 away from flexure ring 3124 allows the flexure ring 3124 to move to its original shape and, in the process, moves fine orientation system 3111 away from the substrate.

In a typical imprint process patterned template 3700 is disposed in a template support 3130 coupled to fine orientation system 3111, as depicted in previous figures. Patterned template 3700 is brought in to contact with a liquid on a surface of a substrate. Compression of the liquid on the substrate as patterned template 3700 is brought closer to the substrate causes a resistive force to be applied by the liquid onto the template. This resistive force is translated through fine orientation system 3111 and to flexure ring 3124, as shown in both FIGS. 9 and 10. The force applied against flexure ring 3124 will also be translated as a resistive force to actuator 3134. The resistive force applied to actuator 3134 may be determined using force sensor 3135. Force detector 3135 may be coupled to actuator 3134 such that a resistive force applied to actuator 3134 during use may be determined and controlled.

Figure 11:
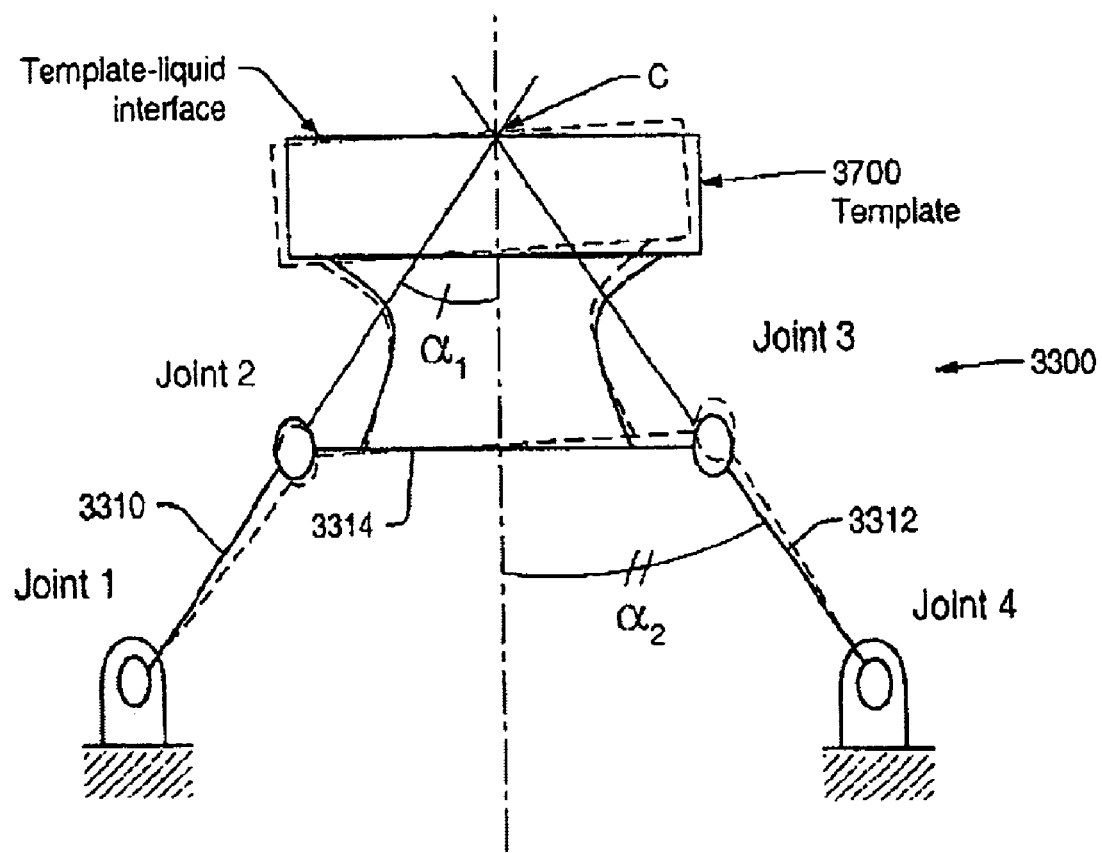
FIG. 11 depicts a schematic diagram of a flexure system.

FIG. 11 depicts a flexure model 3300 useful in understanding the principles of operation of a fine decoupled orientation stage, such as the fine orientation system 3111 described herein. Flexure model 3300 may include four parallel joints: Joints 1, 2, 3 and 4, that provide a four-bar linkage system in its nominal and rotated configurations. Line 3310 denotes an axis of alignment of Joints 1 and 2. Line 3312 denotes an axis of alignment of Joints 3 and 4. Angle $\alpha_1$ represents an angle between a perpendicular axis through the center of patterned template 3700 and line 3310. Angle $\alpha_2$ represents a perpendicular axis through the center of patterned template 3700 and line 3310. Angles $\alpha_1$ and $\alpha_2$, in some embodiments, are selected so that the compliant alignment axis (or orientation axis) lies substantially at the surface of patterned template 3700. For fine orientation changes, rigid body 3314 between Joints 2 and 3 may rotate about an axis depicted by Point C. Rigid body 3314 may be representative of template support 3130 of second flexure member 3128.

Fine orientation system 3111 generates pure tilting motions with no substantial lateral motions at the surface of patterned template 3700 coupled to fine orientation system 3111. The use of flexure arms 3172, 3174, 3202 and 3204 may provide fine orientation system 3111 with high stiffness in the directions where side motions or rotations are undesirable and lower stiffness in directions where necessary orientation motions are desirable. Fine orientation system 3111, therefore allows rotations of the template support 3130, and therefore patterned template 3700, about pivot point 3252 at the surface of patterned template 3700, while providing sufficient resistance in a direction perpendicular to patterned template 3700 and parallel to patterned template 3700 to maintain the proper position with respect to the substrate. In this manner a passive orientation system is used for orientation of patterned template 3700 to a parallel orientation with respect to patterned template 3700. The term "passive" refers to a motion that occurs without any user or programmable controller intervention, i.e., the system self-corrects to a proper orientation by contact of patterned template 3700 with the liquid. Alternate embodiments in which the motion of the flexure arms 3172, 3174, 3202 and 3204 are controlled by motors to produce an active flexure may also be implemented.

Motion of the fine orientation system 3111 may be activated by direct or indirect contact with the liquid. If fine orientation system 3111 is passive, then it is, in one embodiment, designed to have the most dominant compliance about two orientation axes. The two orientation axes lie orthogonal to each other and lie on the imprinting surface of an imprinting member disposed on fine orientation system 3111. The two orthogonal torsional compliance values are set to be the same for a symmetrical imprinting member. A passive fine orientation system 3111 is designed to alter the orientation of patterned template 3700 when patterned template 3700 is not parallel with respect to a substrate. When patterned template 3700 makes contact with liquid on the substrate, the flexure members 3126 and 3128 compensate for the resulting uneven liquid pressure on patterned template 3700. Such compensation may be affected with minimal or no overshoot. Further, a fine orientation stage as described above may hold the substantially parallel orientation between patterned template 3700 and the substrate for a sufficiently long period to allow curing of the liquid.

Imprint head 3100 is mounted to imprint head support 3910 as depicted in FIG. 1. In this embodiment, imprint head support 3910 is mounted such that imprint head 3100 remains in a fixed position at all times. During use, all movement along the X-Y plane is performed to the substrate by motion stage 3600.

Motion Stage

Figure 12:
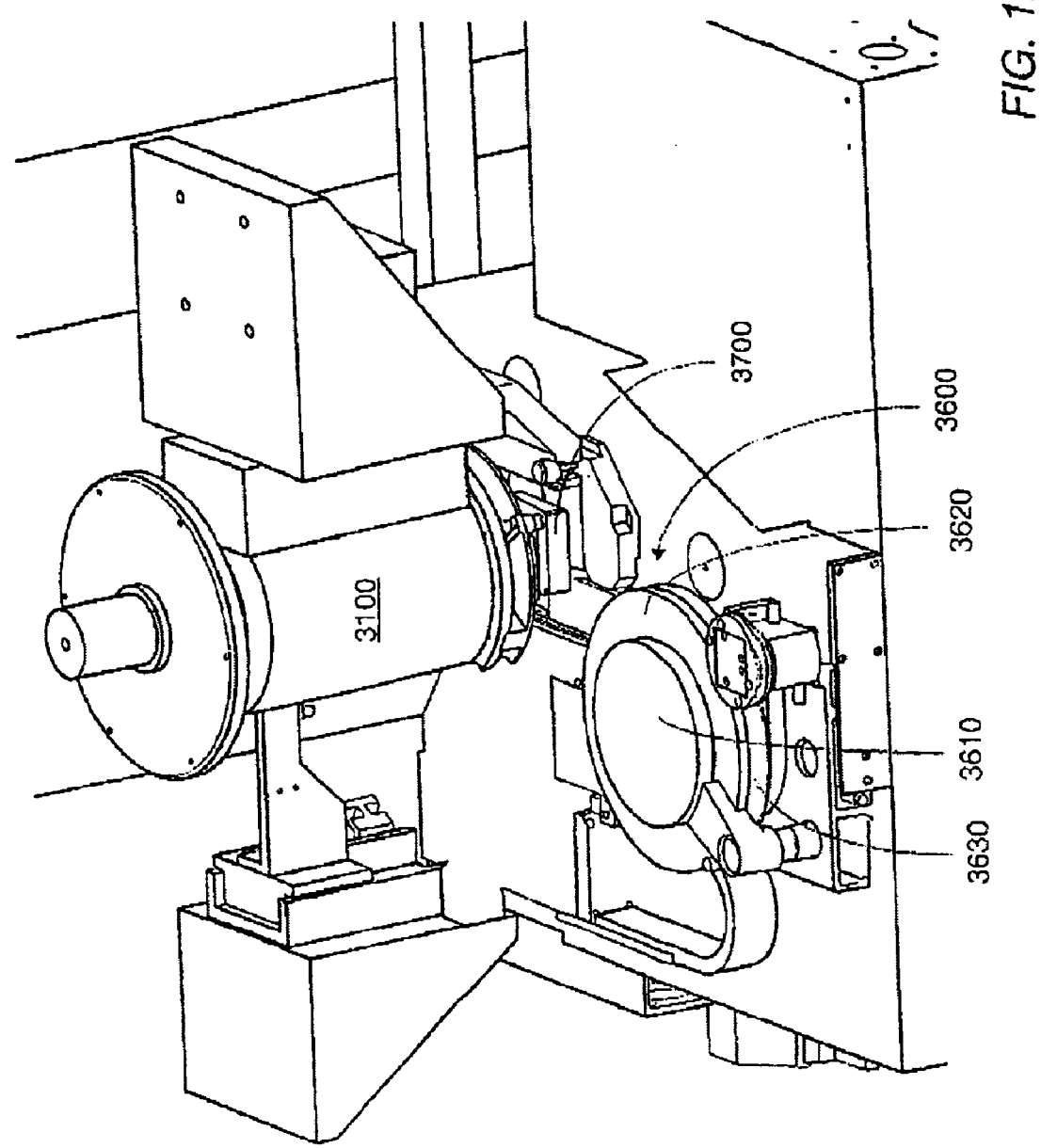
FIG. 12 depicts a projection view of a motion stage and an imprint head of an imprint lithography system.

Motion stage 3600 is used to support a substrate to be imprinted and move the substrate along an X-Y plane during use. Motion stage 3600, in some embodiments, is capable of moving a substrate over distances of up to several hundred millimeters with an accuracy of at least ±30 nm, preferably with an accuracy of about ±10 nm. In one embodiment, motion stage 3600 includes a substrate chuck 3610 that is coupled to carriage 3620, as depicted in FIG. 12. Carriage 3620 is moved about a base 3630 on a frictional bearing system or a non-frictional bearing system. In one embodiment, a non-frictional bearing system that includes an air bearing is used. Carriage 3620 is suspended above base 3630 of motion stage 3630 using, in one embodiment, an air layer (i.e., the "air bearing"). Magnetic or vacuum systems may be used to provide a counter balancing force to the air bearing level. Both magnetic based and vacuum based systems are commercially available from a variety of suppliers and any such systems may be used in an imprint lithography process. One example of a motion stage that is applicable to imprint lithography processes is the Dynam YX motion stage commercially available from Newport Corporation, Irvine Calif. Motion stage 3500 also may include a tip tilt stage similar to the calibration stage, designed to approximately level the substrate to the X-Y motion plane. It also may include one or more theta stages to orient the patterns on the substrate to the X-Y motion axes.

Liquid Dispenser

Imprint lithography system 3900 also includes a liquid dispense system 3125 which is used to dispense a curable liquid onto a substrate. Liquid dispense system 3125 is coupled to the system body. In one embodiment, a liquid dispense system 3125 is coupled to imprint head 3100. FIG. 3 depicts liquid dispenser head 2507 of a liquid dispense system 3125 extending out from cover 3127 of imprint head system 3100. Various components of liquid dispense system 3125 may be disposed in cover 3127 of imprint head 3100.

Figure 13:
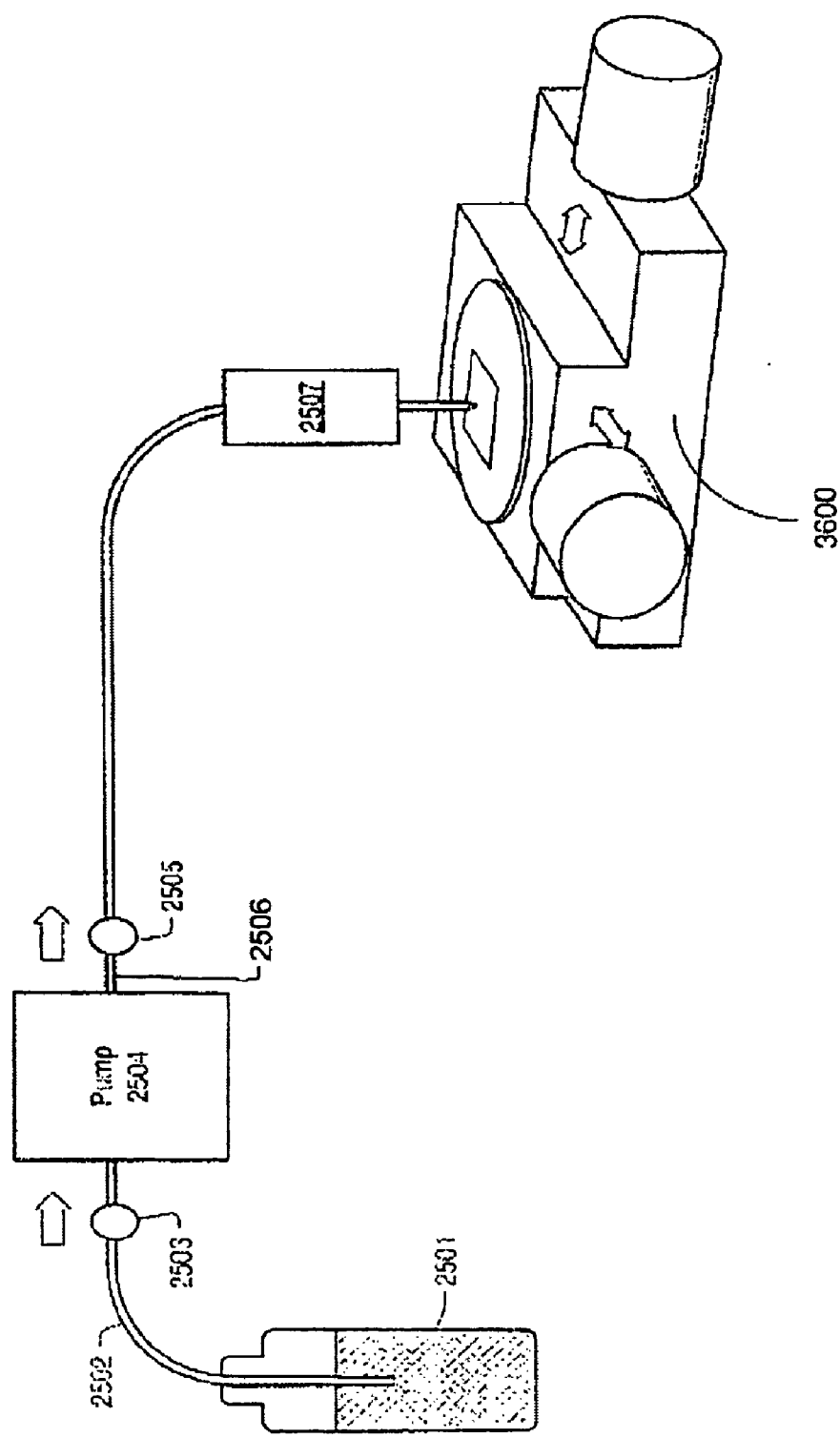
FIG. 13 depicts a schematic diagram of a liquid dispense system.

A schematic of liquid dispense system 3125 is depicted in FIG. 13. In an embodiment, liquid dispense system 3125 includes liquid container 2501. Liquid container 2501 is configured to hold an activating light curable liquid. Liquid container 2501 is coupled to pump 2504 via inlet conduit 2502. An inlet valve 2503 is positioned between liquid container 2501 and pump 2504 to control flow of through inlet conduit 2502. Pump 2504 is coupled to liquid dispenser head 2507 via outlet conduit 2506.

Liquid dispense system 3125 is configured to allow precise volume control of the amount of liquid dispensed onto an underlying substrate. In one embodiment, liquid control is achieved using a piezoelectric valve as pump 2504. Piezoelectric valves are available commercially available from the Lee Company, Westbrook, Conn. During use, a curable liquid is drawn into pump 2504 through inlet conduit 2502. When a substrate is properly positioned below, pump 2504 is activated to force a predetermined volume of liquid through outlet conduit 2506. The liquid is then dispensed through liquid dispenser head 2507 onto the substrate. In this embodiment, liquid volume control is achieved by control of pump 2504. Rapid switching of pump 2504 from an open to closed state allows a controlled amount of liquid to be sent to liquid dispenser head 2507. Pump 2504 is configured to dispense liquid in volumes of less than about 1 μL. The operation of pump 2504 may allow either droplets of liquid or a continuous pattern of liquid to be dispensed onto the substrate. Droplets of liquid are applied by rapidly cycling pump 2504 from an open to closed state. A stream of liquid is produced on the substrate by leaving pump 2504 in an open state and moving the substrate under liquid dispenser head 2507.

In another embodiment, liquid volume control may be achieved by use of liquid dispenser head 2507. In such a system, pump 2504 is used to supply a curable liquid-to-liquid dispenser head 2507. Small drops of liquid whose volume may be accurately specified are dispensed using a liquid dispensing actuator. Examples of liquid dispensing actuators include microsolenoid valves or piezo-actuated dispensers. Piezo-actuated dispensers are commercially available from MicroFab Technologies, Inc., Plano, Tex. Liquid dispensing actuators are incorporated into liquid dispenser head 2507 to allow control of liquid dispensing. Liquid dispensing actuators are configured to dispense between about 50 pL to about 1000 pL of liquid per drop of liquid dispensed. Advantages of a system with a liquid dispensing actuator include faster dispensing time and more accurate volume control. Liquid dispensing systems are further described in U.S. Ser. No. 09/908,455 filed Jul. 17, 2001, entitled "Method and System of Automatic Fluid Dispensing for Imprint Lithography Processes," which is incorporated herein by reference.

Coarse Measurement System

Coarse determination of the position of patterned template 3700 and the substrate is determined by the use of linear encoders (e.g., exposed linear encoders). Encoders offer a coarse measurement on the order of 0.01 μm. Linear encoders include a scale coupled to the moving object and a reader coupled to the body. The scale may be formed from a variety of materials including glass, glass ceramics, and steel. The scale includes a number of markings that are read by the reader to determine a relative or absolute position of the moving object. The scale is coupled to motion stage 3600 by means that are known in the art. A reader is coupled to the body and optically coupled to the scale. In one embodiment, an exposed linear encoder may be used. Encoders may be configured to determine the position of motion stage 3600 along either a single axis, or in a two-axis plane. An example of an exposed two-axis linear encoder is the PP model encoder available from Heidenhain Corporation, Schaumburg, Ill. Generally, encoders are built into many commercially available X-Y motion stages. For example, the Dynam YX motion stage available from Newport Corp has a two-axis encoder built into the system.

The coarse position of patterned template 3700 along the Z-axis is also determined using a linear encoder. In one embodiment, an exposed linear encoder may be used to measure the position of patterned template 3700. A scale of the linear encoder, in one embodiment, is coupled to the pre-calibration ring of imprint head 3100. Alternatively, the scale may be coupled directly to template support 3130. The reader is coupled to the body and optically coupled to the scale. Position of patterned template 3700 is determined along the Z-axis by use of encoders.

Air Gauges

In an embodiment, air gauge 3135 may be coupled to imprint head 3100, as depicted in FIG. 3. Air gauge 3135 is used to determine whether a substrate disposed on motion stage 3600 is substantially parallel to a reference plane. As used herein, an "air gauge" refers to a device that measures the pressure of a stream of air directed toward a surface. When a substrate is disposed under an outlet of air gauge 3135, the distance the substrate is from the outlet of air gauge 3135 will influence the pressure air gauge 3135 senses. Generally, the further away from air gauge 3135 the substrate is, the lesser the pressure.

In such a configuration, air gauge 3135 may be used to determine differences in pressure resulting from changes in the distance between the substrate surface and air gauge 3135. By moving air gauge 3135 along the surface of the substrate, air gauge 3135 determines the distance between air gauge 3135 and the substrate surface at the various points measured. The degree of planarity of the substrate with respect to air gauge 3135 is determined by comparing the distance between air gauge 3135 and the substrate at the various points measured. The distance between at least three points on the substrate and air gauge 3135 is used to determine if a substrate is planar. If the distance is substantially the same, the substrate is considered to be planar. Significant differences in the distances measured between the substrate and air gauge 3135 indicates a non-planar relationship between the substrate and air gauge 3135. This non-planar relationship may be caused by the non-planarity of the substrate or a tilt of the substrate. Prior to use, a tilt of the substrate is corrected to establish a planar relationship between the substrate and patterned template 3700. Suitable air gauges may be obtained from Senex Inc.

During use of air gauges, the substrate or patterned template 3700 is placed within the measuring range of air gauge 3135. Motion of the substrate toward air gauge 3135 may be accomplished by either Z-axis motion of imprint head 3100 or Z-axis motion of motion stage 3600.

Light Source

In an imprint lithography process, a light curable liquid is disposed on a surface of the substrate. Patterned template 3700 is brought into contact with the light curable liquid and activating light is applied to the light curable liquid. As used herein "activating light" means light that may affect a chemical change. Activating light may include ultraviolet light (e.g., light having a wavelength between about 200 nm to about 400 nm), actinic light, visible light or infrared light. Generally, any wavelength of light capable of affecting a chemical change may be classified as activating. Chemical changes may be manifested in a number of forms. A chemical change may include, but is not limited to, any chemical reaction that causes a polymerization or a cross-linking reaction to take place. The activating light, in one embodiment, is passed through patterned template 3700 prior to reaching the composition. In this manner the light curable liquid is cured to form structures complementary to the structures formed on patterned template 3700.

In some embodiments, activating light source 3500 is an ultraviolet light source capable of producing light having a wavelength between about 200 nm to about 400 nm. Activating light source 3500 is optically coupled patterned template 3700, as depicted in FIG. 1. In one embodiment, activating light source 3500 is positioned proximate to imprint head 3100. Imprint head 3100 includes a mirror 3121, as depicted in FIG. 4, which reflects light from activating light source 3500 to patterned template 3700. Light passes through an opening in the body of imprint head 3100 and is reflected by mirror 3121 toward patterned template 3700. In this manner, activating light source 3700 irradiates patterned template 3700 without being disposed in imprint head 3100.

Most activating light sources produce a significant amount of heat during use. If activating light source 3500 is too close to imprint lithography system 3900, heat from the light source will radiate toward the body of imprint lithography system 3900 and may cause the temperature of portions of the body to increase. Since many metals expand when heated, the increase in temperature of a portion of the body of imprint lithography system 3900 may cause the body to expand. This expansion may affect the accuracy of imprint lithography system 3900 when sub-100 nm features are being produced.

Figure 14:
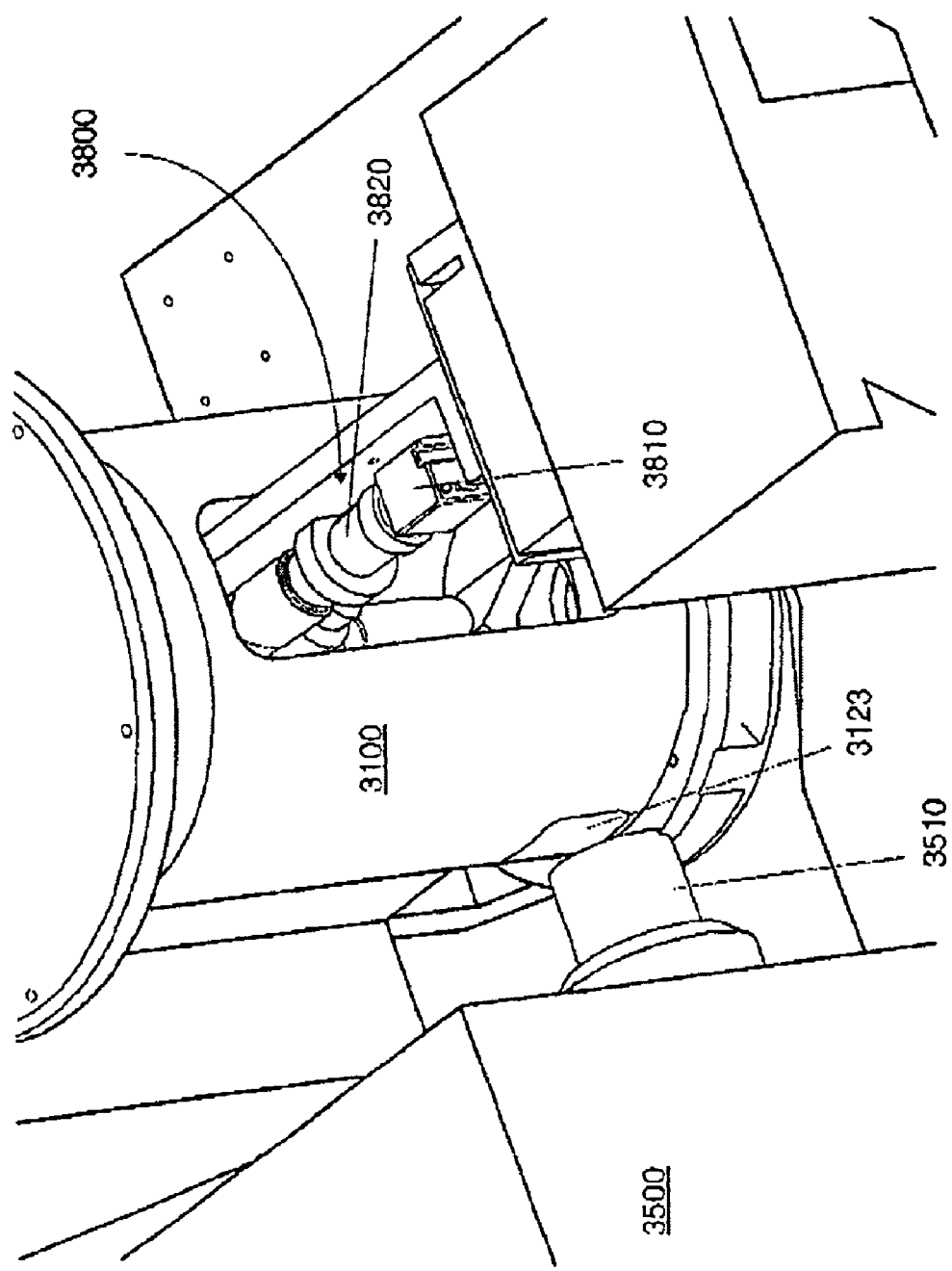
FIG. 14 depicts a projection view of an imprint head with a light source and camera optically coupled to the imprint head.

In one embodiment, activating light source 3500 is positioned at a sufficient distance from the body such that the system body is insulated from head produced by activating light source 3500 by the intervening air between activating light source 3500 and imprint head 3100. FIG. 14 depicts activating light source 3500 optically coupled to imprint head 3100. Activating light source 3500 includes an optical system 3510 that projects light generated by a light source toward imprint head 3100. Light passes from optical system 3510 into imprint 3100 by mirror 3121 disposed within imprint head 3100 (see FIG. 4). In this manner, the light source is thermally insulated from the body. A suitable light source may be obtained from OAI Inc., Santa Clara. Calif.

Optical Alignment Devices

One or more optical measuring devices may be optically coupled to imprint head 3100 and/or motion stage stage 3600. Generally, an optical measuring device is any device that allows the position and/or orientation of patterned template 3700 with respect to a substrate to be determined.

Turning to FIG. 14, a through the template optical imaging system 3800 is optically coupled to imprint head 3100. Optical imaging system 3800 includes an optical imaging device 3810 and an optical system 3820. Optical imaging device 3800 is optically coupled to patterned template 3700 through imprint head 3100. Optical imaging system 3800 is also optically coupled to a substrate, when the substrate is disposed under patterned template 3700. Optical imaging system 3800 is used to determine the placement error between a patterned template 3700 and an underlying substrate as described herein. In one embodiment, mirror 3121 (see FIG. 4) is movable within imprint head 3100. During an alignment or optical inspection process, mirror 3121 is moved out of the optical path of the optical imaging system 3800.

During use of an optical alignment device, the substrate or patterned template 3700 is placed within the measuring range (e.g., the field of view) of the air optical imaging system 3800. Motion of the substrate toward the optical imagine system 3800 may be accomplished by either Z-axis motion of imprint head 3100 or Z-axis motion of motion stage 3600.

Light Curable Liquid

As previously mentioned, a light curable liquid is placed on a substrate and a template is brought into contact with the liquid during an imprint lithography process. The curable liquid is a low viscosity liquid monomer solution. A suitable solution may have a viscosity ranging from about 0.01 cps to about 100 cps (measured at 25° C.). Low viscosities are especially desirable for high-resolution (e.g., sub-100 nm) structures. Low viscosities also lead to faster gap closing. Additionally, low viscosities result in faster liquid filling of the gap area at low pressures. In particular, in the sub-50 nm regime, the viscosity of the solution should be at or below about 30 cps, or more preferably below about 5 cps (measured at 25° C.).

Many of the problems encountered with other lithography techniques may be solved by using a low viscosity light curable liquid in an imprint lithography process. Patterning of low viscosity light curable liquids solves each of the issues facing hot embossing techniques by utilizing a low-viscosity, light-sensitive liquid. Also use of a thick, rigid, transparent template offers the potential for easier layer-to-layer alignment. The rigid template is, in general, transparent to both liquid activating light and alignment mark measurement light.

The curable liquid may be composed of a variety of polymerizable materials. Generally, any photopolymerizable material may be used. Photopolymerizable materials may include a mixture of monomers and a photoinitiator. In some embodiments, the curable liquid may include one or more commercially available negative photoresist materials. The viscosity of the photoresist material may be reduced by diluting the liquid photoresist with a suitable solvent.

In an embodiment, a suitable curable liquid includes a monomer, a silylated monomer, and an initiator. A crosslinking agent and a dimethyl siloxane derivative may also be included. Monomers include, but are not limited to, acrylate and methacylate monomers. Examples of monomers include, but are not limited to, butyl acrylate, methyl acrylate, methyl methacrylate, or mixtures thereof. The monomer makes up approximately 25 to 50% by weight of the curable liquid. It is believed that the monomer ensures adequate solubility of the photoinitiator in the curable liquid. It is further believed that the monomer provides adhesion to an underlying organic transfer layer, when used.

The curable liquid may also include a silylated monomer. Silylated monomers in general are polymerizable compounds that include a silicon group. Classes of silylated monomers include, but are not limited to, silane acrylyl and silane methacrylyl derivatives. Specific examples include methacryloxypropyl tris(tri-methylsiloxy)silane and (3-acryloxypropyl)tris(trimethoxysiloxy)-silane. Silylated monomers may be present in amounts from 25 to 50% by weight. The curable liquid may also include a dimethyl siloxane derivative. Examples of dimethyl siloxane derivatives include, but are not limited to, (acryloxypropyl) methylsiloxane dimethylsiloxane copolymer, acryloxypropyl methylsiloxane homopolymer, and acryloxy terminated polydimethylsiloxane. Dimethyl siloxane derivatives are present in amounts from about 0 to 50% by weight. It is believed that the silylated monomers and the dimethyl siloxane derivatives may impart a high oxygen etch resistance to the cured liquid. Additionally, both the silylated monomers and the dimethyl siloxane derivatives are believed to reduce the surface energy of the cured liquid, therefore increasing the ability of the template to release from the surface. The silylated monomers and dimethyl siloxane derivatives listed herein are all commercially available from Gelest, Inc.

Any material that may initiate a free radical reaction may be used as the initiator. For activating light curing of the curable material, it is preferred that the initiator is a photo-initiator. Examples of initiators include, but are not limited to, alpha-hydroxyketones (e.g., 1-hydroxycyclohexyl phenyl ketone, sold by Ciba-Geigy Specialty Chemical Division as Irgacure 184), and acylphosphine oxide initiators (e.g., phenylbis(2,4,6-trimethyl benzoyl) phosphine oxide, sold by Ciba-Geigy Specialty Chemical Division as Irgacure 819).

The curable liquid may also include a crosslinking agent. Crosslinking agents are monomers that include two or more polymerizable groups. In one embodiment, polyfunctional siloxane derivatives may be used as a crosslinking agent. An example of a polyfunctional siloxane derivative is 1,3-bis (3-methacryloxypropyl)-tetramethyl disiloxane.

In one example, a curable liquid may include a mixture of 50% by weight of n-butyl acrylate and 50% (3-acryloxypropyl) tris-trimethylsiloxane-silane. To this mixture 3% by weight mixture of a 1:1 Irgacure 819 and Irgacure 184 and 5% of the crosslinker 1,3-bis(3-methacryloxypropyl)-tetramethyl disiloxane may be added. The viscosity of this mixture is less than 30 cps measured at about 25° C.

Curable Liquid with Gas Release

In an alternate embodiment, the curable liquid may be formed of a monomer, an acid-generating photo-agent, and a base-generating photo-agent. Examples of the monomer include, but are not limited to, phenolic polymers and epoxy resins. The acid-generating photo-agent is a compound that releases acid when treated with activating light. The generated acid catalyzes polymerization of the monomer. Those of ordinary skill in the art know such acid-generating additives, and the specific acid-generating additive used depends on the monomer and the desired curing conditions. In general, the acid-generating additive is selected to be sensitive to radiation at the first wavelength $\lambda_1$, which, in some implementations, is in the visible or near ultraviolet (near UV) range. For example, in some implementations, the first wavelength $\lambda_1$ is selected to be approximately 400 nm or longer. A base generating photo-agent is also added to the monomer. The base-generating photo-agent may inhibit curing of the monomer near the interface of the template. The base generating photo-agent may be sensitive to radiation at a second wavelength $\lambda_2$, yet inert or substantially inert to radiation at the first wavelength $\lambda_1$. Moreover, the second wavelength $\lambda_2$ should be selected so that radiation at the second wavelength is primarily absorbed near the surface of the monomer at the interface with the template and does not penetrate very far into the curable liquid. For example, in some implementations, a base generating additive that is sensitive to radiation having a wavelength $\lambda_2$ in the deep UV range, in other words, radiation having a wavelength in the range of about 190–280 nm, may be used.

According to an embodiment, a curable liquid that includes a monomer, an acid-generating photo-agent and a base-generating photo-agent is deposited onto a substrate. A template is brought into contact with the curable liquid. The curable liquid is then exposed to radiation at a first wavelength $\lambda_1$ and a second wavelength $\lambda_2$ of light at substantially the same time. Alternatively, the curing liquid may be exposed to the radiation at the second wavelength $\lambda_2$ and subsequently to the radiation at the first wavelength $\lambda_1$. Exposure of the curable liquid to radiation at the second wavelength $\lambda_2$ produces an excess of base near the interface with the template. The excess base serves to neutralize the acid that is produced by exposure of the curable liquid to radiation at the first wavelength $\lambda_1$, thereby inhibiting the acid from curing the curable liquid. Since the radiation at the second wavelength $\lambda_2$ has a shallow penetration depth into the curable liquid, the base produced by that radiation only inhibits curing of the curable liquid at or near the interface with the template. The remainder of the curable liquid is cured by exposure to the longer wavelength radiation ($\lambda_1$) which penetrates throughout the curable liquid. U.S. Pat. No. 6,218,316 entitled "Planarization of Non-Planar Surfaces in Device Fabrication" describes additional details concerning this process and is incorporated herein by reference.

In another embodiment, the curable liquid may include a photosensitive agent which, when exposed, for example, to deep UV radiation, decomposes to produce one or more gases, such as hydrogen ($H_2$), nitrogen ($N_2$), nitrous oxide ($N_2O$), sulfur tri-oxide ($SO_3$), acetylene ($C_2H_2$), carbon dioxide ($CO_2$), ammonia ($NH_3$) or methane ($CH_4$). Radiation at a first wavelength $\lambda_1$, such as visible or near UV, may be used to cure the curable liquid, and the deep UV radiation ($\lambda_2$) may be used to produce one or more of the foregoing gases. The generation of the gases produces localized pressure near the interface between the cured liquid and the template to facilitate separation of the template from the cured liquid. U.S. Pat. No. 6,218,316 describes additional details concerning this process and is incorporated herein by reference.

In another embodiment, a curable liquid may be composed of a monomer that cures to form a polymer that may be decomposed by exposure to light. In one embodiment, a polymer with a doubly substituted carbon backbone is deposited on the substrate. After the template is brought into contact with the curable liquid, the curable liquid is exposed to radiation at a first wavelength $\lambda_1$ (e.g., greater than 400 nm) and radiation at the second wavelength $\lambda_2$ in the deep UV range. Radiation at the first wavelength serves to cure the curable liquid. When the curable liquid is exposed to the second wavelength $\lambda_2$, scission occurs at the substituted carbon atoms. Since deep UV radiation does not penetrate deeply into the curable liquid, the polymer decomposes only near the interface with the template. The decomposed surface of the cured liquid facilitates separation from the template. Other functional groups which facilitate the photo-decomposition of the polymer also can be used. U.S. Pat. No. 6,218,316 describes additional details concerning this process and is incorporated herein by reference.

Patterned Templates

In various embodiments, an imprint lithography template is manufactured using processes including, but not limited to: optical lithography, electron beam lithography, ion-beam lithography, x-ray lithography, extreme ultraviolet lithography, scanning probe lithography, focused ion beam milling, interferometric lithography, epitaxial growth, thin film deposition, chemical etch, plasma etch, ion milling, reactive ion etch or a combination of the above. Methods for making patterned templates are described in U.S. patent application Ser. No. 10/136,188 filed May 1, 2002 entitled "Methods of Manufacturing a Lithography Template" to Voison which is incorporated herein by reference.

In an embodiment, the imprint lithography template is substantially transparent to activating light. The template includes a body having a lower surface. The template further includes a plurality of recesses on the lower surface extending toward the top surface of the body. The recesses may be of any suitable size, although typically at least a portion of the recesses has a feature size of less than about 250 nm.

With respect to imprint lithography processes, the durability of the template and its release characteristics may be of concern. In one embodiment, a template is formed from quartz. Other materials may be used to form the template and include, but are not limited to: silicon germanium carbon, gallium nitride, silicon germanium, sapphire, gallium arsinide, epitaxial silicon, poly-silicon, gate oxide, silicon dioxide or combinations thereof. Templates may also include materials used to form detectable features, such as alignment markings. For example, detectable features may be formed of $SiO_x$, where X is less than 2. In some embodiments, X is about 1.5. In another example, detectable features may be formed of a molybdenum silicide. Both SiOx and molybdenum silicide are optically transparent to light used to cure the polymerizable liquid. Both materials, however, are substantially opaque to visible light. Use of these materials allows alignment marks to be created on the template that will not interfere with curing of the underlying substrate.

As previously mentioned, the template is treated with a surface treatment material to form a thin layer on the surface of the template. A surface treatment process is optimized to yield a low surface energy coating. Such a coating is used in preparing imprint templates for imprint lithography. Treated templates have desirable release characteristics relative to untreated templates. Untreated template surfaces possess surface free energies of about 65 dynes/cm or more. A treatment procedure disclosed herein yields a surface treatment layer that exhibits a high level of durability. Durability of the surface treatment layer allows a template to be used for numerous imprints without having to replace the surface treatment layer. The surface treatment layer, in some embodiments, reduces the surface free energy of the lower surface measured at 25° C. to less than about 40 dynes/cm, or in some cases, to less than about 20 dynes/cm.

A surface treatment layer, in one embodiment, is formed by the reaction product of an alkylsilane, a fluoroalkylsilane, or a fluoroalkyltrichlorosilane with water. This reaction forms a silinated coating layer on the surface of the patterned template. For example, a silinated surface treatment layer is formed from a reaction product of tridecafluoro-1,1,2,2-tetrahydrooctyl trichlorosilane with water. A surface treatment layer may be formed using either a liquid-phase process or a vapor-phase process. In a liquid-phase process, the substrate is immersed in a solution of precursor and solvent. In a vapor-phase process, a precursor is delivered via an inert carrier gas. It may be difficult to obtain a purely anhydrous solvent for use in a liquid-phase treatment. Water in the bulk phase during treatment may result in clump deposition, which will adversely affect the final quality or coverage of the coating. In an embodiment of a vapor-phase process, the template is placed in a vacuum chamber, after which the chamber is cycle-purged to remove excess water. Some adsorbed water, however, remains on the surface of the template. A small amount of water, however, is believed to be needed to initiate a surface reaction, which forms the coating. It is believed that the reaction may be described by the formula:

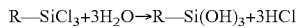
R—SiCl$_3$+3H$_2$O→R—Si(OH)$_3$+3HCl

To facilitate the reaction, the template is brought to a desired reaction temperature via a temperature-controlled chuck. The precursor is then fed into the reaction chamber for a prescribed time. Reaction parameters such as template temperature, precursor concentration, flow geometries, etc. are tailored to the specific precursor and template substrate combination. By controlling these conditions, the thickness of the surface treatment layer is controlled. The thickness of the surface treatment layer is kept at a minimal value to minimize the interference of the surface treatment layer with the feature size. In one embodiment, a monolayer of the surface treatment layer is formed.

Discontinuous Template

Figure 20A:
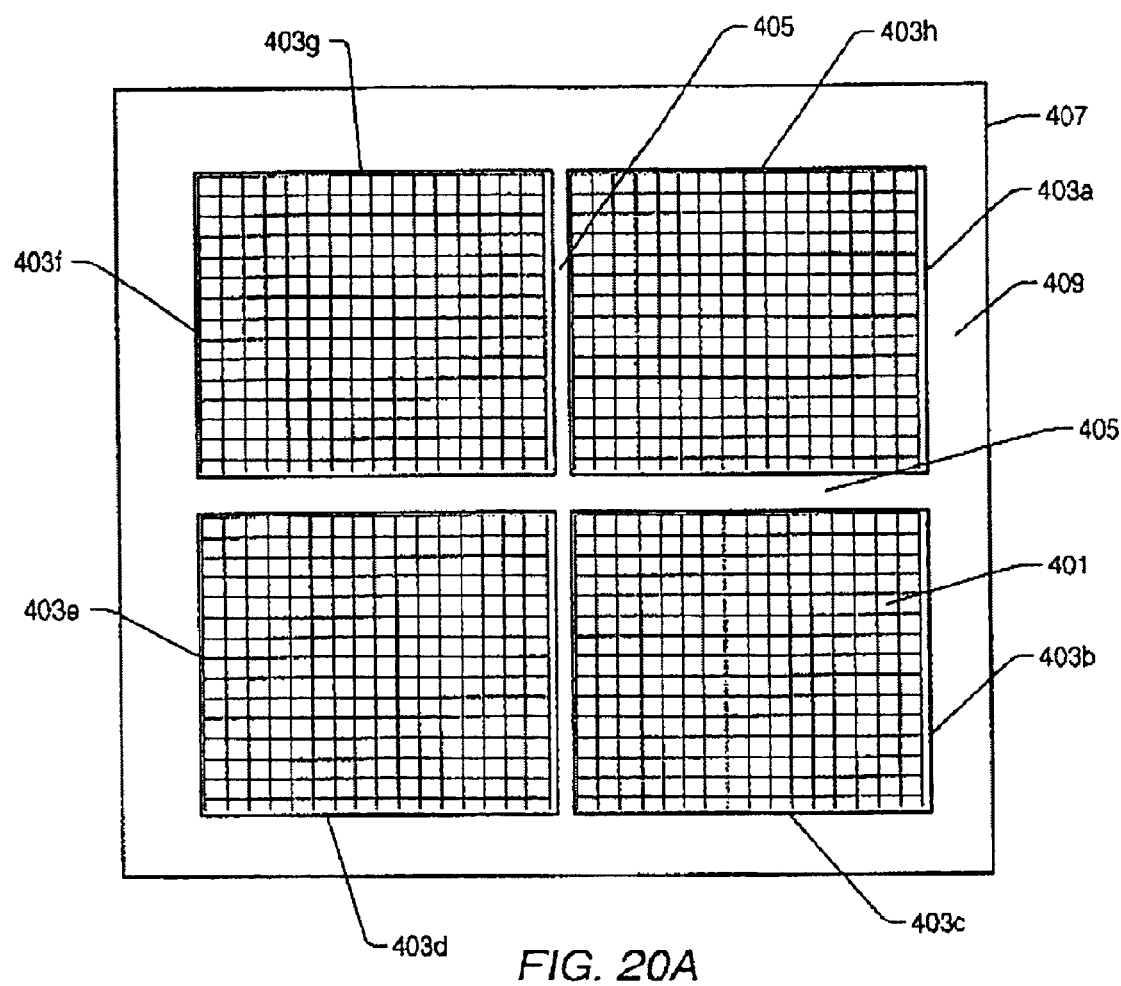
FIGS. 20 A–B depict top and cross-sectional views, respectively, of a template having a plurality of patterning areas.
Figure 20B:
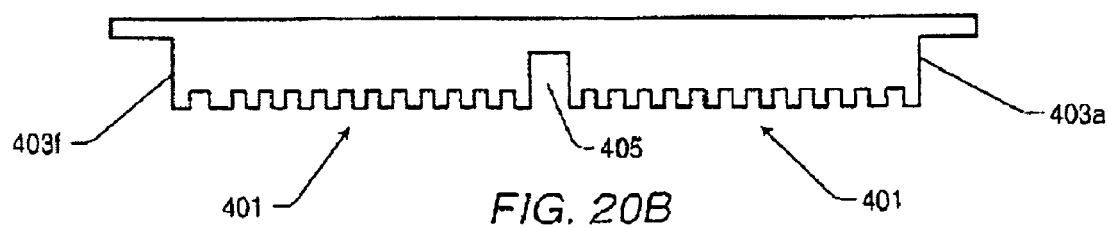

In an embodiment, there are at least two separate depths associated with the recess on the lower surface of the template. FIGS. 20A and 20B depict top and cross-sectional views, respectively, of a patterned template with recesses having two depths. Referring to FIGS. 20A and 20B, a template includes on or more patterning areas 401. In such embodiments, a first relatively shallow depth is associated with the recesses in patterning areas 401 of the template, as depicted in FIG. 20B. Patterning areas 401 include the area replicated during patterning of the template. Patterning areas 401 are positioned within a region defined by border 409 of the template. Border 409 is defined as the region that extends from an outer edge of any of the patterning areas 401 to an edge 407 of the template. The border 409 has a depth that is substantially greater than the depth of the recesses in patterning areas 401. The perimeter of the template it herein defined as the boundary between patterning areas 401 and border 409. As depicted in FIG. 20A four patterning areas 401 are positioned within the area defined by the template. Patterning areas 401 are separated from edges 407 of the template by border 409. The "perimeter" of the template is defined by edges 403a, 403b, 403c, 403d, 403e, 403f, 403g, and 403j of patterning areas 401.

Patterning areas 401 may be separated from each other by channel regions 405. Channel regions 405 are recesses that are positioned between patterning areas 401 that have a greater depth than the recesses of patterning areas 401. As described below, both border 409 and channel regions 405 inhibit the flow of liquid between patterning areas 401 or beyond the perimeter of patterning areas 401, respectively.

Figure 15:
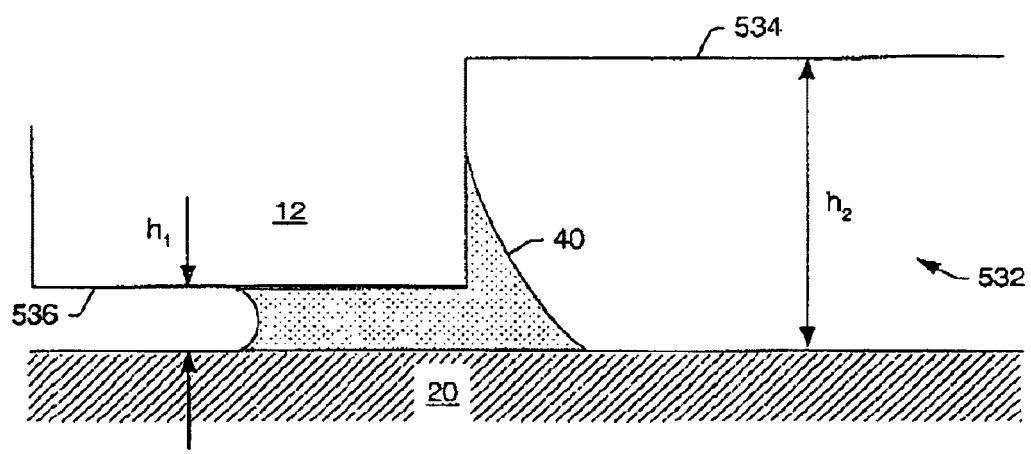
FIGS. 15 and 16 depict side views of an interface between a liquid droplet and a portion of a template.
Figure 16:
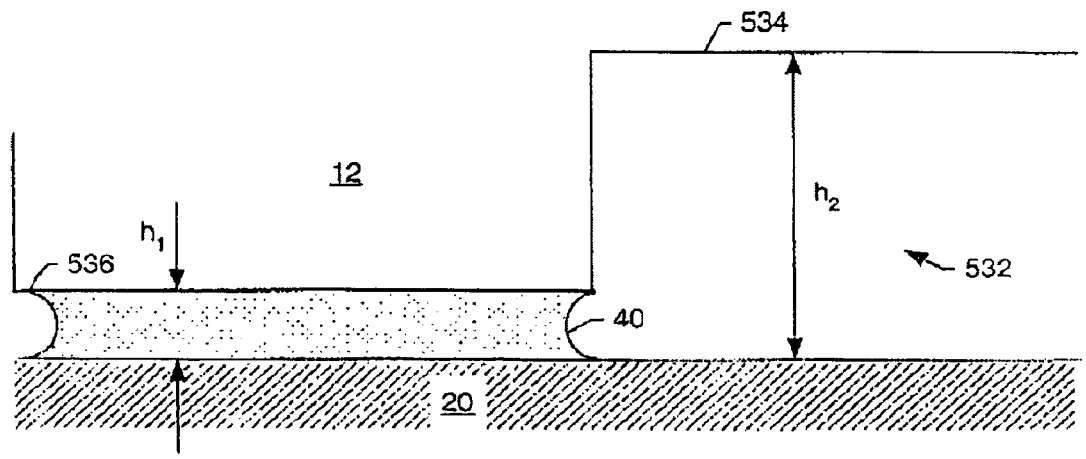

The design of the template is chosen based on the type of process used. For example, a template for positive imprint lithography has a design that favors the formation of discontinuous films on the substrate. In one embodiment, a template 12 is formed such that the depth of one or more structures is relatively large compared to the depth of structures used to form the patterning region, as depicted in FIG. 15. During use template 12 is placed in a desired spaced relationship to substrate 20. In such an embodiment, the gap (h$_1$) between the lower surface 536 of template 12 and substrate 20 is much smaller than the gap (h$_2$) between recessed surface 534 and substrate 20. For example, h$_1$ may be less than about 200 nm, while h$_2$ may be greater than about 10,000 nm. When template 12 is brought into contact with curable liquid 40 on substrate 20, curable liquid 40 leaves the region under recessed surface 534 and fills the gap between lower surface 536 and substrate 20, as depicted in FIG. 16. It is believed that combinations of surface energies and capillary forces draw curable liquid 40 from the larger recess into the narrower region. As h$_1$ is decreased forces applied to curable liquid 40 by template 12 may overcome capillary forces drawing curable liquid 40 under lower surface 536. These forces may cause spreading of curable liquid 40 into the area under recessed surface 534. The minimum value of h$_1$ at which curable liquid 40 is inhibited from spreading into a recess 532 is referred to herein as the "minimum film thickness." Additionally, as h$_1$ increases, the capillary forces are reduced, eventually allowing curable liquid 40 to spread into the deeper recessed regions. The maximum value of h$_1$ at which the capillary forces are sufficient to inhibit the flow of curable liquid 40 into the deeper recessed region is herein known as the "maximum film thickness."

Figure 17:
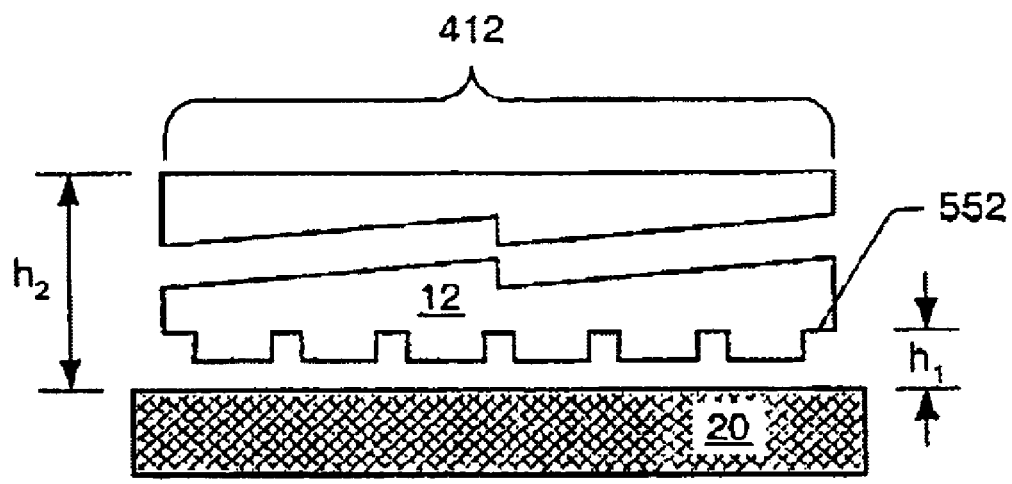
FIG. 17 depicts a cross-sectional view a first embodiment of template configured for liquid confinement at the perimeter of the template.
Figure 18:
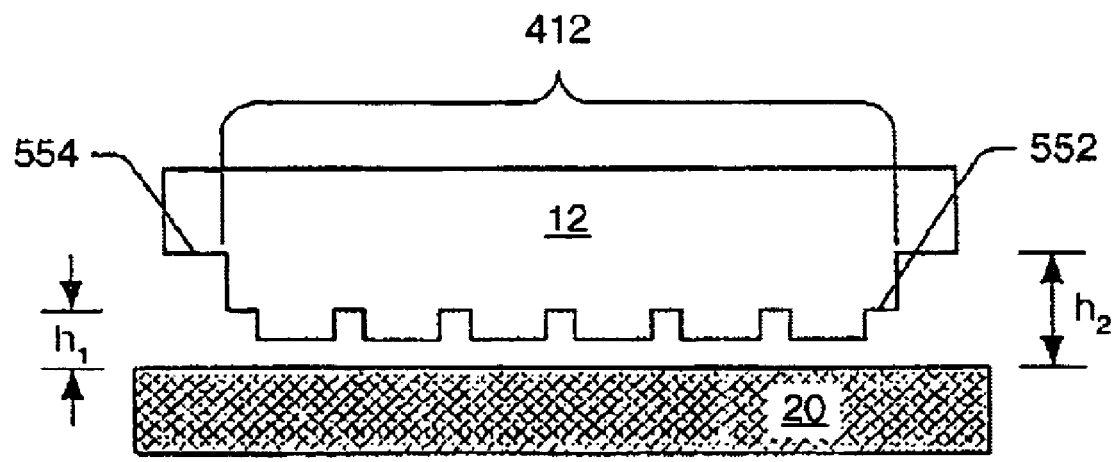
FIG. 18 depicts a cross-sectional view of a second embodiment of template configured for liquid confinement at the perimeter of the template.

As depicted in FIGS. 17 and 18, in various embodiments, template 12 is formed such that a curable liquid placed on substrate 20 is inhibited from flowing beyond perimeter 412 of template 12. In the embodiment depicted in FIG. 17, height h$_1$ is measured from substrate 20 to shallow recessed surface 552. Shallow recessed surface 552 extends to the perimeter of template 12. Thus, the edge of the template forms the height h$_2$ and is effectively infinite in comparison to height h$_1$. In the embodiment depicted in FIG. 18, a deep recess is formed at the outer edge of template 12. Height h$_2$ is measured between substrate 20 and deep recessed surface 554. Height h$_1$ is again measured between substrate 20 and shallow recessed surface 552. In either embodiment, height h$_2$ is much larger than height h$_1$. If h$_1$ is small enough, the activating light curable liquid remains in the gap between template 12 and substrate 20 while a curing agent is applied. Deeply recessed portions are particularly useful for liquid confinement in step and repeat processes as described herein.

In an embodiment, template 12 and substrate 20 each have one or more alignment marks. Alignment marks may be used to align template 12 and substrate 20. For example, one or more optical imaging devices (e.g., microscopes, cameras, imaging arrays, etc.) are used to determine alignment of the alignment marks.

In some embodiments, an alignment mark on the template may be substantially transparent to activating light. Alternatively, the alignment mark may be substantially opaque to alignment mark detection light. As used herein, alignment mark detection light and light used for other measurement and analysis purposes is referred to as "analyzing light". In an embodiment, analyzing light includes, but is not limited to, visible light and/or infrared light. The alignment mark may be formed of a material different than the material of the body. For example, the alignment mark may be formed from SiO$_x$, where x is about 1.5. In another example, the alignment mark may be formed of molybdenum suicide. Alternatively, the alignment mark may include a plurality of lines etched on a surface of the body. The lines are configured to substantially diffuse activating light, but produce an analyzable mark under analyzing light.

In various embodiments, one or more deep recesses as described above may project entirely through the body of the template to form openings in the template. An advantage of such openings is that they may effectively ensure that height h$_2$ is very large with respect to h$_1$ at each opening. Additionally, in some embodiments, pressurized gas or vacuum may be applied to the openings. Pressurized gas or vacuum may also be applied to one or more openings after curing the liquid. For example, pressurized gas may be applied after curing as part of a peel and pull process to assist in separating the template from the cured liquid.

Alternate System Embodiments

The above described imprint lithography system 3900 may be modified according to alternate embodiments discussed below. It should be understood that any of the described alternative embodiments may be combined, singly or in combination, with any other system described herein.

As described above, imprint head 3100 includes a fine orientation system 3111 that allows for a "passive" orientation of patterned template 3700 with respect to the substrate. In another embodiment, fine orientation system 3111 may include actuators 3134a, 3134b and 3134c coupled to flexure arms 3172, 3174, 3202 and 3204. Actuators 3134a, 3134b and 3134c may allow "active" control of fine orientation system 3111. During use an operator or a programmable controller monitors the orientation of patterned template 3700 with respect to the substrate. The operators or a programmable controller then alters the orientation of patterned template 3700 with respect to the substrate by operating actuators 3134a, 3134b and 3134c. Movement of actuators 3134a, 3134b and 3134c causes motion of flexure arms 3172, 3174, 3202 and 3204 to alter the orientation of patterned template 3700. In this manner an "active" control of fine positioning of the template with respect to the substrate may be achieved. An active fine orientation system is further described in U.S. Ser. No. 09/920,341 filed Aug. 1, 2001 entitled "Methods for High-Precision Gap Orientation Sensing Between a Transparent Template and Substrate for Imprint Lithography", which is incorporated herein by reference.

In an alternate embodiment, imprint head 3100 may include pre-calibration system 3190, as described above. Pre-calibration system 3109 includes flexure ring 3124, as depicted in FIG. 21. In place of fine orientation system 3100 as described above, template support system 3125 is coupled to pre-calibration ring. In contrast to fine orientation system 3100, template support system 3125 is formed of substantially rigid and non-compliant members 3127. These members provide a substantially rigid support for patterned template 3700 disposed in template support 3130. In this embodiment, fine orientation may be achieved using motion stage 3600 instead of template support 3130.

Figure 22:
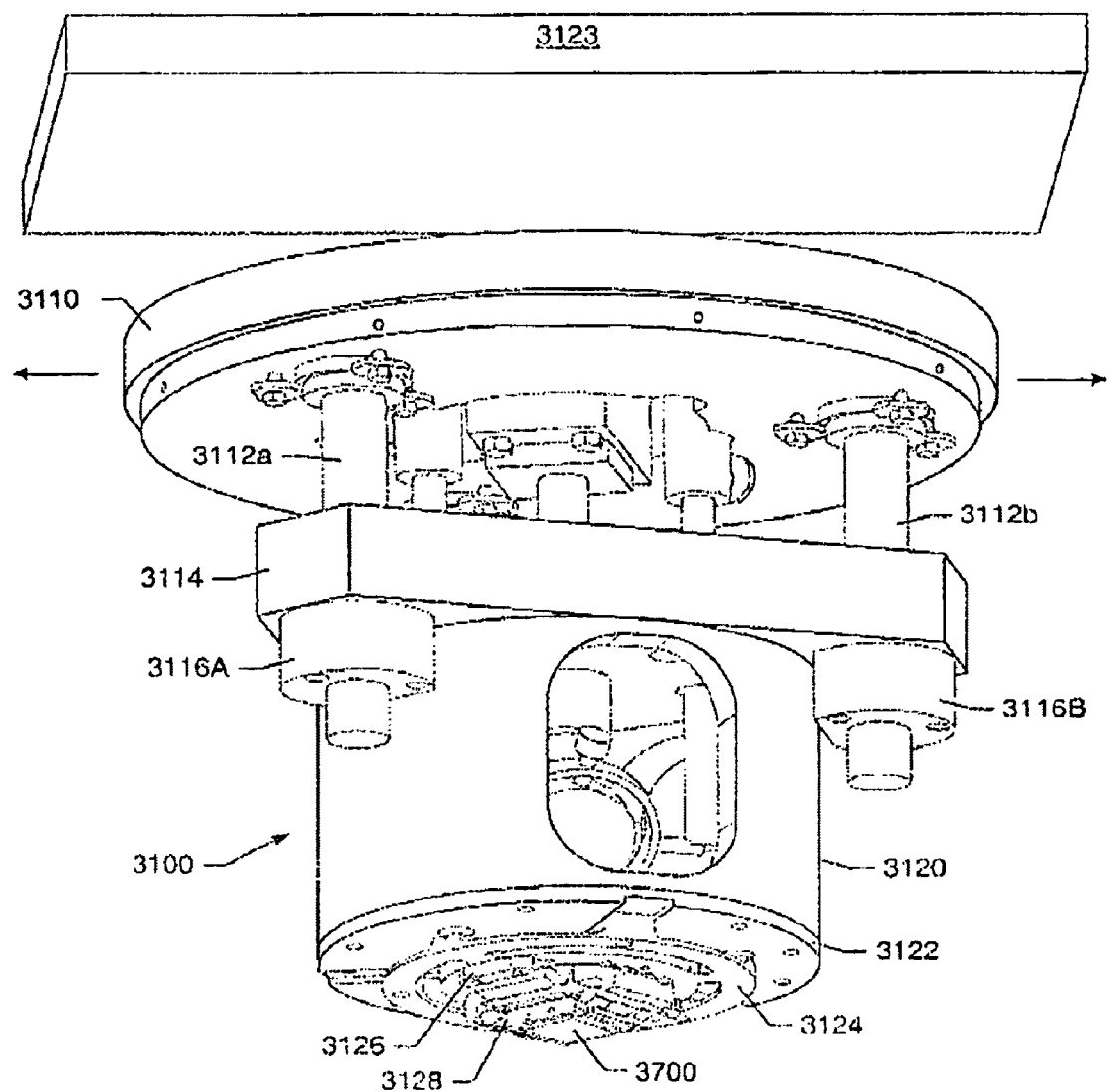
FIG. 22 depicts an imprint head coupled to an X-Y motion system.

In previous embodiments, imprint head 3100 is coupled to the body in a fixed position. In an alternate embodiment, imprint head 3100 may be mounted to a motion system that allows imprint head 3100 to be moved along the X-Y plane, as depicted in FIG. 22. Imprint head 3100 is configured to support patterned template 3700 as described in any of the embodiments herein. Imprint head 3100 is coupled to a motion system that includes an imprint head and imprint motion stage 3123. Imprint head 3100 is mounted to imprint head chuck 3110. Imprint head chuck 3110 interacts with imprint motion stage 3123 to move imprint head 3100 along an X-Y plane. Mechanical or electromagnetic motion systems may be used. Electromagnetic systems rely on the use of magnets to produce an X-Y planar motion in imprint head chuck 3110. Generally, an electromagnetic system incorporates permanent and electromagnetic magnets into imprint motion stage 3123 and imprint head chuck 3110. The attractive forces of these magnets is overcome by a cushion of air between imprint head chuck 3110 and imprint motion stage 3123 such that an "air bearing" is produced. Imprint head chuck 3110, and therefore the imprint head 3100, is moved along an X-Y plane on a cushion of air. Electromagnetic X-Y motion stages are described in further detail in U.S. Pat. No. 6,389,702 entitled "Method and Apparatus for Motion Control," which is incorporated herein by reference. In a mechanical motion system, imprint head chuck 3110 is attached to imprint motion stage 3123. Imprint motion stage 3123 is then moved by use of various mechanical means to alter the position of imprint head chuck 3110, and thus imprint head 3110, along the X-Y plane. In this embodiment, imprint head 3100 may include a passive compliant fine orientation system, an actuated fine orientation system, or a rigid template support system, as described herein.

Figure 40:
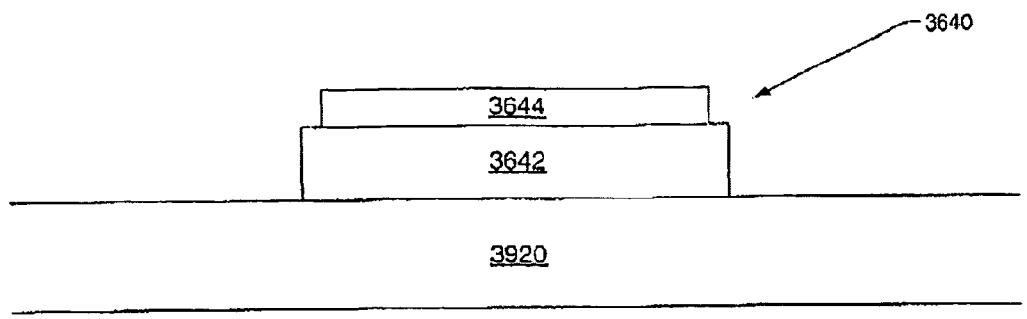
FIG. 40 depicts a schematic drawing of a substrate support.

With imprint head 3100 coupled to a moving support, the substrate may be mounted to a stationary support. Thus, in an alternate embodiment, imprint head 3100 is coupled to X-Y axis motion stage as described herein. A substrate is mounted to a substantially stationary substrate support. Stationary substrate support 3640 is depicted in FIG. 40. Stationary substrate support 3640 includes a base 3642 and a substrate chuck 3644. Substrate chuck 3644 is configured to support a substrate during imprint lithography processes. Substrate chuck 3644 may employ any suitable means to retain a substrate to substrate chuck 3644. In one embodiment, substrate chuck 3644 may include a vacuum system which applies to the substrate to couple the substrate to substrate chuck 3644. Substrate chuck 3644 is coupled to base 3642. Base 3642 is coupled to motion stage support 3920 of imprint lithography system 3900 (see FIG. 1). During use, stationary substrate support 3640 remains in a fixed position on motion stage support 3920 while imprint head 3100 position is varied to access different portions of the substrate.

Coupling an imprint head to a motion stage can offer advantages over techniques in which the substrate is on a motion stage. Motion stages generally rely on an air bearing to allow substantially frictionless motion of the motion stage. Generally, motion stages are not designed to accommodate significant pressure applied along the Z-axis. When pressure is applied to a motion stage chuck along the Z-axis, the motion stage chuck position will change slightly in response to this pressure. During a step and repeat process, a template that has a smaller area than the area of the substrate is used to form multiple imprinted areas. The substrate motion stage is relatively large compared to the template to accommodate the larger substrates. When a template contacts the substrate motion stage in a position that is off-center, the motion stage will tilt to accommodate the increased pressure. This tilt is compensated for by tilting the imprint head to ensure proper alignment. If however, the imprint head is coupled to the motion stage, all of the forces along the Z-axis will be centered on the template, regardless of where on the substrate the imprinting is taking place. This leads to increased ease in alignment and may also increase the throughput of the system.

Figure 38:
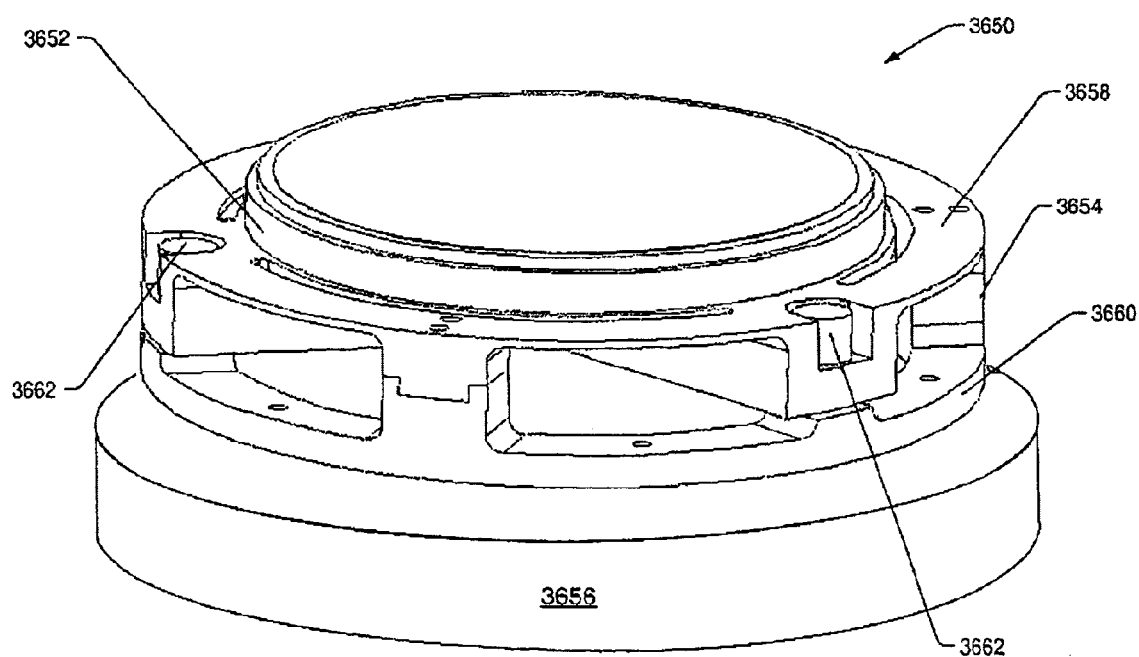
FIG. 38 depicts a motion stage that includes a fine orientation system.
Figure 39:
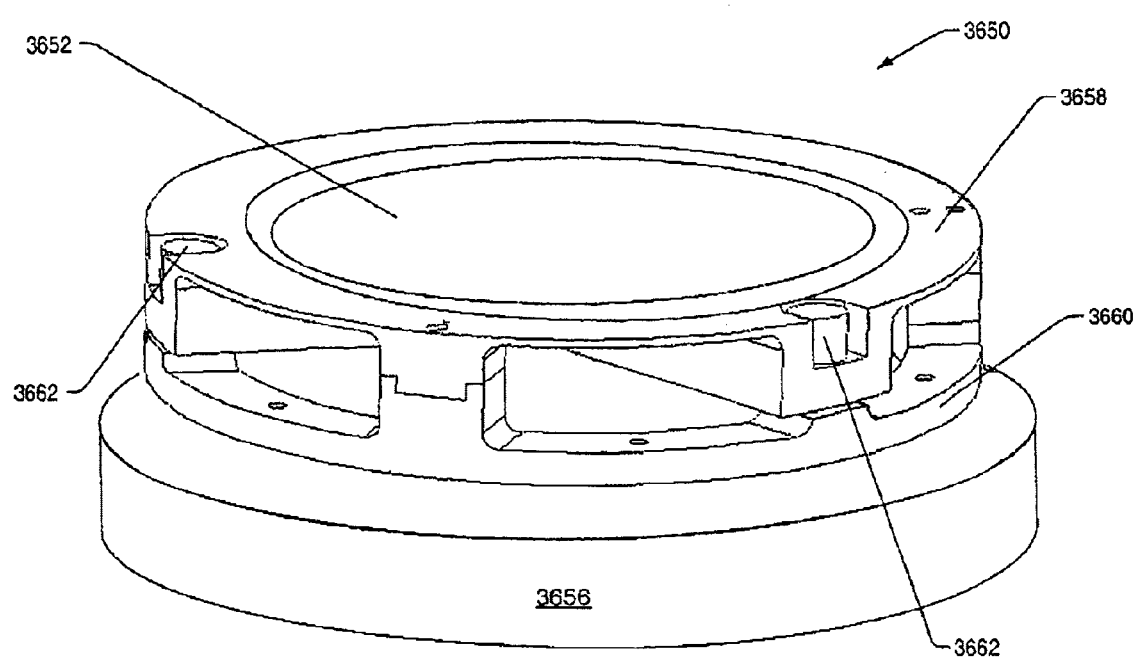
FIG. 39 depicts a motion stage having a substrate tilt module.

In an embodiment, a substrate tilt module 3654 may be formed in substrate support 3650, as depicted in FIG. 39. Substrate support 3650 includes a substrate chuck 3652, coupled to a substrate tilt module 3654 (see also FIG. 38). Substrate tilt module 3654 is coupled to a base 3656. Base 3656, in one embodiment, is coupled to a motion stage which allows X-Y motion of substrate support 3650. Alternatively, base 3656 is coupled to a support (e.g., 3920) such that substrate support 3650 is mounted to imprint lithography system 3900 in a fixed position.

Substrate chuck 3652 may employ any suitable means to retain a substrate to substrate chuck 3652. In one embodiment, substrate chuck 3652 may include a vacuum system which applies a vacuum to the substrate to couple the substrate to substrate chuck 3652. Substrate tilt module 3654 includes a flexure ring 3658 coupled to flexure ring support 3660. A plurality of actuators 3662 are coupled to flexure ring 3658 and flexure ring support 3660. Actuators 3662 are operated to alter the tilt of flexure ring 3658. Actuators 3662, in one embodiment, use a differential gear mechanism that may be manually or automatically operated. In an alternate embodiment, actuators 3662 use an eccentric roller mechanism. An eccentric roller mechanism generally provides more vertical stiffness to substrate support 3650 than a differential gear system. In one embodiment, substrate tilt module 3654 has a stiffness that will inhibit tilt of the substrate when the template applies a force of between about 1 lb. to about 10 lbs. to a liquid disposed on the substrate. Specifically, substrate tilt module 3654 is configured to allow no more than 5 micro radians of tilt when pressure up to about 10 lbs. is applied to the substrate through the liquid on the template.

During use sensors coupled to substrate chuck 3652 may be used to determine the tilt of the substrate. The tilt of the substrate is adjusted by actuators 3662. In this manner tilt correction of the substrate may be achieved.

Substrate tilt module 3654 may also include a fine orientation system. A substrate support that includes a fine orientation system is depicted in FIG. 42. To achieve fine orientation control, flexure ring 3658 includes a central recess in which substrate chuck 3652 is disposed. The depth of the central recess is such that an upper surface of a substrate disposed on substrate chuck 3652 is substantially even with an upper surface of flexure ring 3658. Fine orientation may be achieved using actuators 3662 capable of controlled motion in the nanometer range. Alternatively, fine orientation may be achieved in a passive manner. Actuators 3662 may be substantially compliant. The compliance of actuators 3662 may allow the substrate to self-correct for variations in tilt when a template is in contact with a liquid disposed on a substrate surface. By disposing the substrate in a position that is substantially even with flexure ring 3658, fine orientation may be achieved at the substrate-liquid interface during use. Compliance of actuators 3662 is thus transferred to the upper surface of the substrate to allow fine orientation of the substrate.

Figure 41:
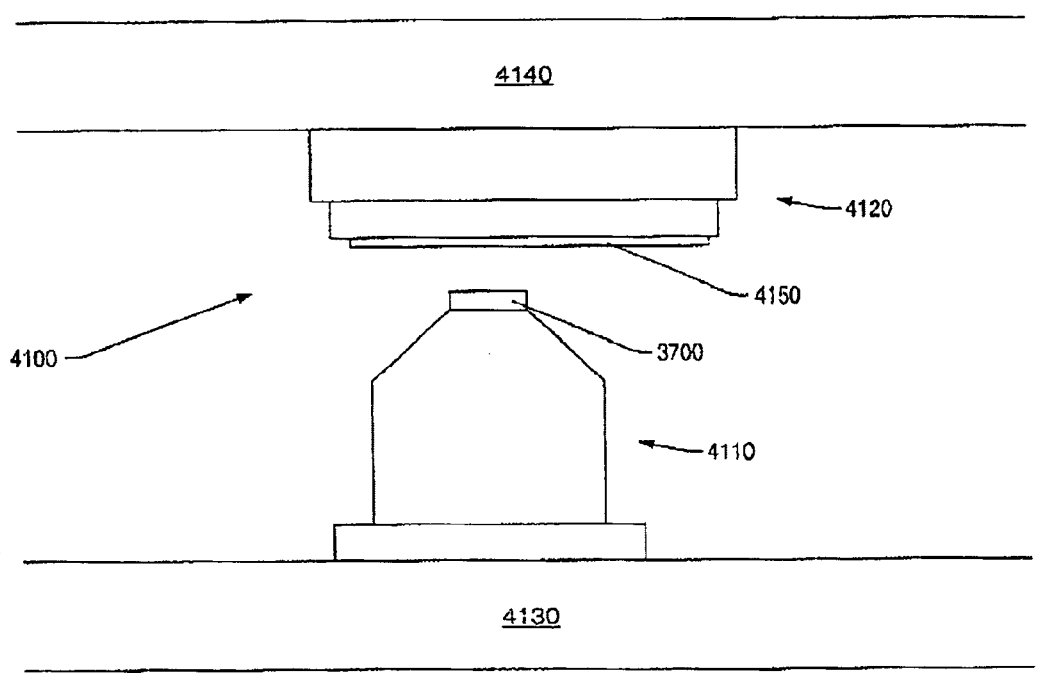
FIG. 41 depicts a schematic drawing of an imprint lithography system that includes an imprint head disposed below a substrate support.

The above-described systems are generally configured to systems in which an activating light curable liquid is dispensed onto a substrate and the substrate and template are brought into proximity to each other. It should be understood, however, that the above-described systems may be modified to allow an activating light curable liquid to be applied to a template rather than the substrate. In such an embodiment, the template is placed below the substrate. FIG. 41 depicts a schematic drawing of an embodiment of a system 4100 that is configured such that the template is positioned below a substrate. System 4100 includes an imprint head 4110 and a substrate 4120 positioned above imprint head 4110. Imprint head 4110 is configured to hold patterned template 3700. Imprint head 4110 may have a similar design to any of the herein described imprint heads. For example, imprint head 4110 may include a fine orientation system as described herein. Imprint head 4110 may be coupled to an imprint head 4130. Imprint head 4110 may be coupled in a fixed position and remain substantially motionless during use. Alternatively, imprint head 4110 may be placed on a motion stage that allows X-Y planar motion of imprint head 4110 during use.

The substrate to be imprinted is mounted onto a substrate support 4120. Substrate support 4120 has a similar design to any of the herein described substrate supports. For example, substrate support 4120 may include a fine orientation system as described herein. Substrate support 4120 may be coupled to a support 4140 in a fixed position and remain substantially motionless during use. Alternatively, substrate support 4120 may be placed on a motion stage that allows X-Y planar motion of substrate support during use.

During use an activating light curable liquid is placed on patterned template 3700 disposed in imprint head 4110. The template may be patterned or planar, depending on the type of operation to be performed. Patterned templates may be configured for use in positive, negative, or combinations of positive and negative imprint lithography systems as described herein.

IMPRINT LITHOGRAPHY PROCESSES

Negative Imprint Lithography Process

Figure 23A:
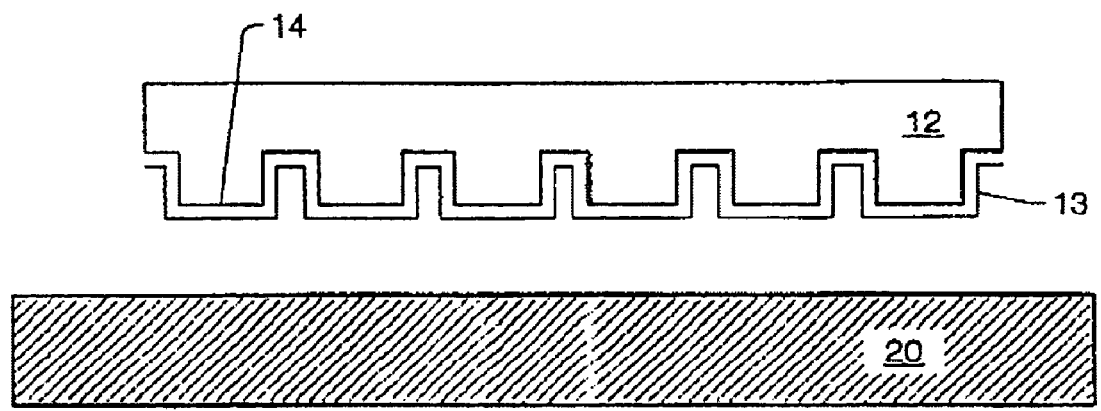
FIGS. 23A–23F depict cross-sectional views of a negative imprint lithography process.

A typical imprint lithography process is shown in FIGS. 23A–23F. As depicted in FIG. 23A, template 12 is positioned in a spaced relation to substrate 20 such that a gap is formed between template 12 and substrate 20. Template 12 may include a surface that defines one or more desired features, which may be transferred to substrate 20 during patterning. As used herein, a "feature size" generally refers to a width, length and/or depth of one of the desired features. In various embodiments, the desired features may be defined on the surface of template 12 as recesses and or a conductive pattern formed on a surface of template 12. Surface 14 of template 12 may be treated with a thin surface treatment layer 13 that lowers template 12 surface energy and assists in separation of template 12 from substrate 20. Surface treatment layers for templates are described herein.

Figure 23B:
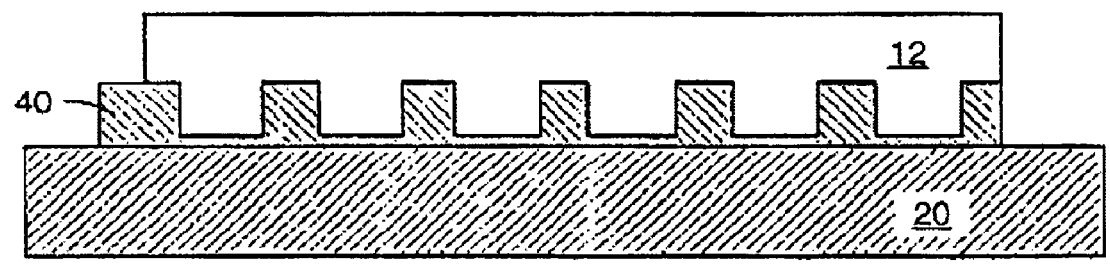
Figure 24A:
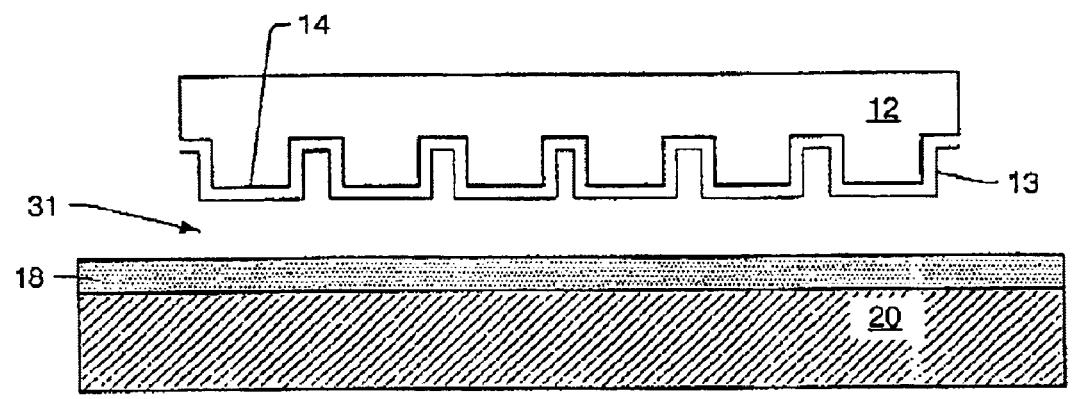
FIGS. 24A–24D depict cross-sectional views of a negative imprint lithography process with a transfer layer.

In an embodiment, curable liquid 40 may be dispensed upon substrate 20 prior to moving template 12 into a desired position relative to substrate 20. Curable liquid 40 may be a curable liquid that conforms to the shape of desired features of template 12. In an embodiment, curable liquid 40 is a low viscosity liquid that at least partially fills the space of gap 31 without the use of high temperatures, as depicted in FIG. 24A. Low viscosity liquids may also allow gap 31 between template 12 and substrate 20 to be closed without requiring high pressures. As used herein, the term "low viscosity liquids" refer to liquids having a viscosity of less than 30 centipoise measured at about 25° C. Further details regarding appropriate selections for curable liquid 40 are discussed below. Template 12 may interact with curable liquid 40 to conform curable liquid 40 into a desired shape. For example, curable liquid 40 may conform to the shape of template 12, as depicted in FIG. 23B. The position of template 12 may be adjusted to create a desired gap distance between template 12 and substrate 20. The position of template 12 may also be adjusted to properly align template 12 with substrate 20.

Figure 23C:
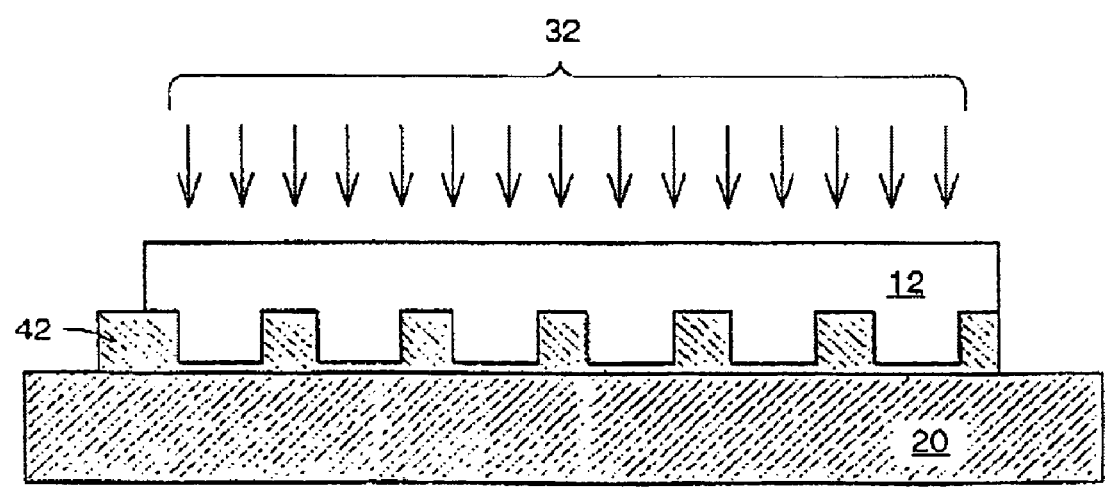
Figure 23D:
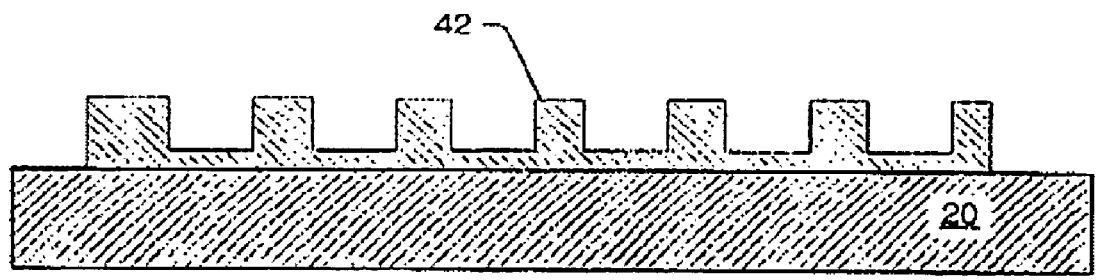

After template 12 is properly positioned curable liquid 40 is cured to form a masking layer 42 on substrate 20. In an embodiment, curable liquid 40 is cured using activating light 32 to form masking layer 42. Application of activating light 32 through template 12 to cure curable liquid 40 is depicted, as depicted in FIG. 23C. After curable liquid 40 is substantially cured, template 12 is removed from masking layer 42, leaving the cured masking layer 42 on the surface of substrate 20, as depicted in FIG. 23D. Masking layer 42 has a pattern that is complementary to the pattern of template 12. Masking layer 42 may include a "base layer" (also called a "residual layer") between one or more desired features. The separation of template 12 from masking layer 42 is done so that desired features remain intact without shearing or tearing from the surface of substrate 20. Further details regarding separation of template 12 from substrate 20 following imprinting are discussed below.

Masking layer 42 may be used in a variety of ways. For example, in some embodiments, masking layer 42 may be a functional layer. In such embodiments, curable liquid 40 may be curable to form a conductive layer, a semiconductive layer, a dielectric layer and/or a layer having a desired mechanical or optical property. In another embodiment, masking layer 42 may be used to cover portions of substrate 20 during further processing of substrate 20. For example, masking layer 42 may be used during a material deposition process to inhibit deposition of the material on certain portions of the substrate. Similarly, masking layer 42 may be used as a mask for etching substrate 20. To simplify further discussion of masking layer 42, only its use as a mask for an etching process will be discussed in embodiments described below. However, it is recognized that masking layers in embodiments described herein may be used in a variety of processes as previously described.

Figure 23E:
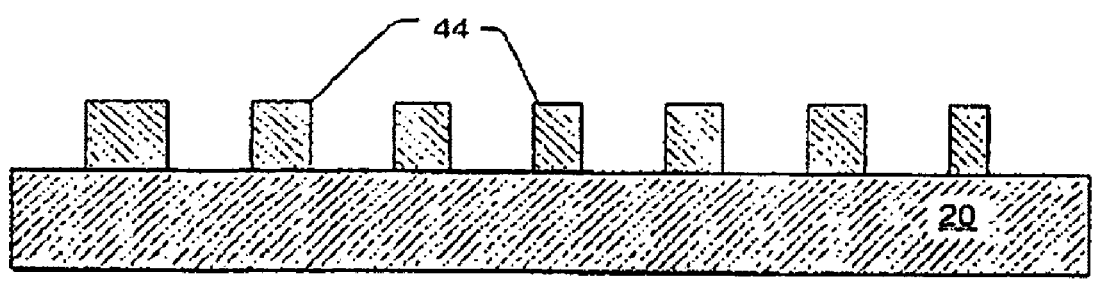
Figure 23F:
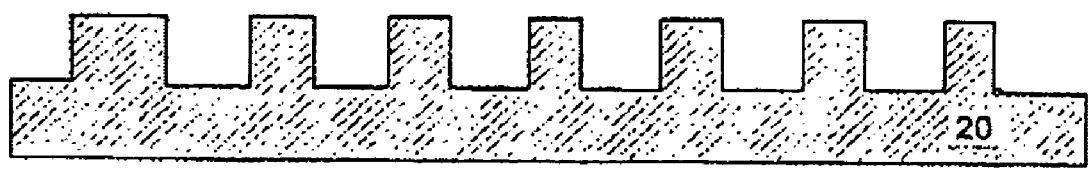

For use in an etch process, masking layer 42 may be etched using an etch process until portions of substrate 20 are exposed through masking layer 42, as depicted in FIG. 23E. That is, portions of the base layer may be etched away. Portions 44 of masking layer 42 may remain on substrate 20 for use in inhibiting etching of portions of substrate 20. After etching of masking layer 42 is complete, substrate 20 may be etched using known etching processes. Portions of substrate 20 disposed under portions 44 of masking layer 42 may remain substantially unetched while the exposed portions of substrate 20 are etched. In this manner, a pattern corresponding to the pattern of template 12 may be transferred to substrate 20. The remaining portions 44 of masking layer 42 may be removed leaving a patterned substrate 20, depicted in FIG. 23F.

FIGS. 24A–24D illustrate an embodiment of an imprint lithography process using a transfer layer. A transfer layer 18 may be formed upon an upper surface of substrate 20. Transfer layer 18 may be formed from a material that has difference etch characteristics than underlying substrate 20 and/or masking layer 42 formed from curable liquid 40. That is, each layer (e.g., transfer layer 18, masking layer 42 and/or substrate 20) may be etched at least somewhat selectively with respect to the other layers.

Figure 24B:
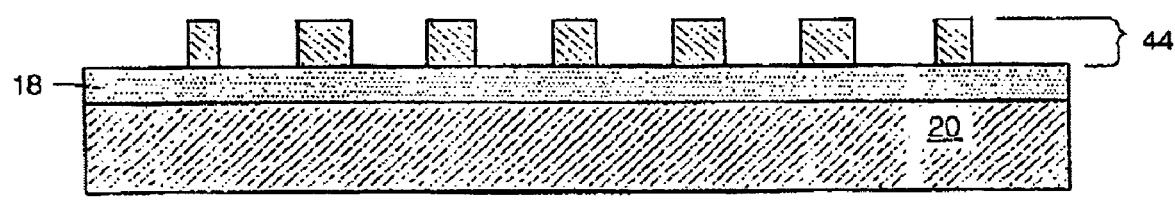

Masking layer 4442 is formed on the surface of transfer layer 18 by depositing a curable liquid on the surface of transfer layer 18 and curing masking layer 42, as depicted in FIGS. 23A–23C. Masking layer 42 may be used as a mask for etching transfer layer 18. Masking layer 42 is etched using an etch process until portions of transfer layer 18 are exposed through masking layer 42, as depicted in FIG. 24B. Portions 44 of masking layer 42 remain on transfer layer 18 and may be used to inhibit etching portions of transfer layer 18. After etching of masking layer 42 is complete, transfer layer 18 may be etched using known etching processes. Portions of transfer layer 18 disposed under portions 44 of masking layer 42 may remain substantially unetched while the exposed portions of transfer layer 18 are etched. In this manner, the pattern of masking layer 42 is replicated in transfer layer 18.

Figure 24C:
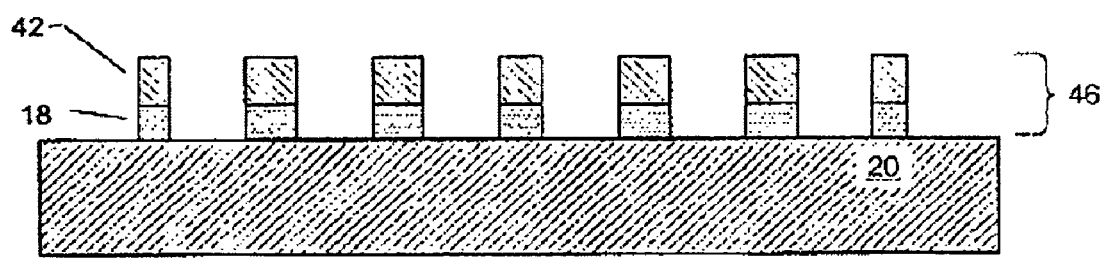
Figure 24D:
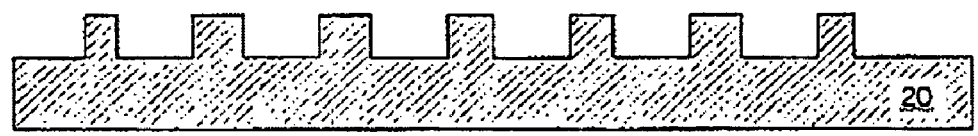

In FIG. 24C, portions 44 and etched portions of transfer layer 18 together form a masking stack 46 that may be used to inhibit etching of portions 44 of underlying substrate 20. Etching of substrate 20 may be performed using a known etch process (e.g., a plasma etching process, a reactive ion etching process, etc.). As depicted in FIG. 24D, masking layer 46 may inhibit etching of the underlying portions of substrate 20. Etching of the exposed portions of substrate 20 may be continued until a predetermined depth is reached. An advantage of using masking stack 46 as a mask for etching of substrate 20 is that the combined stack of layers may create a high aspect ratio mask (i.e., a mask that has a greater height than width). A high aspect ratio masking layer may be desirable during the etching process to inhibit undercutting of mask portions 44.

The processes depicted in FIGS. 23A–23F and FIGS. 24A–24D are examples of negative imprint lithography processes. As used herein a "negative imprint lithography" process generally refers to a process in which the curable liquid is substantially conformed to the shape of the template before curing. That is, a negative image of the template is formed in the cured liquid. As depicted in these figures, the non-recessed portions of the template become the recessed portions of the mask layer. The template, therefore, is designed to have a pattern that represents a negative image of the pattern to be imparted to the mask layer.

Positive Imprint Lithography

As used herein a "positive imprint lithography" process generally refers to a process in which the pattern formed in the mask layer is a mirror image of the pattern of the template. As will be further described below, the non-recessed portions of the template become the non-recessed portions of the mask layer.

Figure 25A:
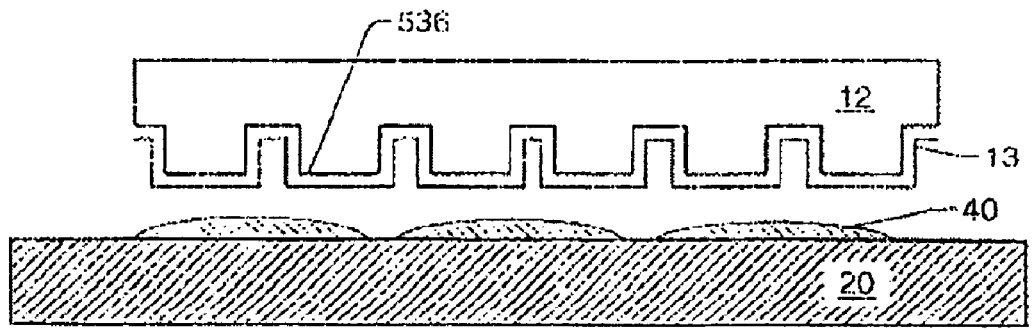
FIGS. 25A–25D depict cross-sectional views of a positive imprint lithography process.

A typical positive imprint lithography process is shown in FIGS. 25A–25D. As depicted in FIG. 25A, template 12 is positioned in a spaced relation to substrate 20 such that a gap is formed between template 12 and substrate 20. Surface of template 12 may be treated with a thin surface treatment layer 13 that lowers template 12 surface energy and assists in separation of template 12 from cured masking layer 42.

Figure 25B:
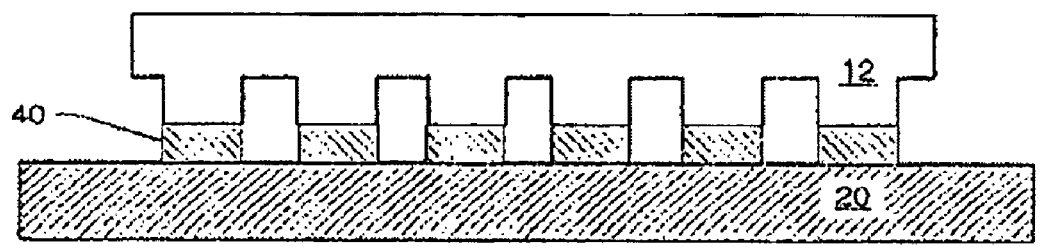
Figure 25C:
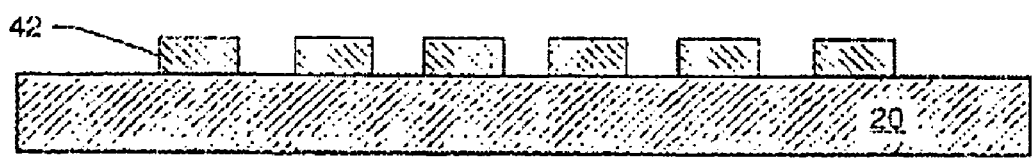

Curable liquid 40 is disposed on the surface of substrate 20. Template 12 is brought into contact with curable liquid 40. As depicted in FIG. 25B, curable liquid 40 fills the gap between the lower surface of template 12 and substrate 20. In contrast to a negative imprint lithography process, curable liquid 40 is substantially absent from regions of substrate 20 approximately below at least a portion of the recesses of template 12. Thus, curable liquid 40 is maintained as a discontinuous film on substrate 20 that is defined by the location of at least a portion of the recesses of template 12. After template 12 is properly positioned, curable liquid 40 is cured to form masking layer 42 on substrate 20. Template 12 is removed from masking layer 42, leaving cured masking layer 42, on the surface of substrate 20, as depicted in FIG. 25C. Masking layer 42 has a pattern that is complementary to the pattern of template 12.

Figure 25D:

Masking layer 42 may be used to inhibit etching of portions of substrate 20. After formation of masking layer 42 is complete, substrate 20 may be etched using known etching processes. Portions of substrate 20 disposed under masking layer 42 may remain substantially unetched while the exposed portions of substrate 20 are etched, as depicted in FIG. 25D. In this manner, the pattern of template 12 may be replicated in substrate 20. The remaining portions 44 of masking layer 42 may be removed to create patterned substrate 20.

Figure 26A:
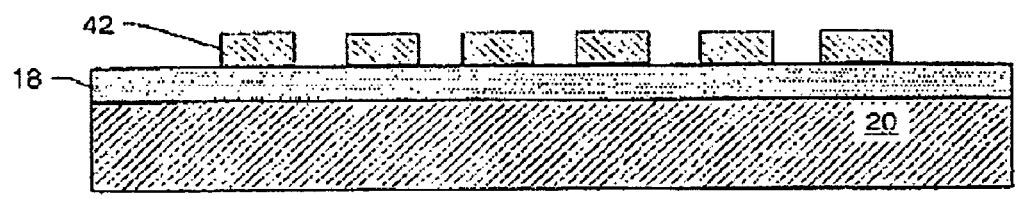
FIGS. 26A–26C depict cross-sectional views of a positive imprint lithography process with a transfer layer.
Figure 26B:
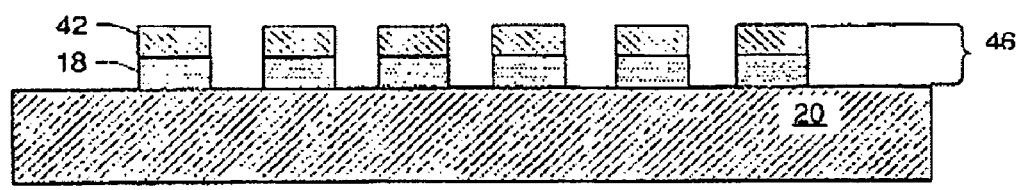
Figure 26C:

FIGS. 26A–26C illustrate an embodiment of a positive imprint lithography process using a transfer layer 18. Transfer layer 18 may be formed upon an upper surface of a substrate 20. Transfer layer 18 is formed from a material that has different etch characteristics than the underlying transfer layer 18 and/or substrate 20. Masking layer 42 is formed on the surface of transfer layer 18 by depositing a curable liquid on the surface of transfer layer 18 and curing the masking layer 42, as depicted in FIGS. 25A–25C.

Masking layer 42 may be used as a mask for etching transfer layer 18. Masking layer 42 may inhibit etching of portions of transfer layer 18. Transfer layer 18 may be etched using known etching processes. Portions of transfer layer 18, disposed under masking layer 42, may remain substantially unetched while the exposed portions of transfer layer 18 are etched. In this manner, the pattern of masking layer 42 may be replicated in transfer layer 18.

In FIG. 26B, masking layer 42 and etched portions of transfer layer 18 together form masking stack 46 that may be used to inhibit etching portions of the underlying substrate 20. Etching of substrate 20 may be performed using known etching processes (e.g., a plasma etching process, a reactive ion etching process, etc.). As depicted in FIG. 26C, the masking stack may inhibit etching of the underlying portions of substrate 20. Etching of the exposed portions of substrate 20 may be continued until a predetermined depth is reached.

Positive/Negative Imprint Lithography

Figure 27A:
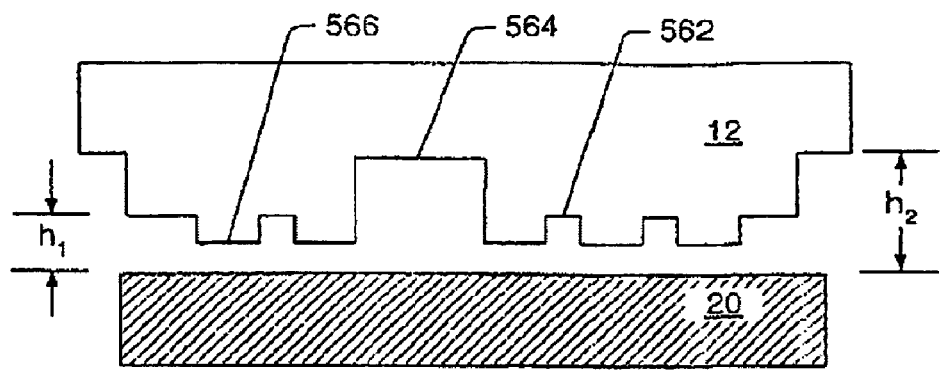
FIGS. 27A–27D depict cross-sectional views of a combined positive and negative imprint lithography process.

In an embodiment, a process may combine positive and negative imprint lithography. A template for a combined positive and negative imprint lithography process may include recesses suitable for positive lithography and recesses suitable for negative lithography. For example, an embodiment of a template for combined positive and negative imprint lithography is depicted in FIG. 27A. Template 12, as depicted in FIG. 27A, includes a lower surface 566, at least one first recess 562, and at least one second recess 564. First recess 562 is configured to create a discontinuous portion of curable liquid 40 when template 12 contacts curable liquid 40. A height of first recess ($h_2$) is substantially greater than a height of second recess ($h_1$).

A typical combined imprint lithography process is shown in FIGS. 27A–27D. As depicted in FIG. 27A, template 12 is positioned in a spaced relation to substrate 20 such that a gap is formed between template 12 and substrate 20. At least lower surface 566 of template 12 may be treated with a thin surface treatment layer (not shown) that lowers template 12 surface energy and assists in separation of template 12 from cured masking layer 42. Additionally, surfaces of first recesses 562 and/or second recesses 564 may be treated with the thin surface treatment layer.

Figure 27B:
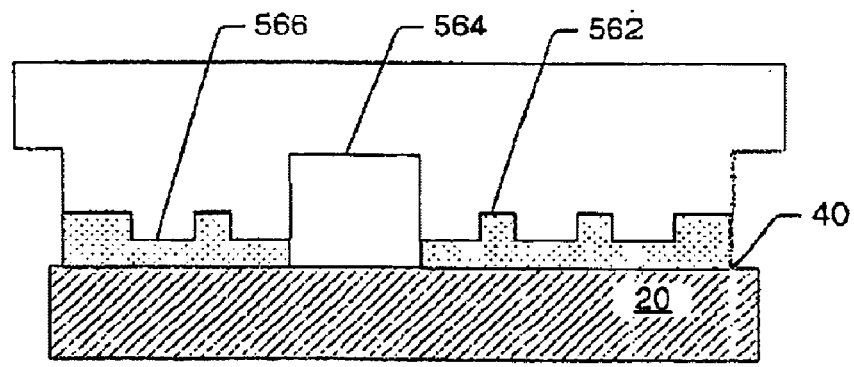
Figure 27C:
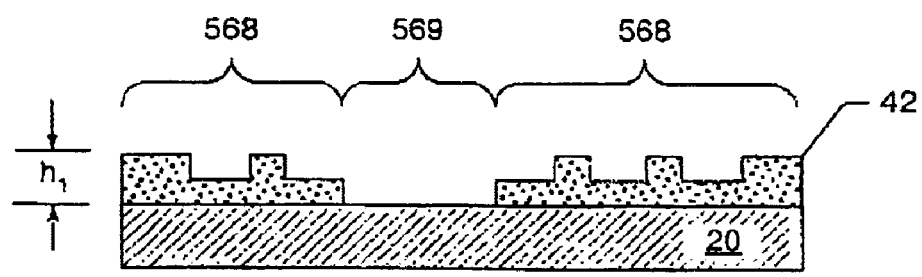

Curable liquid 40 is disposed on the surface of substrate 20. Template 12 is brought into contact with curable liquid 40. As depicted in FIG. 27B, curable liquid 40 fills the gap between lower surface 566 of the template 12 and substrate 20. Curable liquid 40 also fills first recesses 562. However, curable liquid 40 is substantially absent from regions of substrate 20 approximately below second recesses 564. Thus, curable liquid 40 is maintained as a discontinuous film on substrate 20 that includes surface topography corresponding to the pattern formed by first recesses 562. After template 12 is properly positioned, curable liquid 40 is cured to form a masking layer 42 on substrate 20. Template 12 is removed from masking layer 42, leaving cured masking layer 42 on the surface of substrate 20, as depicted in FIG. 27C. Masking layer 42 may include a patterned region 568 that resembles a mask layer formed by negative imprint lithography. In addition masking layer 42 may include a channel region 569 that does not include any masking material.

Figure 27D:
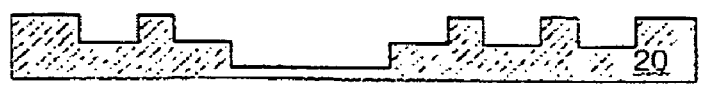

In one embodiment, masking layer 42 is composed of a material that has the same or a similar etch rate as underlying substrate 20. An etch process is applied to masking layer 42 to remove masking layer 42 and substrate 20 at substantially the same etch rate. In this manner the multiplayer pattern of template 12 may be transferred to substrate 20, as depicted in FIG. 27D. This process may also be performed using a transfer layer 18 in other embodiments.

A combination of positive and negative lithography is also useful for patterning multiple regions of template 12. For example, substrate 20 may include a plurality of regions that require patterning. As depicted in FIG. 27C, template 12 with multiple depth recesses includes two patterning regions 568 with an intervening "channel" region 569. Channel region 569 inhibits flow of a liquid beyond the patterning area of template 12.

Step and Repeat

As used herein, a "step and repeat" process refers to using a template smaller than the substrate to form a plurality of patterned regions on the substrate. A step and repeat imprint process includes depositing a light curable liquid on a portion of a substrate, aligning a pattern in the cured liquid to previous patterns on the substrate, impressing a template into the liquid, curing the liquid, and separating the template from the cured liquid. Separating the template from the substrate may leave an image of the topography of the template in the cured liquid. Since the template is smaller than the total surface area of the substrate, only a portion of the substrate includes the patterned cured liquid. The "repeat" portion of the process includes depositing a light curable liquid on a different portion of the substrate. A patterned template is then aligned with the substrate and contacted with the curable liquid. The curable liquid is cured using activating light to form a second area of cured liquid. This process may be continually repeated until most of the substrate is patterned. Step and repeat processes may be used with positive, negative, or positive/negative imprint processes. Step and repeat processes may be performed with any embodiments of equipment described herein.

Step and repeat imprint lithography processes offer a number of advantages over other techniques. Step and repeat processes described herein are based on imprint lithography that uses low viscosity light curable liquids and rigid, transparent templates. The templates are transparent to liquid activating light and alignment mark detection light thus offering the potential for layer-to-layer alignment. For production-scale imprint lithography of multi-level devices, it is advantageous to possess very high-resolution layer-to-layer alignment (e.g., as low as ⅓ of the minimum feature size ("MFS")).

There are various sources of distortion errors in the making of the templates. Step and repeat processes are used so that only a portion of a substrate is processed during any given step. The size of the field processed during each step should be small enough to possess pattern distortions of less than ⅓ the MFS. This necessitates step and repeat patterning in high-resolution imprint lithography. This is also the reason why most optical lithography tools are step and repeat systems. Also as discusses before, a need for low CD variations and defect inspection/repair favors processing of small fields.

In order to keep process costs low, it is important for lithography equipment to possess sufficiently high throughput. Throughput requirements put a stringent limit on the patterning time allowed per field. Low viscosity liquids that are light curable are attractive from a throughput point of view. These liquids move much faster to properly fill the gap between the template and the substrate, and the lithography capability is pattern independent. The resulting low pressure, room temperature processing is suitable for high throughput, while retaining the benefits of layer-to-layer alignment.

While prior inventions have addressed patterning of low viscosity light curable liquids, they have not addressed this for a step and repeat process. In photolithography, as well as in hot embossing, a film is spin coated and hard baked onto the substrate prior to its patterning. If such an approach is used with low viscosity liquids, there are three major problems. Low viscosity liquids are difficult to spin coat since they tend to de-wet and cannot retain the form of a continuous film. Also in a step and repeat process, the liquid undergoes evaporation, thereby causing varying amounts of liquid to be left behind on the substrate as the template steps and repeats over the substrate. Finally, a blanket light exposure tends to disperse beyond the specific field being patterned. This tends to cause partial curing of the subsequent field, thereby affecting the fluid properties of the liquid prior to imprinting. An approach that dispense liquid suitable for a single field onto the substrate, one field at a time, may solve the above three problems.

In general, lithography is one of many unit processes used in the production of devices. The cost of all of these processes, particularly in multi-layer devices, makes it highly desirable to place patterned regions as close as possible to each other without interfering with subsequent patterns. This effectively maximizes the usable area and hence the usage of the substrate. Also, imprint lithography may be used in a "mix-and-match" mode with other kinds of lithography, such as optical lithography, wherein different levels of the same device are made from different lithography technologies. It is advantageous to make the imprint lithography process compatible with other lithography techniques. A "kerf" region separates two adjacent fields on a substrate. In state-of-the-art optical lithography tools this kerf region may be as small as 50–100 microns. The size of the kerf is typically limited by the size of the blades used to separate the patterned regions. This small kerf region is expected to get smaller as the blades that dice the individual chips get thinner. In order to accommodate this stringent kerf size requirement, the location of any excess liquid that is expelled from the patterned area should be well confined and repeatable. As such, the individual components, including the template, substrate, liquid and any other materials that affect the physical properties of the system, including, but not limited to surface energy, interfacial energies, Hamacker constants, Van der Waals' forces, viscosity, density, opacity, etc., are engineered as described herein to properly accommodate a repeatable process.

Formation of Discontinuous Films

As discussed previously, discontinuous films are formed using an appropriately patterned template. For example, a template with high aspect ratio recesses that define a border region can inhibit the flow of a liquid beyond the border area. The inhibition of the liquid within a border area is influenced by a number of factors. As discussed above template design plays a role in the confinement of a liquid. Additionally, the process by which the template is contacted with the liquid also influences the confinement of the liquid.

Figure 19A:
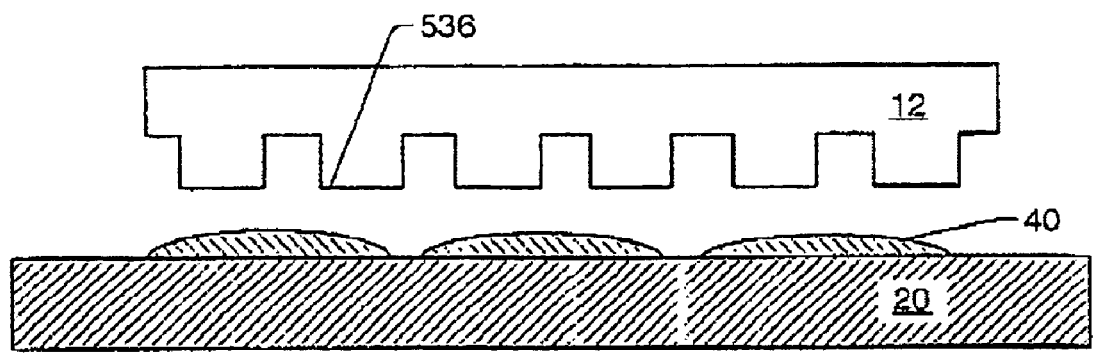
FIGS. 19 A–D depict cross-sectional views of a sequence of steps of a template contacting a liquid disposed on a substrate.
Figure 19B:
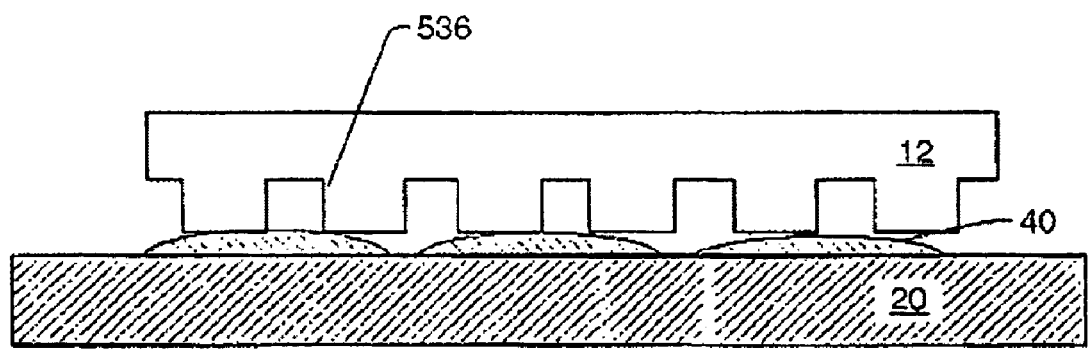
Figure 19C:
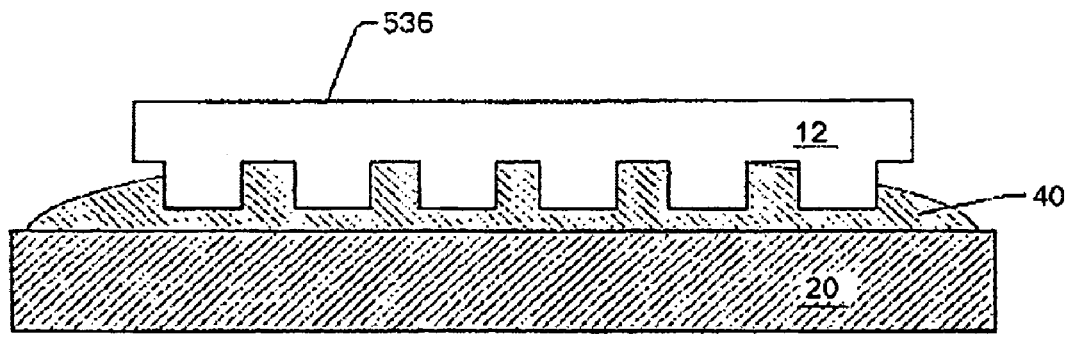
Figure 19D:
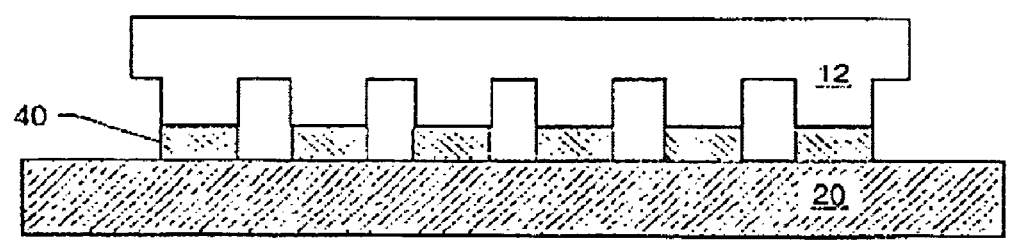

FIGS. 19A–19C depict a cross-sectional view of a process wherein discontinuous films are formed on a surface. In one embodiment, curable liquid 40 is dispensed onto substrate 20 as a pattern of lines or droplets, as depicted in FIG. 19A. Curable liquid 40, therefore, does not cover an entire area of substrate 20 to imprinted. As lower surface 536 of template 12 contacts curable liquid 40, the force of template 12 on curable liquid 40 causes curable liquid 40 to spread over the surface of substrate 20, as depicted in FIG. 19B. Generally, the more force that is applied by template 12 to curable liquid 40, the further curable liquid 40 will spread over substrate 20. Thus, if a sufficient amount of force is applied, curable liquid 40 may be forced beyond a perimeter of template 12, as depicted in FIG. 19C. By controlling the forces applied to curable liquid 40 by template 12, curable liquid 40 is confined within the predetermined borders of template 12, as depicted in FIG. 19D.

The amount of force applied to curable liquid 40 is related to the amount of liquid dispensed on substrate 20 and the distance template 12 is from substrate 20 during curing. For a negative imprint lithography process the amount of fluid dispensed onto the substrate should be less than or equal to a volume defined by: the volume of liquid required to substantially fill the recesses of the patterned template, the area of the substrate to be patterned, and the desired thickness of the cured layer. If the amount of cured liquid exceeds this volume, the liquid will be displaced from the perimeter of the template when the template is brought to the appropriate distance from the substrate. For a positive imprint lithography process that amount of liquid dispensed onto the substrate should be less than the volume defined by: the desired thickness of the cured layer (i.e., the distance between the non-recessed portions of the template and the substrate) and the surface area of the portion of the substrate to be patterned.

For an imprint lithography processes that uses a template that includes a border, the distance between the non-recessed surface of the template and the substrate is set between the minimum film thickness and the maximum film thickness, as previously described. Setting the height between these values allows the appropriate capillary forces to contain the liquid within the border-defined areas of the template. Additionally, the thickness of the layer should be approximately comparable to the height of the patterned features. If the cured layer is too thick, the features formed in the cured layer may be eroded before the features can be transferred to the underlying substrate. It is therefore desirable to control the volume as described above to allow the appropriate film thickness to be used.

The force applied by template 12 to curable liquid 40 is also influenced by the rate at which template 12 is brought into contact with curable liquid 40. Generally, the faster template 12 is brought into contact, the more force is applied to curable liquid 40. Thus, some measure of control of the spread of curable liquid 40 on the surface of substrate 20 may be achieved by controlling the rate at which template 12 is brought into contact with curable liquid 40.

All of these features are considered when positioning template 12 with respect to substrate 20 for an imprint lithography process. By controlling these variables in a predetermined manner, the flow of curable liquid 40 may be controlled to stay confined within a predetermined area.

Alignment Techniques

Overlay alignment schemes include measurement of alignment errors followed by compensation of these errors to achieve accurate alignment of a patterned template and a desired imprint location on a substrate. Correct placement of the template with respect to the substrate is important for achieving proper alignment of the patterned layer with any previously formed layers on the substrate. Placement errors, as used herein, generally refers to X-Y positioning errors between a template and substrate (that is, translation along the X- and/or Y-axis). Placement errors, in one embodiment, are determined and corrected for by using a through the template optical device, as depicted in FIG.

Figure 28:
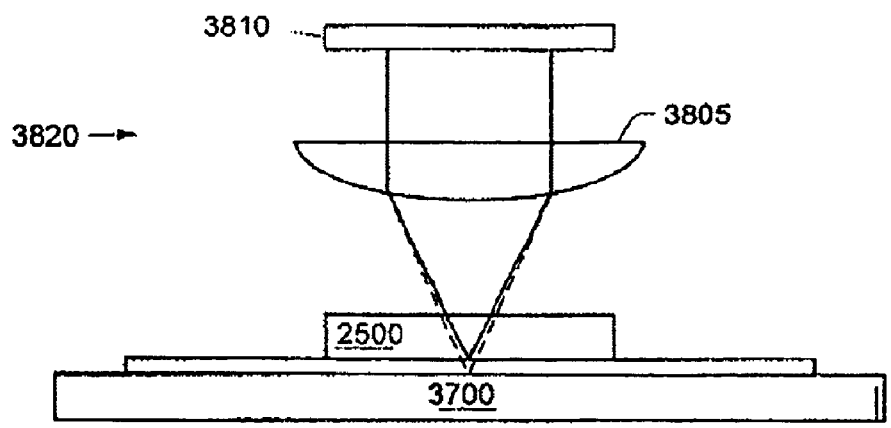
FIG. 28 depicts a schematic of an optical alignment measuring device positioned over a template and substrate.

FIG. 28 illustrates a schematic drawing of optical system 3820 of through the template optical imaging system 3800

Figure 29:
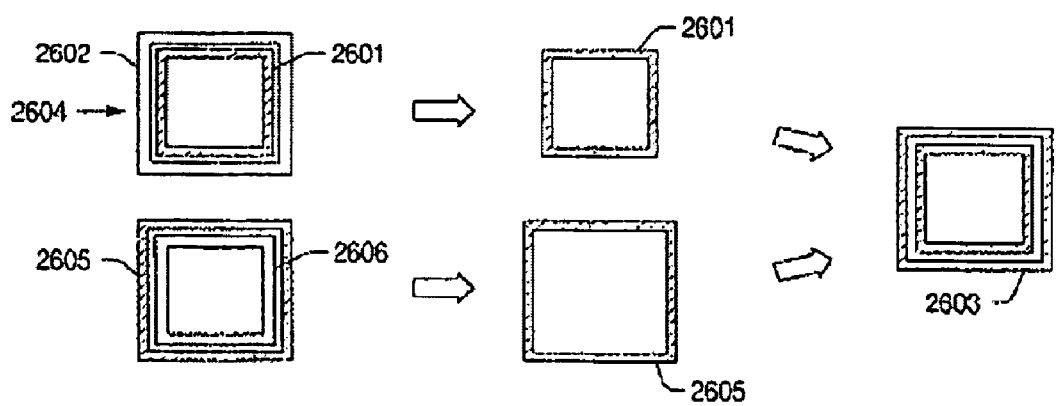
FIG. 29 depicts a scheme for determining the alignment of a template with respect to a substrate using alignment marks by sequentially viewing and refocusing.

(see also FIG. 14). Optical system 3820 is configured to focus two alignment marks from different planes onto a single focal plane. Optical system 3820 may use the change of focal length resulting from light with distinct wavelengths to determine the alignment of the template with an underlying substrate. Optical system 3820 may include optical imaging device 3810, an illumination source (not shown), and a focusing device 3805. Light with distinct wavelengths may be generated either by using individual light sources or by using a single broad band light source and inserting optical band-pass filters between the imaging plane and the alignment marks. Depending on the gap between patterned template 3700 and substrate 2500, different wavelengths are selected to adjust the focal lengths. Under each wavelength of light used, each overlay mark may produce two images on the imaging plane, as depicted in FIG. 29. A first image 2601, using a specific wavelength of light, is clearly focused image. A second image 2602, using the same wavelength of light, is an out-of-focus image. In order to eliminate each out-of-focus image, several methods may be used.

In a first method, under illumination with a first wavelength of light, two images may be received by optical imaging device 3810. Images are depicted in FIG. 29 and generally referenced by numeral 2604. While images are depicted as squares, it should be understood that any other shape might be used, including crosses. Image 2602 corresponds to an overlay alignment mark on the template. When image 2602 is focused, image 2601 is out-of-focus. In an embodiment, an image processing technique may be used to erase geometric data corresponding to pixels associated with image 2602. Thus, the out-of-focus image of the substrate mark may be eliminated, leaving only image 2601. Using the same procedure and a second wavelength of light, images 2605 and 2606 may be formed on optical imaging device 3810. The out-of-focus 2606 is then eliminated, leaving only image 2605. The two remaining focused images 2601 and 2605 are then combined onto a single imaging plane 2603 for making overlay error measurements.

Figure 30:
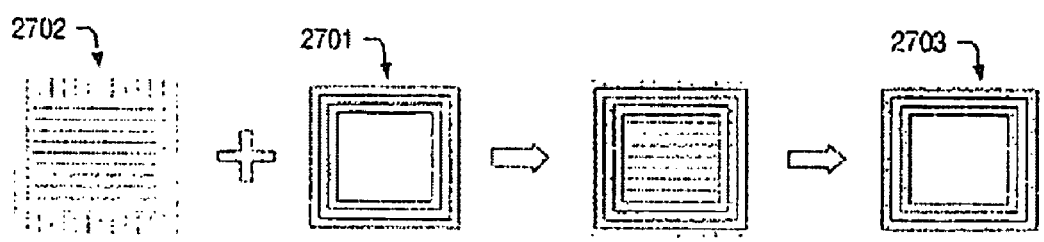
FIG. 30 depicts a scheme for determining the alignment of a template with respect to a substrate using alignment marks and polarized filters.

A second method may utilize two coplanar polarizing arrays, as depicted in FIG. 30, and polarized illumination sources. FIG. 30 illustrates overlay marks 2701 and orthogonally polarizing arrays 2702. Polarizing arrays 2702 are formed on the template surface or placed above the surface. Under two polarized illumination sources, only focused images 2703 (each corresponding to a distinct wavelength and polarization) may appear on the imaging plane. Thus, out-of-focus images are filtered out by polarizing arrays 2702. An advantage of this method may be that it may not require an image processing technique to eliminate out-of-focus images.

Moiré pattern based overlay measurement has been used for optical lithography processes. For imprint lithography processes, where two layers of Moiré patterns are not on the same plane but still overlapped in the imaging array, acquiring two individual focused images may be difficult to achieve. However, carefully controlling the gap between the template and substrate within the depth of focus of the optical measurement tool and without direct contact between the template and substrate may allow two layers of Moiré patterns to be simultaneously acquired with minimal focusing problems. It is believed that other standard overlay schemes based on the Moiré patterns may be directly implemented to imprint lithography process.

Another concern with overlay alignment for imprint lithography processes that use UV curable liquid materials may be the visibility of the alignment marks. For the overlay placement error measurement, two overlay marks, one on the template and the other on substrate are used. However, since it is desirable for the template to be transparent to a curing agent, the template overlay marks, in some embodiments, are not opaque lines. Rather, the template overlay marks are topographical features of the template surface. In some embodiment, the marks are made of the same material as the template. In addition, UV curable liquids may have a refractive index that is similar to the refractive index of the template materials (e.g., quartz). Therefore, when the UV curable liquid fills the gap between the template and the substrate, template overlay marks may become very difficult to recognize. If the template overlay marks are made with an opaque material (e.g., chromium), the UV curable liquid below the overlay marks may not be properly exposed to the UV light.

Figure 31:
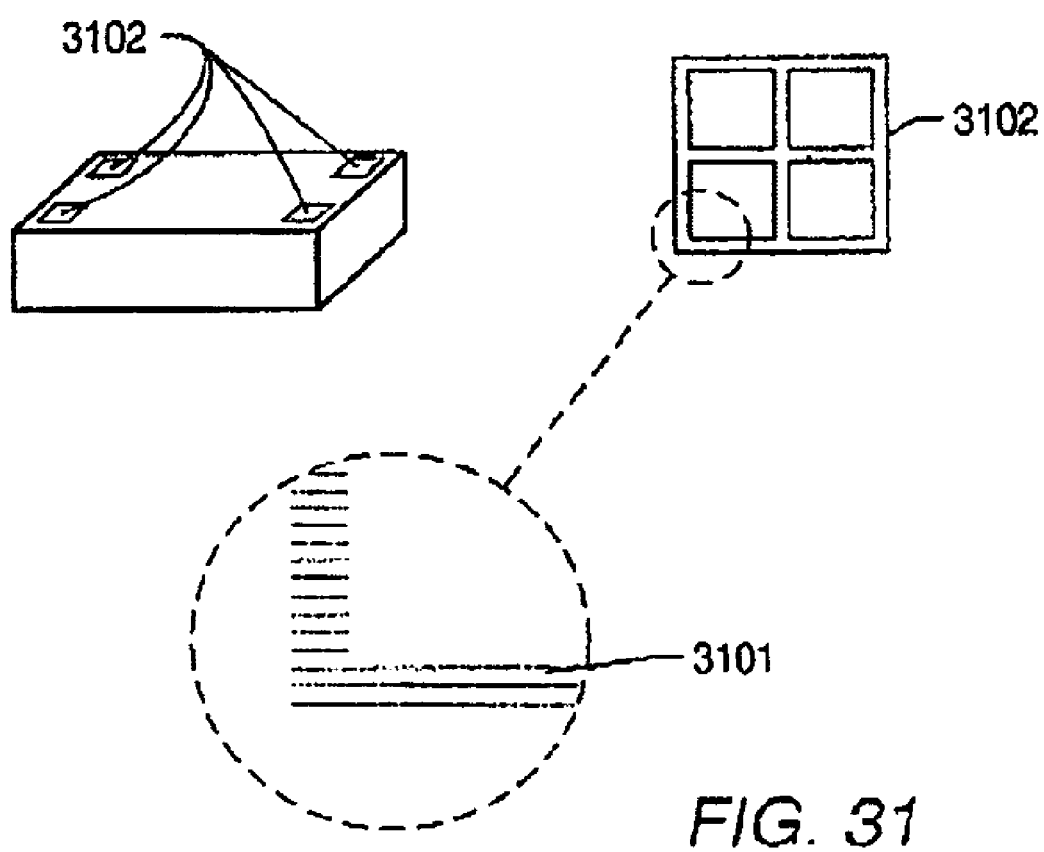
FIG. 31 depicts a top view of an alignment mark that is formed from polarizing lines.

In an embodiment, overlay marks are used on the template that are seen by optical imaging system 3800 but are opaque to the curing light (e.g., UV light). An embodiment of this approach is illustrated in FIG. 31. In FIG. 31, instead of completely opaque lines, overlay marks 3102 on the template may be formed of fine polarizing lines 3101. For example, suitable fine polarizing lines have a width about ½ to ¼ of the wavelength of activating light used as the curing agent. The line width of polarizing lines 3101 should be small enough so that activating light passing between two lines is diffracted sufficiently to cause curing of all the liquid below the lines. In such an embodiment, the activating light may be polarized according to the polarization of overlay marks 3102. Polarizing the activating light provides a relatively uniform exposure to all the template regions, including regions having overlay marks 3102. Light used to locate overlay marks 3102 on the template may be broadband light or a specific wavelength that may not cure the liquid material. This light need not be polarized. Polarizing lines 3101 are substantially opaque to the measuring light, thus making overlay marks 3102 visible using established overlay error measuring tools. Fine polarized overlay marks are fabricated on the template using existing techniques, such as electron beam lithography.

In another embodiment, overlay marks 3102 are formed of a different material than the template. For example, a material selected to form the template overly marks 3102 may be substantially opaque to visible light, but transparent to activating light used as the curing agent (e.g., UV light). For example $SiO_x$, where x is less than 2, maybe used as such a material. In particular, structures formed of $SiO_x$, where x is less than 1.5, are substantially opaque to visible light, but transparent to UV curing light.

Liquid Dispensing Patterns

In all embodiments of an imprint lithography process, a liquid is dispensed onto a substrate. While the following description is directed to dispensing liquids on substrate, it should be understood that the same liquid dispensing techniques are also used when dispensing liquids onto a template. Liquid dispensing is a carefully controlled process. In general, liquid dispensing is controlled such that a predetermined amount of liquid is dispensed in the proper location on the substrate. Additionally, the volume of liquid is also controlled. The combination of the proper volume of liquid and the proper location of the liquid is controlled by using the liquid dispensing systems described herein. Step and repeat processes, in particular, use a combination of liquid volume control and liquid placement to confine patterning to a specified field.

Figure 32A:
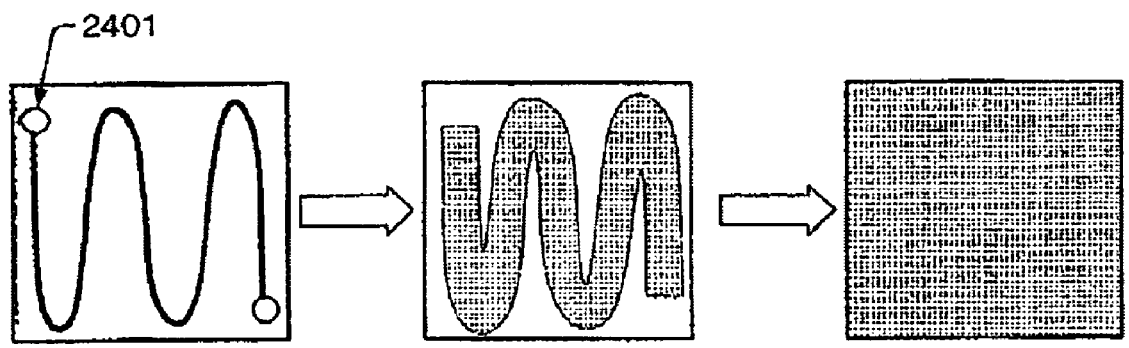
FIGS. 32A–32C depict top views of patterns of curable liquid applied to a substrate.
Figure 32B:
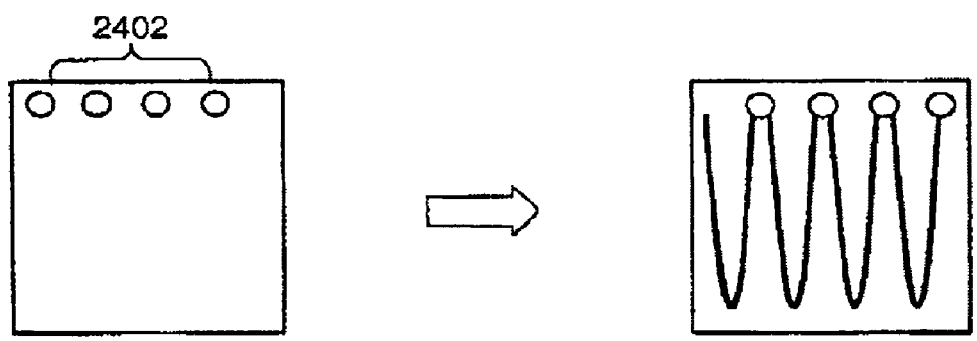
Figure 32C:
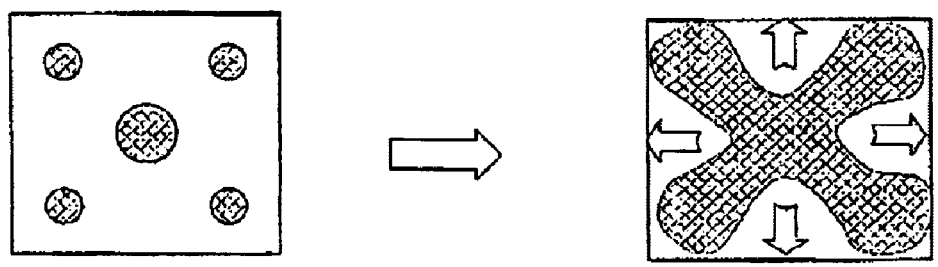

A variety of liquid dispensing patterns are used. Patterns may be in the form of continuous lines or patterns of droplets of liquid. In some embodiments, relative motion between a displacement based liquid dispenser tip and an imprinting member is used to form a pattern with substantially continuous lines on a portion of the imprinting member. Balancing rates of dispensing and relative motion is used to control the size of the cross-section of the line and the shape of the line. During the dispensing process, the dispenser tips are fixed near (e.g., on the order of tens of microns) to the substrate. Two examples of continuous patterns are depicted in FIGS. 32A–32B. The pattern depicted in FIGS. 32A–32B is a sinusoidal pattern; however, other patterns are possible. As depicted in FIGS. 32A–32B, a continuous line pattern may be drawn using either a single dispenser tip 2401 or multiple dispenser tips 2402. Alternatively a pattern of droplets may be used, as depicted in FIG. 32C. In one embodiment, a pattern of droplets that has a central droplet that has a greater volume than surrounding droplets is used. When the template contacts the droplets, the liquid spreads to fill the patterning area of the template, as depicted in FIG. 32C.

Dispensing rate, $V_d$, and relative lateral velocity of an imprinting member, $v_s$, may be related as follows:

$$v_d = V_d/t_d \text{(dispensing volume/dispensing period)}, \quad (1)$$

$$v_s = L/t_d \text{(line length/dispensing period)}, \quad (2)$$

$$v_d = a\, L \text{(where, 'a' is the cross section area of line pattern)}, \quad (3)$$

Therefore, $$v_d = a\, V_s. \quad (4)$$

The width of the initial line pattern may normally depend on the tip size of a dispenser. The dispenser tip may be fixed. In an embodiment, a liquid dispensing controller is used to control the volume of liquid dispensed ($V_d$) and the time taken to dispense the liquid ($t_d$). If $V_d$ and $t_d$ are fixed, increasing the length of the line leads to lower height of the cross-section of the line patterned. Increasing pattern length may be achieved by increasing the spatial frequency of the periodic patterns. Lower height of the pattern may be lead to a decrease in the amount of liquid to be displaced during imprint processes. By using multiple tips connected to the same dispensing line, line patterns with long lengths may be formed faster as compared to the case of a single dispenser tip. Alternatively, a plurality of closely spaced drops is used to form a line with an accurate volume.

Separation of Template

After curing of the liquid is completed, the template is separated from the cured liquid. Since the template and substrate are almost perfectly parallel, the assembly of the template, imprinted layer, and substrate leads to a substantially uniform contact between the template and the cured liquid. Such a system may require a large separation force to separate the template from the cured liquid. In the case of a flexible template or substrate, the separation, in one embodiment, is performed using a "peeling process". However, use of a flexible template or substrate may be undesirable for high-resolution overlay alignment. In the case of a quartz template and a silicon substrate, a peeling process may be difficult to implement. In on embodiment, a "peel and pull" process is performed to separate the template from an imprinted layer. An embodiment of a peel and pull process is illustrated in FIGS. 33A–33C.

Figure 33A:
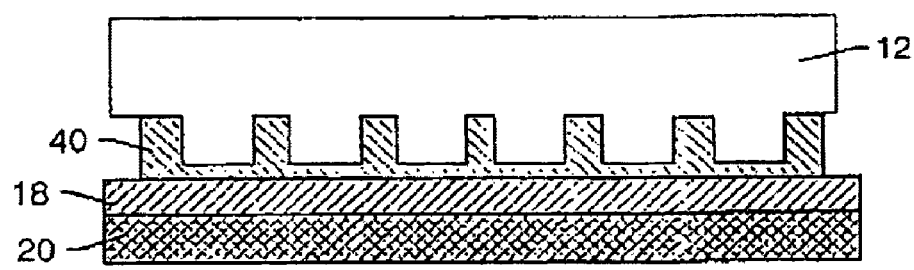
FIGS. 33A–33C depict a scheme for removing a template from a substrate after curing.
Figure 33B:
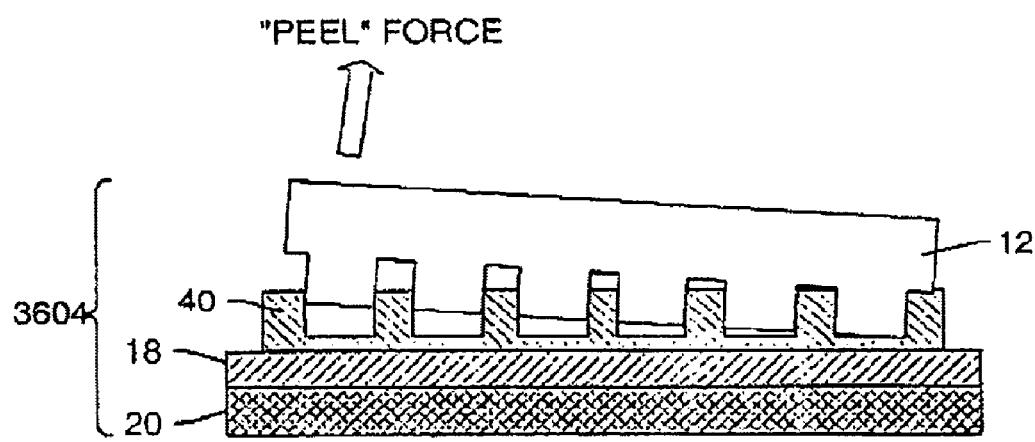
Figure 33C:
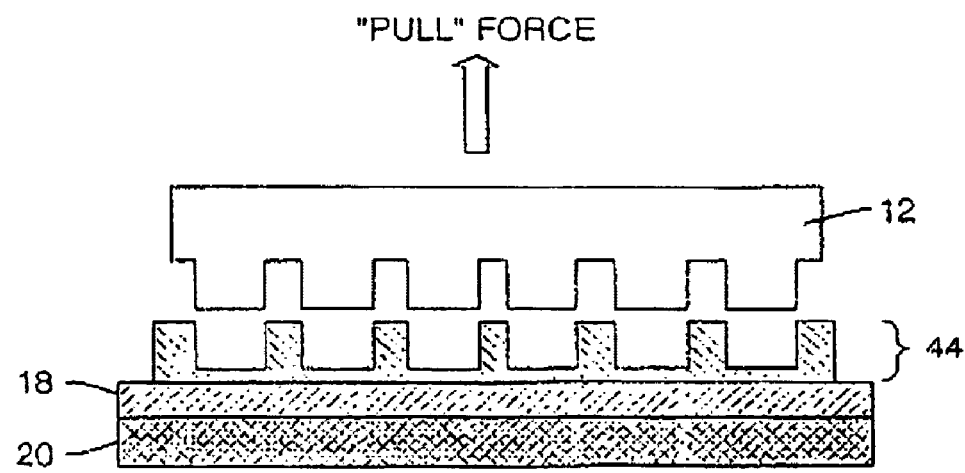

FIG. 33A depicts template 12 embedded in curable liquid 40. After curing of curable liquid 40, either template 12 or substrate 20 may be tilted to intentionally induce an angle 3604 between template 12 and substrate 20, as depicted in FIG. 33B. A pre-calibration stage either, coupled to template 12 or substrate 20, may be used to induce a tilt between the template 12 and the curable liquid 40. The relative lateral motion between template 12 and substrate 20 may be insignificant during the tilting motion if the tilting axis is located close to template 12-substrate 20 interface. Once angle 3604 between template 12 and substrate 20 is large enough, template 12 may be separated from substrate 20 using only Z-axis motion (i.e., vertical motion). This peel and pull method may result in desired portions 44 being left intact on a transfer layer 18 and substrate 20 without undesirable shearing.

Electrostatic Curing Process

In addition to the above-described embodiments, embodiments described herein include forming patterned structures by using electric fields. Cured layers formed using electric fields to induce a pattern in the cured layer may be used for single imprinting or step and repeat processes.

Figure 34:
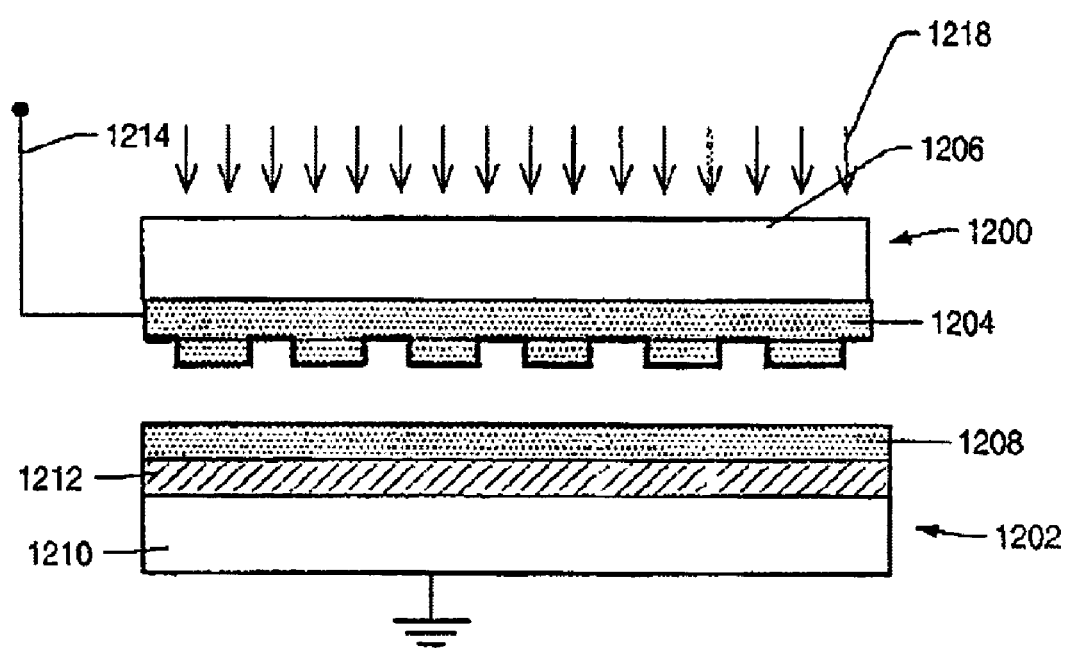
FIG. 34 depicts an embodiment of a template positioned over a substrate for electric field based lithography.
Figure 35A:
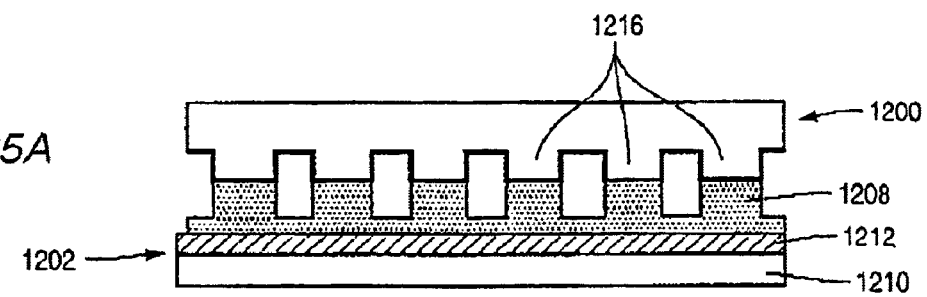
FIGS. 35A–35D depict a first embodiment of a process for forming nanoscale structures using contact with a template.
Figure 35B:
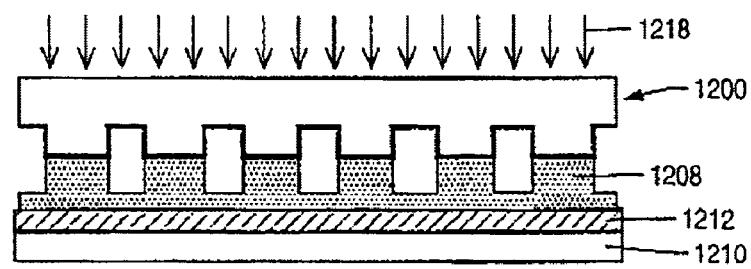
Figure 35C:
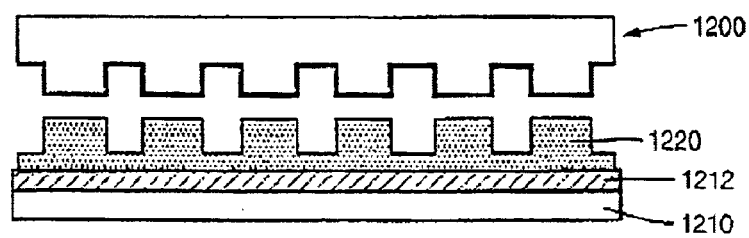
Figure 35D:

FIG. 34 depicts an embodiment of template 1200 and substrate 1202. Template 1200, in one embodiment, is formed from a material that is transparent to activating light to allow curing of the polymerizable composition by exposure to activating light. Forming template 1200 from a transparent material also allows the use of established optical techniques to measure the gap between template 1200 and substrate 1202 and to measure overlay marks to perform overlay alignment and magnification correction during formation of the structures. Template 1200 is also thermally and mechanically stable to provide nano-resolution patterning capability. Template 1200 includes an electrically conducting material and/or layer 1204 to allow electric fields to be generated at template-substrate interface.

In one embodiment, a blank of fused silica (e.g., quartz) is used as the material for base 1206 of template 1200. Indium tin oxide (ITO) is deposited onto base 1206. ITO is transparent to visible and UV light and is a conducting material. ITO may be patterned using high-resolution electron beam lithography. A low-surface energy coating, as previously described, may be coated onto template 1200 to improve the release characteristics between template 1200 and the polymerized composition. Substrate 1202 may include standard wafer materials, such as Si, GaAs, SiGeC and InP. A UV curable liquid and/or a thermally curable liquid may be used as polymerizable composition 1208. In an embodiment, polymerizable composition 1208 may be spin coated onto the wafer 1210. In another embodiment, a predetermined volume of polymerizable composition 1208 may be dispensed onto substrate 1202 in a predetermined pattern, as described herein. In some embodiments, transfer layer 1212 may be placed between wafer 1210 and polymerizable composition 1208. Transfer layer 1212 material properties and thickness may be chosen to allow for the creation of high-aspect ratio structures from low-aspect ratio structures created in the cured liquid material. Connecting ITO to a voltage source 1214 may generate an electric field between template 1200 and substrate 1202.

In FIGS. 35A–35D and FIGS. 36A–36C, two embodiments, a desired uniform gap may be maintained between template 1200 and substrate 1202. An electric field of the desired magnitude may be applied resulting in the attraction of polymerizable composition 1208 towards the raised portions 1216 of template 1200. In FIGS. 35A–35D, the gap and field magnitudes are such that polymerizable composition 1208 makes direct contact and adheres to template 1200. A curing agent (e.g., activating light 1218 and/or heat) may be used to cure the liquid. Once desired structures have been formed, template 1200 may be separated from substrate 1202 by methods described herein.

Figure 36A:
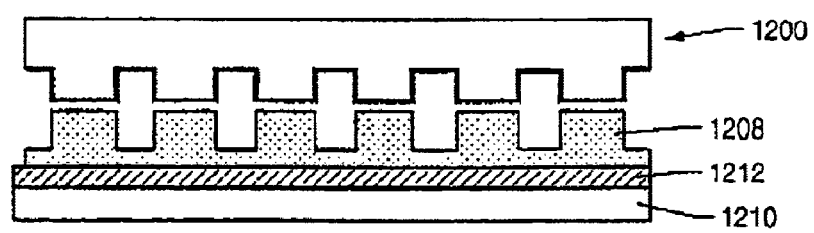
FIGS. 36A–36C depict a first embodiment of a process for forming nanoscale structures without contacting a template.
Figure 36B:
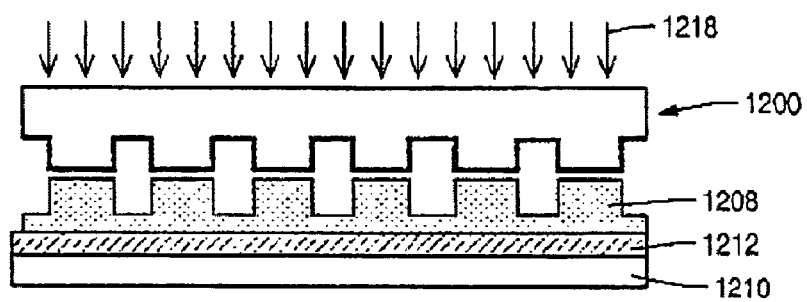
Figure 36C:
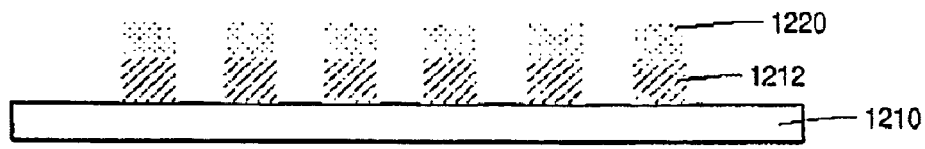

In FIGS. 36A–36C, the gap and the field magnitudes may be chosen such that polymerizable composition 1208 achieves a topography that is essentially the same as that of template 1200. This topography may be achieved without making direct contact with template 1200. A curing agent (e.g., activating light 1218) may be used to cure the liquid. In the embodiment of FIGS. 35A–35D and FIGS. 36A–36C, a subsequent etch process may be used to remove the cured material 1220. A further etch may also be used if transfer layer 1212 is present between cured material 1220 and wafer 1210, as depicted in FIGS. 35A–35D and FIGS. 36A–36C.

Figure 37A:
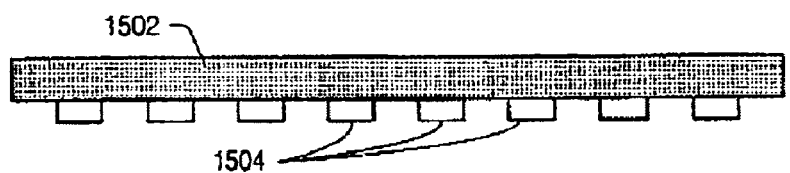
FIGS. 37A–37B depict a template that includes a continuous patterned conductive layer disposed on a nonconductive base.
Figure 37B:
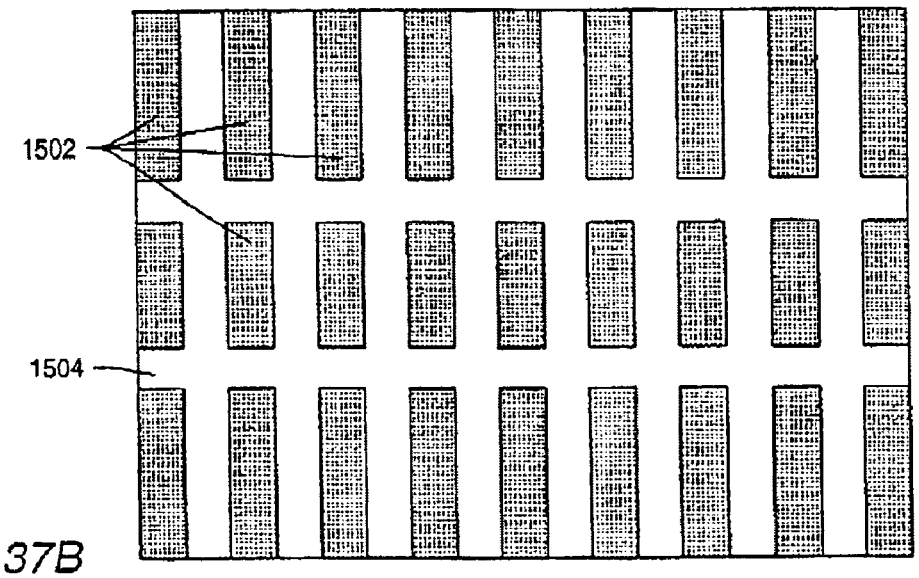

In another embodiment, FIG. 37A depicts an electrically conductive template that includes a continuous layer of electrically conductive portions 1504 coupled to non-conductive bases 1502. As shown in FIG. 37B the non-conductive bases 1502 of the template are isolated from each other by the conductive portions 1504. The template may be used in a "positive" imprint process, as described above.

In an embodiment, an "adjustable" template may be used to form a pattern on a substrate. The term "adjustable" template, in the context of this embodiment, generally refers to a template that includes electrically conductive portions that are independently controlled. Controlling a conductive portion of the template refers to turning on, turning off, and/or adjusting an electric field of the conductive portion. This concept is illustrated in FIG. 42. Template 1700 includes electrically conductive portions 1702 and non-conductive material 1704. Non-conductive material 1704 insulates conductive portions 1702 from each other. Template 1700 is substantially transparent to some or all types of activating light. In an embodiment, template 1700 is formed from materials that are thermally stable. Conductive portions 1702 may be formed from, for example, ITO. Non-conductive material 1704 may be formed from, for example, silicon dioxide. Conductive portions 1702 form a pattern complementary to a pattern to be produced on a masking layer. The pattern of conductive portions 1702 is formed in non-conducting material 1704 using methods known to those skilled in the art. Conductive portions 1702 are to be electrically connected 1706 to power source 1708, either independently or together. In an embodiment where conductive portions 1702 are independently connected to power source 1708, there may be a control device 1710 to independently adjust the electric field generated by one or more conductive portions 1702. In an embodiment, electrical connectors 1712 run through non-conductive material 1704 from another side to connect to conductive portions 1702. In an alternate embodiment, conductive portions 1702 extend through non-conductive material 1704 such that electrical connectors 1712 are not required.

Such embodiments may create lithographic patterned structures quickly (in a time of less than about 1 second). The structures generally have sizes on the order of tens of nanometers. In one embodiment, curing a polymerizable composition in the presence of electric fields creates a patterned layer on a substrate. The pattern is created by placing a template with specific nanometer-scale topography at a controlled distance (e.g., within nanometers) from the surface of a thin layer of the curable liquid on a substrate. If all or a portion of the desired structures are regularly repeating patterns, such as an array of dots, the pattern on the template may be considerably larger than the size of the desired repeating structures.

The replication of the pattern on the template may be achieved by applying an electric field between the template and the substrate. Because the liquid and air (or vacuum) have different dielectric constants and the electric field varies locally due to the presence of the topography of the template, an electrostatic force may be generated that attracts regions of the liquid toward the template. Surface tension or capillary pressures tend to stabilize the film. At high electric field strengths, the polymerizable composition may be made to attach to the template and de-wet from the substrate at certain points. However, the attachment of the liquid film will occur provided the ratio of electrostatic forces is comparable to the capillary forces, which are measured by the dimensionless number Λ. The magnitude of the electrostatic force is approximately $\in E^2 d^2$, where $\in$ is the permittivity of vacuum, E is the magnitude of the electric field, and d is the feature size. The magnitude of the capillary forces is approximately $\gamma d$, where $\gamma$ is the liquid-gas surface tension. The ratio of these two forces is $\Lambda = \in E^2 d/\gamma$. In order to deform the interface and cause it to attach to the upper surface, the electric field must be such that L is approximately unity. The precise value depends on the details of the topography of the plates and the ratio of liquid-gas permittivities and heights, but this number will be O(1). Thus, the electric field is approximately given by $E \sim (\gamma/\in d)^{1/2}$. This polymerizable composition may be hardened in place by polymerization of the composition. The template may be treated with a low energy self-assembled monolayer film (e.g., a fluorinated surfactant) to aid in detachment of the template from the polymerized composition.

An example of the above approximations. For d=100 nm, and $\gamma$=30 mJ/m, $\in$=8.85×10–12 $C^2$/J-m, E=1.8×$10^8$ V/m, which corresponds to a potential difference between the plates of 18 V if the plate spacing is 100 nm or 180 V if the plate spacing is 1000 nm. Note that the feature size d~$\gamma/\in E^2$, which means that the size of the feature decreases with the square of the electric field. Thus, 50 nm features would require voltages on the order of 25 or 250 V for 100 and 1000 nm plate spacings, respectively.

It may be possible to control the electric field, the design of the topography of the template, and the proximity of the template to the liquid surface so as to create a pattern in the polymerizable composition that does not come into contact with the surface of the template. This technique may eliminate the need for mechanical separation of the template from the polymerized composition. This technique may also eliminate a potential source of defects in the pattern. In the absence of contact, however, the liquid may not form sharp, high-resolution structures that are well defined, as in the case of contact. This may be addressed by first creating structures in the polymerizable composition that are partially defined at a given electric field. Subsequently, the gap may be increased between the template and substrate while simultaneously increasing the magnitude of the electric field to "draw-out" the liquid to form clearly defined structures without requiring contact.

The polymerizable composition may be deposited on top of a transfer layer as previously described. Such a bi-layer process allows low aspect ratio, high-resolution structures formed using electrical fields to be followed by an etch process to yield high-aspect ratio, high-resolution structures. Such a bi-layer process may also be used to perform a "metal lift-off process" to deposit a metal on the substrate such that the metal is left behind after lift-off in the trench areas of the originally created structures.

Using a low viscosity polymerizable composition, pattern formation using electric fields may be fast (e.g., less than about 1 sec.), and the structure may be rapidly cured. Avoiding temperature variations in the substrate and the polymerizable composition may also avoid undesirable pattern distortion that makes nano-resolution layer-to-layer alignment impractical. In addition, as mentioned above, it is possible to quickly form a pattern without contact with the template, thus eliminating defects associated with imprint methods that require direct contact.

In this patent, certain U.S. patents and U.S. patent applications have been incorporated by reference. The text of such U.S. patents and U.S. patent applications is, however, only incorporated by reference to the extent that no conflict exists between such text and the other statements and drawings set forth herein. In the event of such conflict, U.S. patents and U.S. patent applications are specifically not incorporated by reference in this patent.

While this invention has been described with references to various illustrative embodiments, the description is not intended to be construed in a limiting sense. Various modifications and combinations of the illustrative embodiments, as well as other embodiments of the invention, will be apparent to persons skilled in the art upon reference to the description. It is, therefore, intended that the appended claims encompass any such modifications or embodiments.

What is claimed is:

1. A method of forming a pattern on a substrate, the method comprising:
    applying a first predetermined volume of an activating light curable liquid to a first portion of the substrate in a first predetermined pattern;
    positioning a patterned template and the substrate in a first spaced relation to each other so that a first gap is created between the patterned template and the substrate, wherein the first gap is established such that the activating light curable liquid contacts substantially an entirety of a first patterning area of the patterned template but does not substantially extend past a perimeter of the first patterning area;
    applying an activating light to the activating light curable liquid, wherein the application of the activating light substantially cures the activating light curable liquid, forming a first patterned area of a cured liquid;
    separating the patterned template from the cured liquid;
    applying a second predetermined volume of the activating light curable liquid to a second portion of the substrate in a second predetermined pattern;
    positioning the patterned template and the substrate in a second spaced relation to each other so that a second gap is created between the patterned template and the substrate, wherein the second gap is established such that the activating light curable liquid contacts substantially an entirety of a second patterning area of the patterned template but does not substantially extend past the perimeter of the second patterning area; and
    applying the activating light to the activating light curable liquid on the second portion of the substrate, wherein the application of the activating light substantially cures the activating light curable liquid on the second portion of the substrate, forming a second patterned area.

2. The method of claim 1, wherein the patterned template comprises a first surface and a plurality of recesses formed in one or more patterning areas of the patterned template extending from the first surface toward a second surface of the patterned template, wherein the plurality of recesses define a plurality of features in the first surface of the patterned template.

3. The method of claim 2, wherein the patterned template comprises a border formed about a perimeter of one or more of the patterning areas, wherein a depth of the border is greater than a depth of the plurality of recesses.

4. The method of claim 1, wherein the patterned template comprises two or more patterning areas, each of the two or more patterning areas comprising a plurality of recesses, and wherein the two or more patterning areas are separated from each other by a channel, and wherein a depth of the channel is greater than a depth of the plurality of recesses in the two or more patterning areas.

5. The method of claim 1, wherein the patterned template comprises at least one template alignment mark, and wherein the substrate comprises at least one substrate alignment mark; and wherein the method further comprises determining an alignment of the at least one template alignment mark with respect to the at least one substrate alignment mark, and altering a position of the patterned template with respect to the substrate such that the at least one substrate alignment mark and the at least one template alignment mark are substantially aligned before applying the activating light to the activating light curable liquid.

6. The method of claim 5, wherein the substrate is disposed on a motion stage, and wherein determining the alignment between the at least one template alignment mark and the at least one substrate alignment mark comprises determining a motion of the motion stage required to align the at least one template alignment mark with respect to the at least one substrate alignment mark.

7. The method of claim 1, further comprising adjusting a position of the patterned template such that a patterning surface of the patterned template is substantially parallel with a reference plane; and adjusting a position of the substrate so that a surface of the substrate to be patterned is substantially parallel with the reference plane.

8. The method of claim 1, wherein separating the patterned template from the cured liquid comprises moving the patterned template and the substrate into a substantially non-parallel orientation with respect to one another; and moving the patterned template and the substrate apart from one another.

9. The method of claim 1, further comprising applying a separating light before separating the patterned template from the cured liquid, wherein the separating light alters a chemical composition of a portion of the cured liquid such that an adhesion of the patterned template to the cured liquid is reduced.

10. The method of claim 1, further comprising applying a separating light before separating the patterned template from the cured liquid, wherein the separating light alters a chemical composition of a portion of the cured liquid such that a gas is released by the cured liquid near an interface of the patterned template and the cured liquid.

11. The method of claim 1, further comprising providing an enclosure around at least the patterned template and the substrate and inhibiting temperature variations greater than about 1.0° C. within at least a portion of the enclosure.

12. The method of claim 1, wherein the applied activating light curable liquid does not cover an entirety of the first portion of the substrate prior to positioning the patterned template and the substrate in a spaced relationship.

13. The method of claim 2, wherein each of the first and the second predetermined volumes is less than or equal to a volume defined by the non-recessed portions of the patterned template, a portion of the substrate to be patterned, and a maximum fluid film thickness at which surface forces of a liquid-template interface and a liquid-substrate interface are sufficient to inhibit spreading of the activating light curable liquid beyond a perimeter of the patterned template.

14. The method of claim 2, wherein each of the first and second predetermined volumes is less than or equal to a volume defined by a volume of the activating light curable liquid required to substantially fill the plurality of recesses of the patterned template, a portion of the substrate to be patterned, and a maximum fluid film thickness at which surface forces of a liquid-template interface and a liquid-substrate interface are sufficient to inhibit spreading of the activating light curable liquid beyond a perimeter of the patterned template.

15. The method of claim 1, further comprising applying a transfer layer to the substrate before applying the first predetermined volume of the activating light curable liquid to the first portion of the substrate, wherein the transfer layer etches at a different rate than an etch rate of the cured liquid under the same etching conditions.

16. The method of claim 1, wherein positioning the patterned template and the substrate in a spaced relation to each other comprises coupling the patterned template to an imprint head and coupling the substrate to a motion stage, wherein the imprint head is located above the motion stage.

17. The method of claim 1, wherein positioning the patterned template and the substrate in a spaced relation to each other comprises pushing the patterned template into the activating light curable liquid and controlling a position of the substrate so that a substantially parallel orientation of the patterned template and the substrate is maintained as the patterned template pushes into the activating light curable liquid.

18. The method of claim 1, wherein the activating light curable liquid has a viscosity of less than about 30 centipoise measured at 25° C.

19. The method of claim 1, wherein the activating light curable liquid has a viscosity of less than about 5 centipoise measured at 25° C.

20. The method of claim 2, wherein at least a portion of the first surface of the patterned template comprises a surface treatment layer.

21. The method of claim 2, wherein the patterned template further comprises a surface treatment layer on at least a portion of the first surface, and wherein the surface treatment layer comprises a reaction product of an alkylsilane, a fluoroalkylsilane, or a fluoroalkyltrichlorosilane with water.

22. The method of claim 2, wherein the patterned template further comprises a surface treatment layer on at least a portion of the first surface, and wherein the surface treatment layer comprises a reaction product of tridecafluoro-1,1,2,2-tetrahydrooctyl trichlorosilane with water.

23. The method of claim 2, wherein the template further comprises a surface treatment layer on at least a portion of the first surface, and wherein the surface treatment layer reduces a surface free energy of the first surface measured at 25° C. to less than about 40 dynes/cm.

24. The method of claim 2, wherein the patterned template comprises a first surface treatment layer on at least a portion of the first surface, and a second surface treatment layer on the plurality of recesses of the template, wherein the first and second surface treatment layers have different wetting characteristics with respect to the activating light curable liquid.

25. The method of claim 2, wherein the template further comprises a surface treatment layer on at least a portion of the first surface, and wherein the surface treatment layer comprises a monolayer.

26. The method of claim 1, wherein the patterned template is substantially transparent to the activating light.

27. The method of claim 1, wherein at least a portion of the patterned template comprises silicon, silicon dioxide, silicon germanium carbon, gallium nitride, silicon germanium, sapphire, gallium arsenide, epitaxial silicon, poly-silicon, gate oxide, quartz, indium tin oxide, an oxide of silicon or a combination thereof.

28. The method of claim 1, wherein applying the activating light curable liquid to the first and the second portions of the substrate comprises dispensing the activating light curable liquid with a fluid dispenser.

29. The method of claim 1, wherein applying the activating light curable liquid to the first and the second portions of the substrate comprises dispensing the activating light curable liquid with a fluid dispenser such that the first predetermined pattern of the activating light curable liquid is produced on the first portion of the substrate and the second predetermined pattern of the activating light curable liquid is produced on the second portion of the substrate.

30. The method of claim 1, wherein the activating light curable liquid comprises an ultraviolet light curable composition.

31. The method of claim 1, wherein positioning the patterned template and the substrate in the first and the second spaced relations comprises positioning the patterned template at a distance of less than about 500 nm from the substrate.

32. The method of claim 1, wherein the cured liquid comprises at least some features less than about 250 nm in size after the patterned template is separated from the cured liquid.

33. The method of claim 1, further comprising determining a distance between the patterned template and the substrate by sensing a resistive force between the patterned template and the activating light curable liquid.

34. The method of claim 1, wherein the substrate comprises silicon, silicon dioxide, gallium arsenide, silicon germanium, silicon germanium carbide or indium phosphide.

35. A method of planarizing a substrate, the method comprising:
  obtaining a template, the template comprising at least one planarizing area, wherein the at least one planarizing area comprises a substantially planar surface;
  applying a first predetermined volume of an activating light curable liquid to a first portion of the substrate in a first predetermined pattern;
  positioning the template and the substrate in a first spaced relation to each other so that a first gap is created between the template and the substrate, wherein the first gap is established such that the activating light curable liquid contacts substantially an entirety of a first planarizing area of the template but does not substantially extend past a perimeter of the first planarizing area;
  applying an activating light to the activating light curable liquid, wherein the application of the activating light substantially cures the activating light curable liquid, forming a first planar area of a cured liquid on the substrate;
  separating the template from the cured liquid;
  applying a second predetermined volume of the activating light curable liquid to a second portion of the substrate in a second predetermined pattern;
  positioning the template and the substrate in a second spaced relation to each other so that a second gap is created between the template and the substrate, wherein the second gap is established such that the activating light curable liquid contacts substantially an entirety of a second planarizing area of the template but does not substantially extend past a perimeter of the second planarizing area; and applying the activating light to the activating light curable liquid on the second portion of the substrate, wherein the application of the activating light substantially cures the activating light curable liquid on the second portion of the substrate forming a second planar area on the substrate.

36. The method of claim 35, further comprising applying a separating light before separating the template from the cured liquid, wherein the separating light alters a chemical composition of a portion of the cured liquid such that an adhesion of the template to the cured liquid is reduced.

37. The method of claim 35, further comprising applying a separating light before separating the template from the cured liquid, wherein the separating light alters a chemical composition of a portion of the cured liquid such that a gas is released by the cured liquid near an interface of the template and the cured liquid.

38. The method of claim 35, further comprising providing an enclosure around at least the template and the substrate and inhibiting temperature variations greater than about 1.0° C. within at least a portion of the enclosure.

39. The method of claim 35, wherein the activating light curable liquid has a viscosity of less than about 30 centipoise measured at 25° C.

40. The method of claim 35, wherein at least a portion of a surface of the patterned template comprises a surface treatment layer.

41. The method of claim 35, further comprising determining a distance between the template and the substrate by sensing a resistive force between the template and the activating light curable liquid.

42. A method of forming a pattern on a substrate, the method comprising:
    obtaining a template, the template comprising at least one patterning area and at least one border surrounding the at least one patterning area, wherein the at least one patterning area comprises a pattern desired to be transferred to the substrate;
    applying a predetermined volume of an activating light curable liquid to the template in a predetermined pattern, wherein the predetermined pattern does not cover an entirety of the at least one patterning area of the template;
    positioning the template and the substrate in a spaced relation to each other so that a first area of the substrate to be patterned is over the template, and so that a gap is created between the template and the substrate, wherein the gap is established such that the activating light curable liquid contacts substantially an entirety of the at least one patterning area of the template but does not substantially extend into the at least one border;
    applying an activating light to the activating light curable liquid, wherein the application of activating light substantially cures the activating light curable liquid, forming a first patterned area of a cured liquid; and
    separating the template from the cured liquid.

43. The method of claim 42, further comprising:
    applying an additional predetermined volume of the activating light curable liquid to the template in an additional predetermined pattern, wherein the additional predetermined pattern does not cover an entirety of the at least one patterning area of the template;
    positioning the template and the substrate in a spaced relation to each other so that a second area of the substrate to be patterned is over the template, and so that an additional gap is created between the template and the substrate, wherein the additional gap is established such that the activating light curable liquid contacts substantially an entirety of the at least one patterning area of the template but does not substantially extend into the at least one border; and
    applying the activating light to the activating light curable liquid, wherein the application of the activating light substantially cures the activating light curable liquid, forming a second patterned area.

44. The method of claim 42, further comprising applying a separating light before separating the template from the cured liquid, wherein the separating light alters a chemical composition of a portion of the cured liquid such that an adhesion of the template to the cured liquid is reduced.

45. The method of claim 42, further comprising applying a separating light before separating the template from the cured liquid, wherein the separating light alters a chemical composition of a portion of the cured liquid such that a gas is released by the cured liquid near an interface of the template and the cured liquid.

46. The method of claim 42, further comprising providing an enclosure around at least the template and the substrate and inhibiting temperature variations greater than about 1.0° C. within at least a portion of the enclosure.

47. The method of claim 42, wherein the activating light curable liquid has a viscosity of less than about 30 centipoise measured at 25° C.

48. The method of claim 42, wherein at least a portion of a surface of the patterned template comprises a surface treatment layer.

49. The method of claim 42, further comprising determining a distance between the template and the substrate by sensing a resistive force between the template and the activating light curable liquid.

50. A method of forming a pattern on a substrate, the method comprising:
    applying a predetermined volume of an activating light curable liquid to a portion of a patterned template;
    positioning the patterned template and the substrate in a spaced relation to each other so that a gap is created between the template and the substrate, wherein the gap is established such that the activating light curable liquid contacts substantially an entirety of a patterning area of the template but does not extend past a perimeter of the patterning area;
    applying an activating light to the activating light curable liquid, wherein the application of the activating light substantially cures the activating light curable liquid, forming a first patterned area of a cured liquid; and
    separating the template from the cured liquid.

51. The method of claim 50, further comprising:
    applying an additional predetermined volume of the activating light curable liquid to the template in an additional predetermined pattern, wherein the additional predetermined pattern does not cover an entirety of a patterning area of the template;
    positioning the template and the substrate in a spaced relation to each other so that a second area of the substrate to be patterned is over the template, and so that an additional gap is created between the template and the substrate, wherein the additional gap is established such that the activating light curable liquid contacts substantially an entirety of an additional patterning area of the template but does not extend past a perimeter of the additional patterning area; and
    applying activating light to the activating light curable liquid, wherein the application of the activating light substantially cures the activating light curable liquid, forming a second patterned area.

52. The method of claim 50, further comprising applying a separating light before separating the template from the cured liquid, wherein the separating light alters a chemical composition of a portion of the cured liquid such that an adhesion of the template to the cured liquid is reduced.

53. The method of claim 50, further comprising applying a separating light before separating the template from the cured liquid, wherein the separating light alters a chemical composition of a portion of the cured liquid such that a gas is released by the cured liquid near an interface of the template and the cured liquid.

54. The method of claim 50, further comprising providing an enclosure around at least the template and the substrate and inhibiting temperature variations greater than about 1.0° C. within at least a portion of the enclosure.

55. The method of claim 50, wherein the activating light curable liquid has a viscosity of less than about 30 centipoise measured at 25° C.

56. The method of claim 50, wherein at least a portion of a surface of the patterned template comprises a surface treatment layer.

57. The method of claim 50, further comprising determining a distance between the template and the substrate by sensing a resistive force between the template and the activating light curable liquid.

58. A method of forming a pattern on a substrate, the method comprising:
applying a predetermined volume of an activating light curable liquid to a first portion of the substrate in a predetermined pattern, wherein the activating light curable liquid has a viscosity of less than about 30 centipoise measured at 25°C.;
positioning a patterned template and the substrate in a spaced relation to each other so that a gap is created between the template and the substrate, wherein the gap is established such that the activating light curable liquid contacts substantially an entirety of a patterning area of the patterned template but does not extend past a perimeter of the patterning area;
applying an activating light to the activating light curable liquid, wherein the application of the activating light substantially cures the activating light curable liquid, forming a first patterned area of a cured liquid; and
separating the patterned template from the cured liquid.

59. The method of claim 58, further comprising:
applying an additional predetermined volume of the activating light curable liquid to a second portion of the substrate in an additional predetermined pattern;
positioning the patterned template and the substrate in a spaced relation to each other so that an additional gap is created between the patterned template and the substrate, wherein the additional gap is established such that the activating light curable liquid contacts substantially an entirety of an additional patterning area of the template but does not extend past a perimeter of the additional patterning area; and
applying the activating light to the activating light curable liquid on the second portion of the substrate, wherein the application of the activating light substantially cures the activating light curable liquid on the second portion of the substrate, forming a second patterned area.

60. The method of claim 58, further comprising applying a separating light before separating the template from the cured liquid, wherein the separating light alters a chemical composition of a portion of the cured liquid such that an adhesion of the template to the cured liquid is reduced.

61. The method of claim 58, further comprising applying a separating light before separating the template from the cured liquid, wherein the separating light alters a chemical composition of a portion of the cured liquid such that a gas is released by the cured liquid near an interface of the template and the cured liquid.

62. The method of claim 58, further comprising providing an enclosure around at least the template and the substrate and inhibiting temperature variations greater than about 1.0° C. within at least a portion of the enclosure.

63. The method of claim 58, wherein at least a portion of a surface of the patterned template comprises a surface treatment layer.

64. The method of claim 58, further comprising determining a distance between the template and the substrate by sensing a resistive force between the template and the activating light curable liquid.

65. A method of forming a pattern on a substrate, the method comprising:
applying a predetermined volume of an activating light curable liquid to a first portion of the substrate in a predetermined pattern;
positioning a patterned template and the substrate in a spaced relation to each other so that a gap is created between the template and the substrate, wherein the gap is established such that the activating light curable liquid contacts substantially an entirety of a patterning area of the template but does not extend past a perimeter of the patterning area;
applying an activating light to the activating light curable liquid, wherein the application of the activating light substantially cures the activating light curable liquid, forming a first patterned area of a cured liquid; and
separating the template from the cured liquid.

66. The method of claim 65, further comprising applying a separating light before separating the template from the cured liquid, wherein the separating light alters a chemical composition of a portion of the cured liquid such that an adhesion of the template to the cured liquid is reduced.

67. The method of claim 65, further comprising applying a separating light before separating the template from the cured liquid, wherein the separating light alters a chemical composition of a portion of the cured liquid such that a gas is released by the cured liquid near an interface of the template and the cured liquid.

68. The method of claim 65, further comprising providing an enclosure around at least the template and the substrate and inhibiting temperature variations greater than about 1.0° C. within at least a portion of the enclosure.

69. The method of claim 65, wherein at least a portion of a surface of the patterned template comprises a surface treatment layer.

70. The method of claim 65, further comprising determining a distance between the template and the substrate by sensing a resistive force between the template and the applied activating light curable liquid.

71. A method of patterning differing regions of a substrate with a template, with a subset of said differing regions having a perimeter associated therewith, the method comprising:
for said subset of said differing regions, sequentially positioning a predetermined volume of a polyermizable fluid on one of said substrate and said template, defining a gap between said template and said substrate, with said predetermined volume substantially filling said gap while being maintained within said perimeter.

* * * * *